(12) United States Patent
Lee

(10) Patent No.: US 12,283,639 B2
(45) Date of Patent: Apr. 22, 2025

(54) SINGLE-PHOTON DETECTION PIXEL AND SINGLE-PHOTON DETECTION PIXEL ARRAY INCLUDING THE SAME

(71) Applicant: TRUPIXEL INC., Daejeon (KR)

(72) Inventor: Myung-Jae Lee, Seoul (KR)

(73) Assignee: TRUPIXEL INC., Daejeon (KR)

( * ) Notice: Subject to any disclaimer, the term of this patent is extended or adjusted under 35 U.S.C. 154(b) by 132 days.

(21) Appl. No.: 17/878,405

(22) Filed: Aug. 1, 2022

(65) Prior Publication Data

US 2023/0215964 A1 Jul. 6, 2023

(30) Foreign Application Priority Data

Dec. 31, 2021 (KR) .................. 10-2021-0194465

(51) Int. Cl.
*H01L 31/0352* (2006.01)
*H01L 27/144* (2006.01)
*H01L 31/107* (2006.01)

(52) U.S. Cl.
CPC .... *H01L 31/03529* (2013.01); *H01L 27/1443* (2013.01); *H01L 27/1446* (2013.01); *H01L 31/107* (2013.01)

(58) Field of Classification Search
CPC ............. H01L 31/03529; H01L 31/107; H01L 31/103; H01L 27/1443; H01L 27/1446; H01L 27/14607; H01L 27/1461; H01L 27/1463; H01L 27/14603; H01L 27/14636; H01L 27/14689
See application file for complete search history.

(56) References Cited

U.S. PATENT DOCUMENTS

| | | |
|---|---|---|
| 9,209,320 B1 | 12/2015 | Webster |
| 9,299,732 B2 | 3/2016 | Webster et al. |
| 9,312,401 B2 | 4/2016 | Webster |
| 9,825,073 B2 | 11/2017 | Webster |
| 10,204,950 B1 | 2/2019 | Yamashita |
| 10,438,987 B2 | 10/2019 | Mandai et al. |
| 2004/0245592 A1* | 12/2004 | Harmon ................ G01J 1/4228 257/E27.128 |
| 2006/0192086 A1* | 8/2006 | Niclass ................ H01L 31/107 257/E31.063 |
| 2013/0193546 A1 | 8/2013 | Webster et al. |

(Continued)

FOREIGN PATENT DOCUMENTS

| | | |
|---|---|---|
| CN | 103779437 A | 5/2014 |
| KR | 10-2018-0090241 A | 8/2018 |

(Continued)

OTHER PUBLICATIONS

International search report and written opinion issued on Mar. 30, 2023, in counterpart International Patent Application No. PCT/KR2022/021051 (10 pages in English).

*Primary Examiner* — Sitaramarao S Yechuri
(74) *Attorney, Agent, or Firm* — NSIP Law

(57) ABSTRACT

A single-photon detection pixel includes a substrate, a first well provided in the substrate, a pair of heavily doped regions provided on the first well, and a contact provided between the pair of heavily doped regions, wherein the substrate and the pair of heavily doped regions have a first conductivity type, and the first well and the contact have a second conductivity type that is different from the first conductivity type.

20 Claims, 45 Drawing Sheets

(56) References Cited

U.S. PATENT DOCUMENTS

| | | | |
|---|---|---|---|
| 2015/0054111 A1 | 2/2015 | Niclass et al. | |
| 2015/0129747 A1* | 5/2015 | Petilli | H01L 27/14627 |
| | | | 257/432 |
| 2015/0200314 A1 | 7/2015 | Webster | |
| 2015/0340391 A1 | 11/2015 | Webster | |
| 2016/0099371 A1 | 4/2016 | Webster | |
| 2016/0218236 A1* | 7/2016 | Dhulla | H01L 27/1443 |
| 2018/0158849 A1* | 6/2018 | Henkel | H01L 31/1804 |
| 2018/0211990 A1 | 7/2018 | Yorikado et al. | |
| 2018/0301583 A1* | 10/2018 | Lo | H01L 31/107 |
| 2019/0006399 A1 | 1/2019 | Otake et al. | |
| 2019/0267414 A1 | 8/2019 | Otake et al. | |
| 2020/0091208 A1 | 3/2020 | Otake et al. | |
| 2021/0025990 A1* | 1/2021 | Ozawa | H01L 27/14607 |
| 2021/0028208 A1 | 1/2021 | Huang | |
| 2021/0193704 A1 | 6/2021 | Sun | |
| 2023/0251357 A1* | 8/2023 | Ozawa | G01S 7/4918 |
| | | | 356/4.01 |

FOREIGN PATENT DOCUMENTS

| | | |
|---|---|---|
| KR | 10-2019-0038428 A | 4/2019 |
| KR | 10-2019-0067127 A | 6/2019 |

\* cited by examiner

FIG. 18
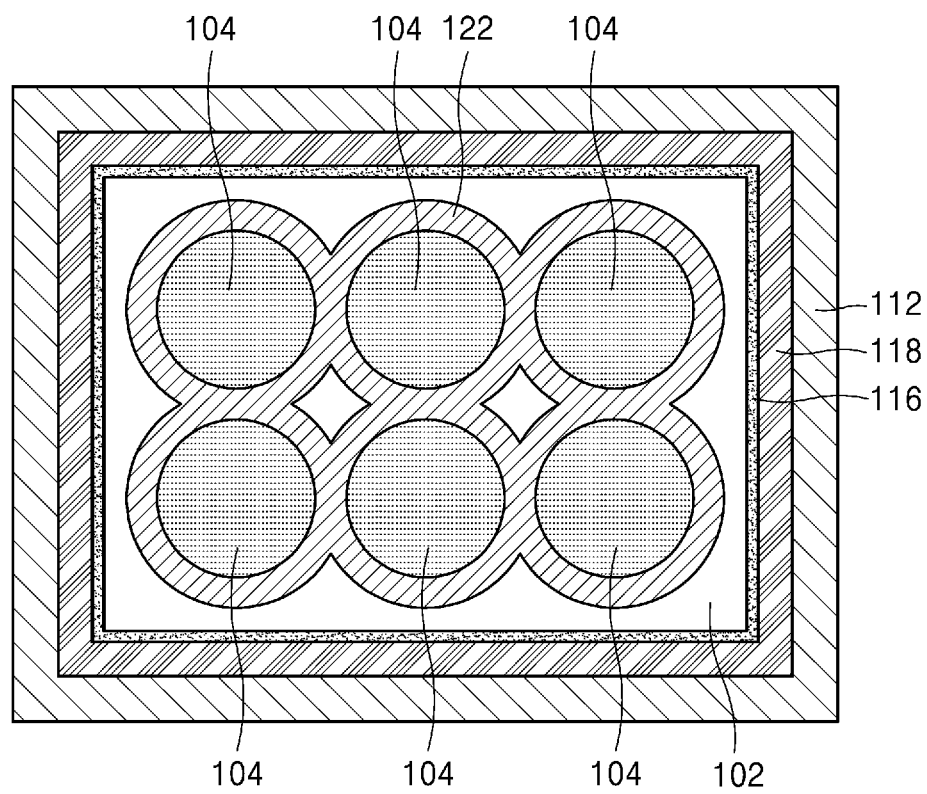
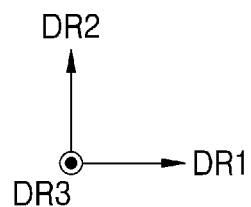

SINGLE-PHOTON DETECTION PIXEL AND SINGLE-PHOTON DETECTION PIXEL ARRAY INCLUDING THE SAME

CROSS-REFERENCE TO RELATED APPLICATION

This application is based on and claims priority under 35 U.S.C. § 119 to Korean Patent Application No. 10-2021-0194465, filed on Dec. 31, 2021, in the Korean Intellectual Property Office, the disclosure of which is incorporated by reference herein in its entirety.

BACKGROUND

1. Field

One or more embodiments relate to a single-photon detection pixel and a single-photon detection pixel array.

2. Description of the Related Art

An avalanche photodiode (APD) is a solid-state photodetector in which a high reverse bias voltage is applied to a p-n junction to provide a high first stage gain by avalanche multiplication. When an incident photon with sufficient energy to emit an electron reaches such a photodiode, an electron-hole pair (EHP) is generated. A high electric field rapidly accelerates photo-generated electrons toward an anode (+), additional electron-hole pairs are sequentially generated due to impact ionization caused by the accelerated electrons, and then all of the electrons are accelerated toward the anode. Likewise, holes are rapidly accelerated toward a cathode (−), and the same phenomenon occurs. Accordingly, an APD is a semiconductor-based device that operates in a similar manner to that of a photomultiplier tube. A linear-mode APD is an effective amplifier in which a gain may be set by controlling a bias voltage and a gain of tens to thousands may be achieved in a linear mode.

A single-photon avalanche diode (SPAD) is an APD in which a p-n junction is biased above a breakdown voltage to operate in a Geiger mode, so that a single incident photon may trigger an avalanche to generate a very large current and thus an easily measurable voltage pulse may be obtained along with a quenching resistor or circuit. That is, the SPAD operates as a device that generates a large voltage pulse when compared to a linear-mode APD in which a gain may not be sufficient at a low light intensity. After the avalanche is triggered, the quenching resistor or circuit is used to reduce a bias below the breakdown voltage in order to quench an avalanche process. Once the avalanche process is quenched, the bias voltage raises again above the breakdown voltage to reset the SPAD for detection of another photon (i.e., known as re-bias the SPAD).

A SPAD pixel may be configured with a quenching resistor or circuit, a recharge circuit, a memory, a gate circuit, a counter, a time-to-digital converter, and the like, and because the SPAD pixel is semiconductor-based, SPAD pixels may be easily configured in an array. An isolation region such as a deep trench isolation (DTI) may be formed between pixels to prevent crosstalk between the pixels.

SUMMARY

One or more embodiments include a miniaturized single-photon detection pixel.

One or more embodiments include a miniaturized single-photon detection pixel array.

One or more embodiments include a single-photon detection pixel that provides a higher fill factor.

One or more embodiments include a single-photon detection pixel array that provides a higher filter factor.

However, the embodiments are examples, and do not limit the scope of the disclosure.

Additional aspects will be set forth in part in the description which follows and, in part, will be apparent from the description, or may be learned by practice of the presented embodiments of the disclosure.

According to one or more embodiments, a single-photon detection pixel includes a substrate, a first well provided in the substrate, a pair of heavily doped regions provided on the first well, and a contact provided between the pair of heavily doped regions, wherein the substrate and the pair of heavily doped regions have a first conductivity type, and the first well and the contact have a second conductivity type that is different from the first conductivity type.

The contact and the pair of heavily doped regions may be configured such that a voltage is applied to form a pair of depletion regions in each of regions adjacent to boundaries between the pair of heavily doped regions and the first well.

The contact may have a pair of ring shapes connected to each other, wherein the pair of heavily doped regions may be respectively arranged in the pair of ring shapes.

The pair of ring shapes may be one of a pair of circular ring shapes, a pair of octagonal ring shapes, and a pair of quadrangular ring shapes.

The single-photon detection pixel may further include a pair of guard rings surrounding the pair of heavily doped regions, respectively, wherein the pair of guard rings may have the first conductivity type.

The single-photon detection pixel may further include a first additional isolation region provided between the pair of guard rings, wherein the first additional isolation region may be disposed below the pair of guard rings.

The single-photon detection pixel may further include a second additional isolation region provided between the pair of guard rings, wherein the second additional isolation region may pass through a region where the pair of guard rings face each other.

The single-photon detection pixel may further include a pair of second wells respectively provided between the first well and the pair of heavily doped regions, wherein the pair of second wells may have the first conductivity type.

According to one or more embodiments, a single-photon detection pixel includes a substrate, a first well provided in the substrate, a pair of heavily doped regions provided in an upper portion of the first well, and a contact having a ring shape surrounding the pair of heavily doped regions, wherein the substrate and the pair of heavily doped regions have a first conductivity type, and the first well and the contact have a second conductivity type that is different from the first conductivity type.

The ring shape may be one of a circular ring shape, an octagonal ring shape, and a quadrangular ring shape.

The contact and the pair of heavily doped regions may be configured such that a voltage is applied to form a pair of depletion regions in each of regions adjacent to boundaries between the pair of heavily doped regions and the first well.

The single-photon detection pixel may further include a pair of guard rings surrounding the pair of heavily doped regions, respectively, wherein the pair of guard rings may have the first conductivity type.

The single-photon detection pixel may further include a first additional isolation region provided between the pair of guard rings, wherein the first additional isolation region may be disposed below the pair of guard rings.

The single-photon detection pixel may further include a second additional isolation region provided between the pair of guard rings, wherein the second additional isolation region may pass through a region where the pair of guard rings face each other.

The pair of guard rings may be connected to each other.

The single-photon detection pixel may further include a first additional isolation region provided below a portion where the pair of guard rings are connected to each other.

The single-photon detection pixel may further include a pair of second wells respectively provided between the first well and the pair of heavily doped regions, wherein the pair of second wells may have the first conductivity type.

The single-photon detection pixel may further include a first additional isolation region provided between the pair of second wells, wherein the first additional isolation region may be disposed below the pair of second wells.

The single-photon detection pixel may further include a second additional isolation region provided between the pair of second wells, wherein the second additional isolation region has a pair of ring shapes connected to each other.

According to one or more embodiments, A single-photon detection pixel array includes a plurality of single-photon detection pixels, and an isolation region provided between the plurality of single-photon detection pixels, wherein each of the plurality of single-photon detection pixels includes a substrate, a first well provided in the substrate, a pair of heavily doped regions provided in an upper portion of the first well, and a contact provided between the pair of heavily doped regions, wherein the substrate and the pair of heavily doped regions have a first conductivity type, and the first well and the contact have a second conductivity type that is different from the first conductivity type.

According to one or more embodiments, a single-photon detection pixel includes a substrate, a pair of first wells provided in the substrate, a pair of heavily doped regions respectively provided on the pair of first wells, and a contact provided between the pair of heavily doped regions, wherein the substrate, the pair of first wells, and the contact have a first conductivity type, and the pair of heavily doped regions have a second conductivity type that is different from the first conductivity type.

The single-photon detection pixel may further include a pair of second wells respectively provided between the pair of first wells and the pair of heavily doped regions, wherein the pair of second wells may have the second conductivity type.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 18 is a plan view of a single-photon detection pixel having the cross-section of FIG. 17;

DETAILED DESCRIPTION

Figure 1:
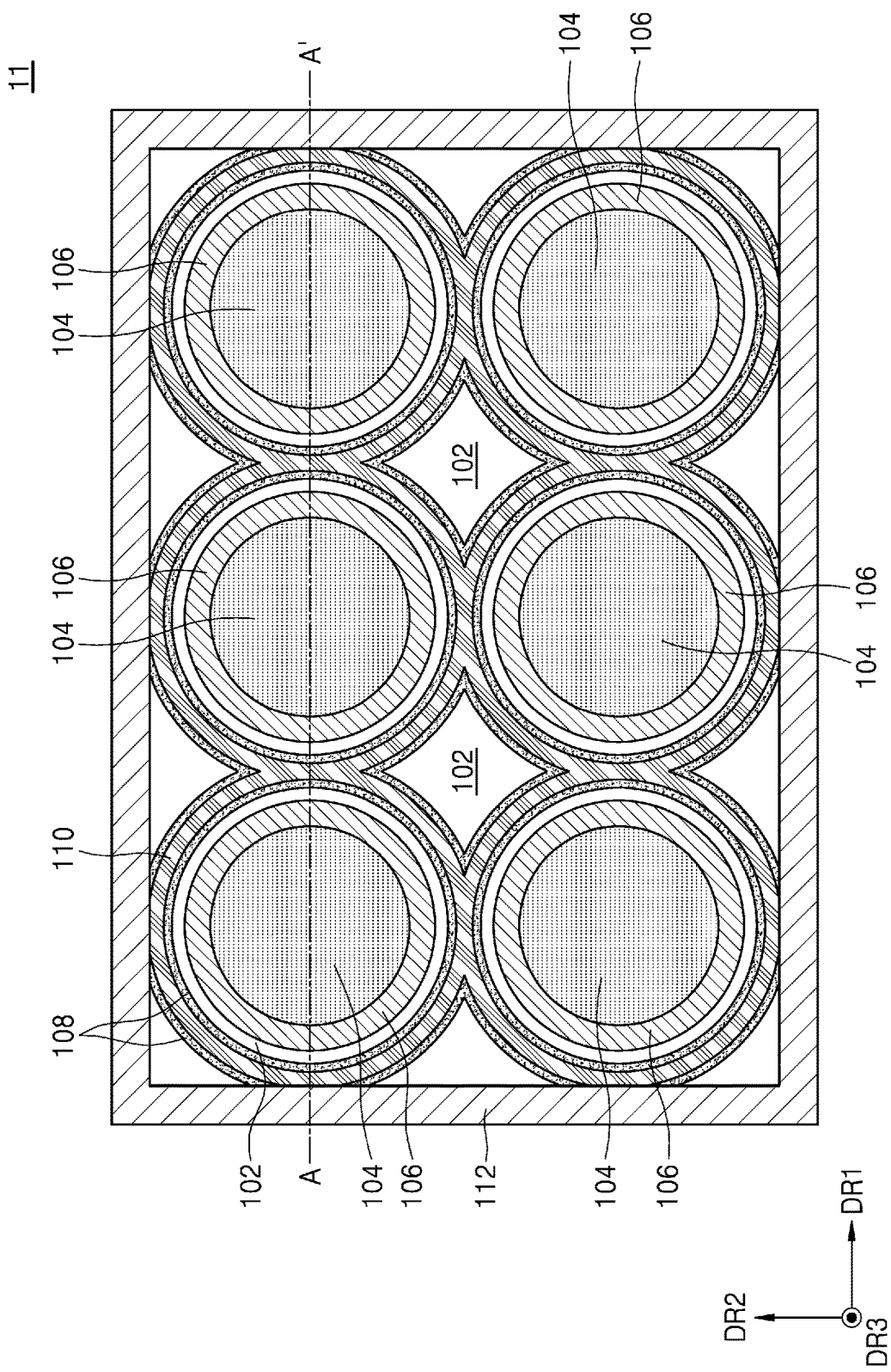
FIG. 1 is a plan view of a single-photon detection pixel according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described with reference to the drawings. Like reference numerals denote like elements throughout, and in the drawings, sizes of elements may be exaggerated for clarity and convenience of explanation. Also, the embodiments described below are merely examples, and various modifications may be made from the embodiments.

When an element is referred to as being "on" another element, it may be directly on the other element, or intervening elements may be present therebetween.

The singular forms "a," "an," and "the" are intended to include the plural forms as well, unless the context clearly indicates otherwise. When a portion "includes" an element, another element may be further included, rather than excluding the existence of the other element, unless otherwise described.

Figure 2:
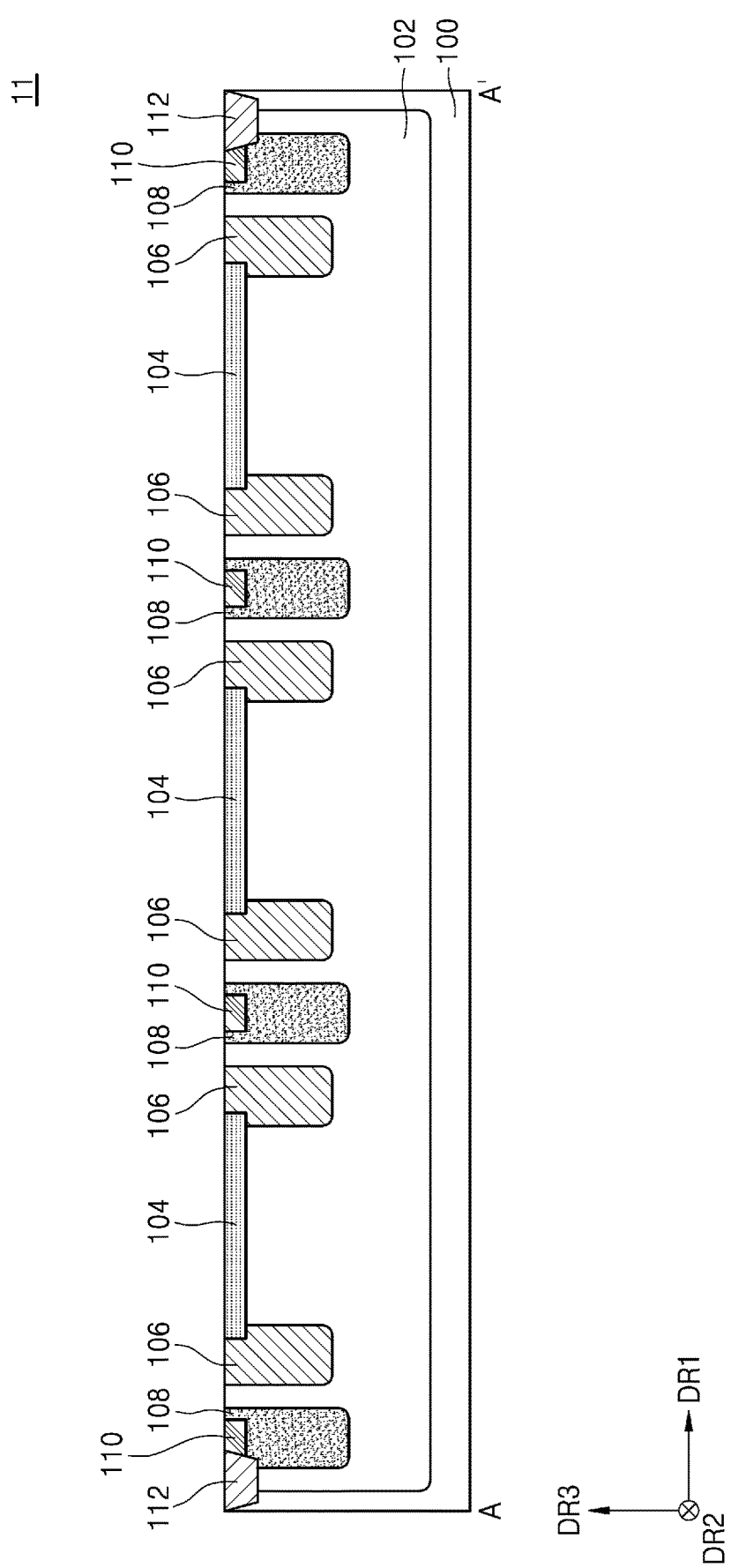
FIG. 2 is a cross-sectional view of the single-photon detection pixel taken along line A-A' of FIG. 1.

FIG. 1 is a plan view of a single-photon detection pixel 11 according to an embodiment. FIG. 2 is a cross-sectional view of the single-photon detection pixel 11 taken along line A-A' of FIG. 1.

Referring to FIGS. 1 and 2, the single-photon detection pixel 11 may be provided. The single-photon detection pixel 11 may include single-photon detection elements. For example, each of the single-photon detection elements may include a single-photon avalanche diode (SPAD). The SPAD may be referred to as a Geiger-mode avalanche diode (G-APD). The single-photon detection pixel 11 may include a substrate 100, a first well 102, heavily doped regions 104, first guard rings 106, a first buffer region 108, a first contact 110, and a first isolation region 112. Each of the single-photon detection elements may be configured to include the first well 102, one of the heavily doped regions 104, one of the first guard rings 106, the first buffer region 108, and the first contact 110. The single-photon detection elements may share the first well 102, the first buffer region 108, and the first contact 110, and each of the single-photon detection elements may include one of the heavily doped regions 104 and one of the first guard ring 106. Although each of the heavily doped regions 104 is illustrated as having a circular shape, this is merely an example. In another example, the heavily doped region 104 may have a polygonal shape (e.g., an octagonal shape or a quadrangular shape) or a polygonal shape with round corners (e.g., an octagonal shape with round corners or a quadrangular shape with round corners). Although each of the first guard rings 106 is illustrated as having a circular ring shape, this is merely an example. In another example, the first guard ring 106 may have a polygonal ring shape (e.g., an octagonal ring shape or a quadrangular ring shape) or a polygonal ring shape with round corners (e.g., an octagonal ring shape with round corners or a quadrangular ring shape with round corners).

The substrate 100 may be a semiconductor substrate. For example, the substrate 100 may include silicon (Si), germanium (Si), or silicon germanium (SiGe). The substrate 100 may have a first conductivity type. The first conductivity type may be p-type or n-type. When the conductivity type of the substrate 100 is n-type, the substrate 100 may include a Group V element (e.g., phosphorus (P), arsenic (As), or antimony (Sb)), a Group VI element, or a Group VII element as an impurity. Hereinafter, a region having the n-type conductivity may include a Group V, VI, or VII element as an impurity. When the conductivity type of the substrate 100 is p-type, the substrate 100 may include a Group III element (e.g., boron (B), aluminum (Al), gallium (Ga), or indium (In)) or a Group II element as an impurity. Hereinafter, a region having the p-type conductivity may include a Group III or II element as an impurity. For example, the doping concentration of the substrate 100 may be about $1 \times 10^{14}$ $cm^{-3}$ to about $1 \times 10^{18}$ $cm^{-3}$. The semiconductor substrate may be an epi layer formed by an epitaxial growth process. The first well 102, the heavily doped regions 104, the first guard rings 106, the first buffer regions 108, the first contacts 110, and the first isolation regions 112 may be regions formed by implanting impurities into the substrate 100.

The first well 102 may be provided in an upper portion of the substrate 100. The first well 102 may have a second conductivity type that is different from the first conductivity type. When the conductivity type of the substrate 100 is n-type, the conductivity type of the first well 102 may be p-type. When the conductivity type of the substrate 100 is p-type, the conductivity type of the first well 102 may be n-type. For example, the doping concentration of the first well 102 may be about $1 \times 10^{15}$ $cm^{-3}$ to about $1 \times 10^{18}$ $cm^{-3}$. In an example, the doping concentration of the first well 102 may decrease towards the top surface of the single-photon detection pixel 11. In another example, the first well 102 may have a uniform doping concentration.

The heavily doped regions 104 may be provided in an upper portion of the first well 102. The heavily doped regions 104 may be arranged in a first direction DR1 and a second direction DR2. Although the heavily doped regions 104 and the first guard rings 106 in the form of 2×3 including two rows in the first direction DR1 and three columns in the second direction DR2 are illustrated in FIG. 1, this is merely an example. The arrangement of the heavily doped regions 104 may be selected as needed. For brevity of description, one heavily doped region 104 is described. The top surface of the heavily doped region 104 may be exposed. The bottom surface of the heavily doped region 104 may directly contact the first well 102. The heavily doped region 104 may have the first conductivity type. The doping concentration of the heavily doped region 104 may be higher than the doping concentration of the first well 102. For example, the doping concentration of the heavily doped region 104 may be about $1\times10^{15}$ cm$^{-3}$ to about $1\times10^{22}$ cm$^{-3}$. When the single-photon detection pixel 11 is a SPAD, the heavily doped region 104 may be electrically connected to a quenching resistor or circuit and other pixel circuits. The quenching resistor or circuit may stop an avalanche effect and allow the SPAD to detect another photon. The other pixel circuits may include a reset or recharge circuit, a memory, an amplifier circuit, a counter, a gate circuit, a time-to-digital converter, and the like, and may transmit signals to the single-photon detection pixel 11 or receive signals from the single-photon detection pixel 11. In another example, the heavily doped region 104 may be electrically connected to an external power source or direct current (DC)-to-DC converter and a power management integrated circuit.

A depletion region may be formed in a region adjacent to the interface between the first well 102 and the heavily doped region 104. When a reverse bias is applied to the single-photon detection pixel 11, a strong electric field may be formed in the depletion region. For example, when the single-photon detection pixel 11 operates as a SPAD, the maximum intensity of the electric field may be about $1\times10^{5}$ V/cm to about $1\times10^{6}$ V/cm. Because electrons may be multiplied by the electric field of the depletion region, the depletion region may be referred to as a multiplication region.

The first guard rings 106 may be provided on side surfaces of the heavily doped regions 104. For brevity of description, one first guard ring 106 is described. The first guard ring 106 may mitigate the concentration of an electric field at the edge of the heavily doped region 104, thereby preventing premature breakdown. The premature breakdown refers to breakdown occurring first at a corner of the heavily doped region 104 before an electric field of a sufficient magnitude is applied to the depletion region, and occurs as the electric field is concentrated at the corner of the heavily doped region 104. The first guard ring 106 may improve the breakdown characteristic of the single-photon detection pixel 11. The first guard ring 106 may be provided in the first well 102. The first guard ring 106 may surround the heavily doped region 104. For example, the first guard ring 106 may have a ring shape extending along a side surface of the heavily doped region 104. The first guard ring 106 may directly contact the heavily doped region 104. In another example, the first guard ring 106 may be apart from the heavily doped region 104. The thickness of the first guard ring 106 may be greater than the thickness of the heavily doped region 104. The thickness may be a size in a third direction DR3 crossing the top surface of the single-photon detection pixel 11. For example, the first direction DR1, the second direction DR2, and the third direction DR3 may be perpendicular to one another. The top surface of the first guard ring 106 may be disposed at the same height as the top surface of the heavily doped region 104. The first guard ring 106 may have the first conductivity type. The doping concentration of the first guard ring 106 may be lower than the doping concentration of the heavily doped region 104. For example, the doping concentration of the first guard ring 106 may be about $1\times10^{15}$ cm$^{-3}$ to about $1\times10^{18}$ cm$^{-3}$.

The first contact 110 may be provided in an upper portion of the first well 102. The first contact 110 may be electrically connected to a circuit external to the single-photon detection pixel 11. When the single-photon detection pixel 11 is a SPAD, the first contact 110 may be electrically connected to an external power source or DC-to-DC converter and a power management integrated circuit. In another example, the first contact 110 may be electrically connected to a quenching resistor or circuit and other pixel circuits. The quenching resistor or circuit may stop an avalanche effect and allow the SPAD to detect another photon. The other pixel circuits may include a reset or recharge circuit, a memory, an amplifier circuit, a counter, a gate circuit, a time-to-digital converter, and the like, and may transmit signals to the single-photon detection pixel 11 or receive signals from the single-photon detection pixel 11. The first contact 110 may be provided opposite the heavily doped regions 104 with the first guard rings 106 therebetween. The first contact 110 may surround the first guard rings 106. For example, the first contact 110 may have a plurality of ring shapes extending along the first guard rings 106 and connected to each other. A heavily doped region 104 and a first guard ring 106 may be arranged in each of the plurality of ring shapes. The first contact 110 may have the second conductivity type. The doping concentration of the first contact 110 may be higher than the doping concentration of the first well 102. For example, the doping concentration of the first contact 110 may be about $1\times10^{15}$ cm$^{-3}$ to about $1\times10^{22}$ cm$^{-3}$.

The first buffer region 108 may be provided between the first contact 110 and the first well 102. The first buffer region 108 may be electrically connected to the first contact 110 and the first well 102. The first buffer region 108 may buffer a difference between the band gap of the first contact 110 and the band gap of the first well 102. The first buffer region 108 may extend along with the first contact 110. The first buffer region 108 may be provided on the side surface and the bottom surface of the first contact 110. In another example, the first buffer region 108 may not be provided on the side surface of the first contact 110, but may be provided only on the bottom surface of the first contact 110. The first buffer region 108 may surround the first guard rings 106. For example, the first buffer region 108 may have a plurality of ring shapes extending along the first guard rings 106 and connected to each other. The heavily doped regions 104 may be respectively arranged in the plurality of ring shapes. The first buffer region 108 may be apart from the first guard rings 106. The first well 102 may extend into a region between the first buffer region 108 and the first guard rings 106. For example, the region between the first buffer region 108 and the first guard rings 106 may be filled with the first well 102. In another example, the first buffer region 108 may contact the first guard rings 106. The first buffer region 108 may be thicker than the first guard rings 106. For example, the first buffer region 108 may be formed from the top surface of the single-photon detection pixel 11 to a depth greater than the bottom surfaces of the first guard rings 106. In another example, the first buffer region 108 may be formed to a depth equal to or less than those of the first guard rings 106. The first buffer region 108 may have the second conductivity type. The doping concentration of the first buffer region 108 may be lower than that of the first contact 110, and may be similar to or higher than that of the first well 102. For example, the doping concentration of the first buffer region 108 may be about $1\times10^{15}$ cm$^{-3}$ to about $1\times10^{19}$ cm$^{-3}$.

The first isolation region 112 may surround the single-photon detection pixel 11. The first isolation region 112 may extend along a boundary of the first well 102. The first isolation region 112 may contact the first contact 110. The first isolation region 112 may include an insulating material. The first isolation region 112 may include silicon oxide (e.g., SiO$_2$), silicon nitride (e.g., SiN), silicon oxynitride (e.g., SiON), polycrystalline silicon, a low-k dielectric material, a metal, or a combination thereof. The first isolation region 112 may be a shallow trench isolation (STI). In another embodiment, the first isolation region 112 may be apart from the first contact 110. In another embodiment, the first isolation region 112 may not be formed.

In an embodiment of the disclosure, because the single-photon detection elements share the first buffer region 108 and the first contact 110, a single-photon detection pixel 11 having a small size or a high fill factor compared to the case where each of the single-photon detection elements has the first buffer region 108 and the first contact 110 separately (i.e., the case where the first buffer region 108 and the first contact 110 are not shared) may be provided.

In another embodiment, the first well 102, the first buffer region 108, and the first contact 110 may each have the first conductivity type, and the heavily doped region 104 and the first guard ring 106 may each have the second conductivity type.

Figure 3:
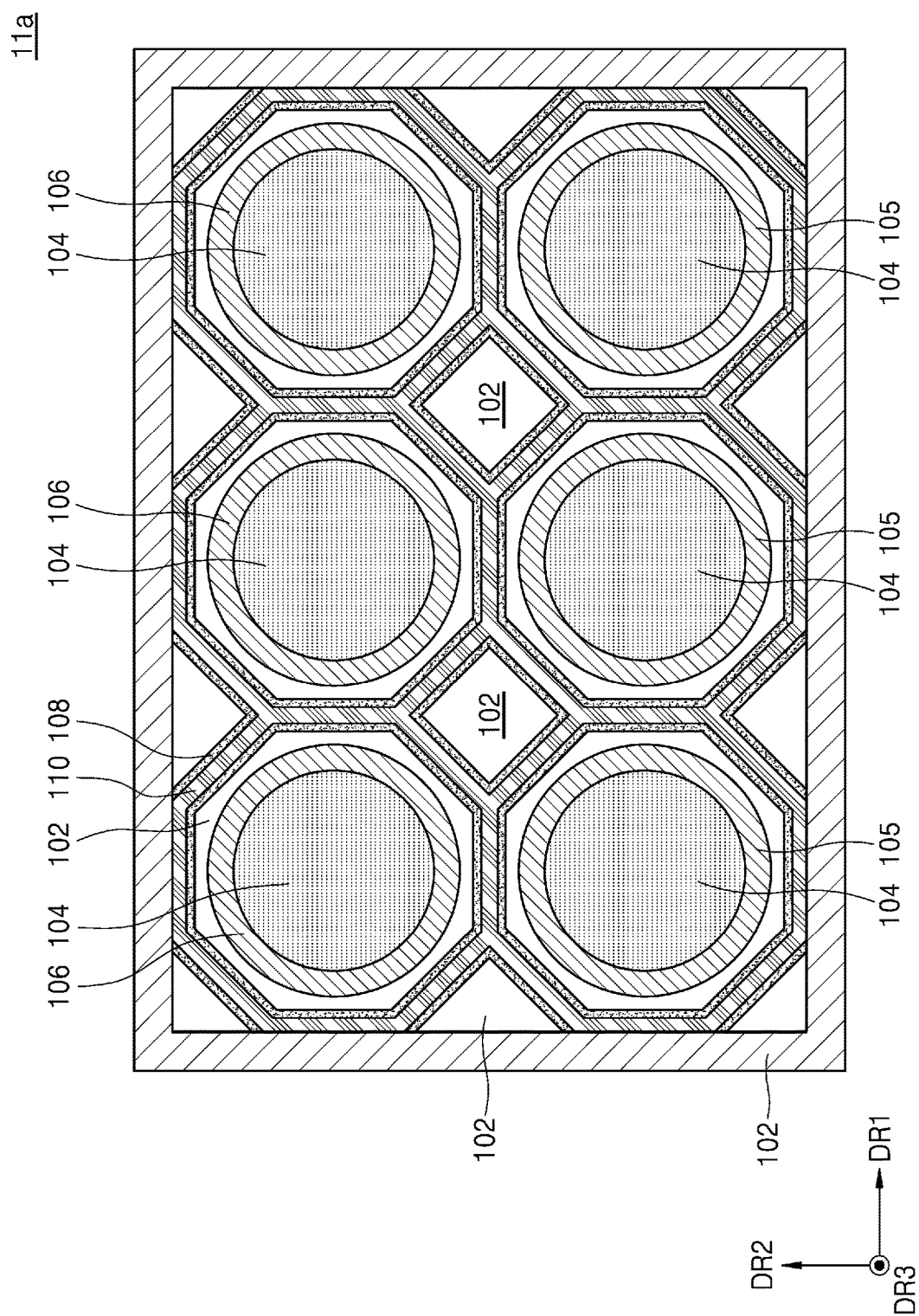
FIG. 3 is a plan view of a single-photon detection pixel having the cross-section of FIG. 2.

FIG. 3 is a plan view of a single-photon detection pixel 11a having the cross-section of FIG. 2. For brevity of description, descriptions substantially the same as those given with reference to FIGS. 1 and 2 may be omitted.

Referring to FIG. 3, the single-photon detection pixel 11a may be provided. Unlike the single-photon detection pixel 11 described with reference to FIGS. 1 and 2, the single-photon detection pixel 11a may include a first buffer region 108 and a first contact 110, respectively configured to have a plurality of octagonal ring shapes connected to each other.

An embodiment of the disclosure may provide the single-photon detection pixel 11a having a small size or a high fill factor.

Figure 4:
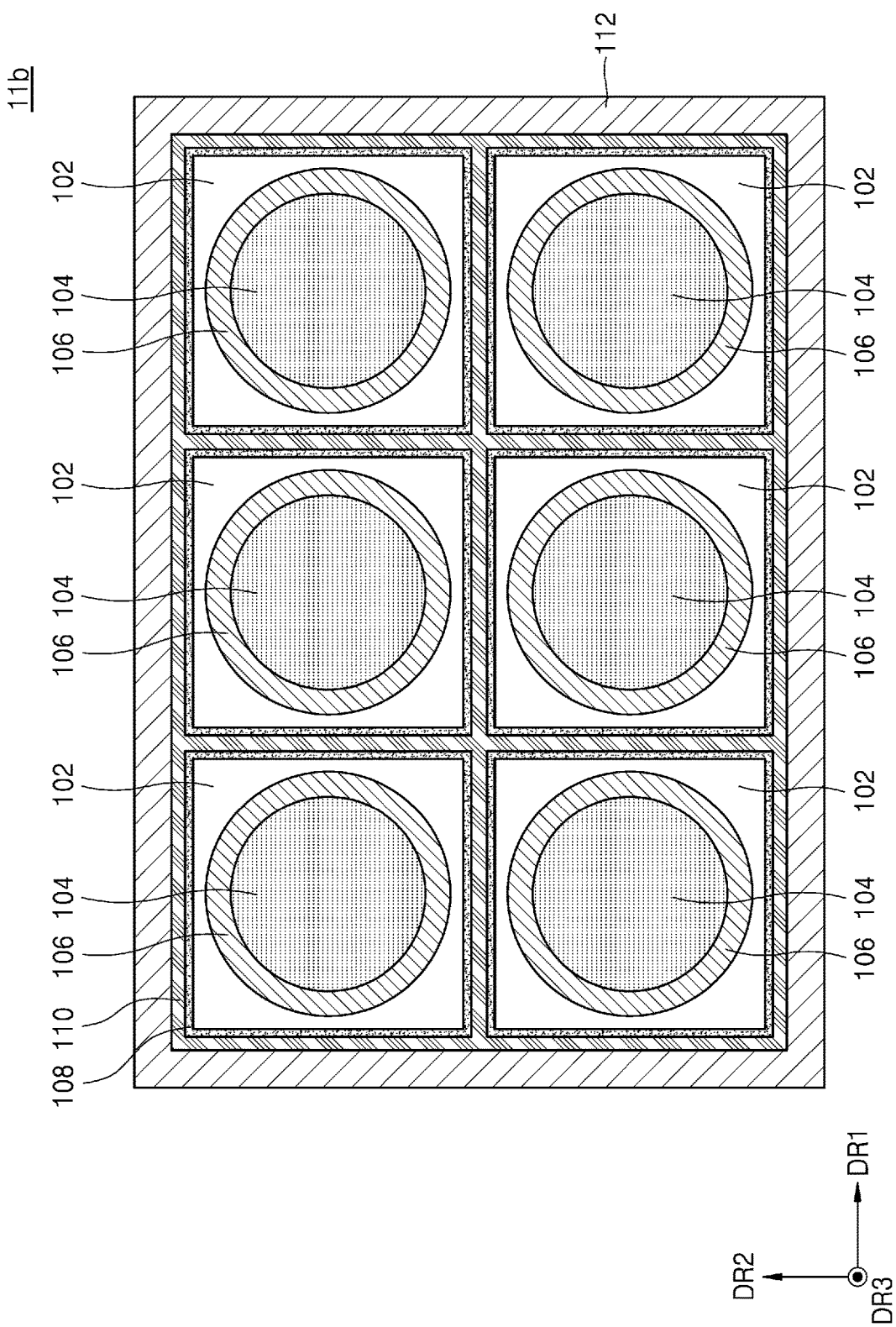
FIG. 4 is a plan view of a single-photon detection pixel having the cross-section of FIG. 2.

FIG. 4 is a plan view of a single-photon detection pixel 11b having the cross-section of FIG. 2. For brevity of description, descriptions substantially the same as those given with reference to FIGS. 1 and 2 may be omitted.

Referring to FIG. 4, the single-photon detection pixel 11b may be provided. Unlike the single-photon detection pixel 11 described with reference to FIGS. 1 and 2, the single-photon detection pixel 11b may include a first buffer region 108 and a first contact 110, respectively configured to have a plurality of quadrangular ring shapes connected to each other. The shapes of the first buffer region 108 and the first contact 110 are just examples and not restrictive. That is, the first buffer region 108 and the first contact 110 may have shapes other than a circular ring shape, an octagonal ring shape, and a quadrangular ring shape.

An embodiment of the disclosure may provide the single-photon detection pixel 11b having a small size or a high fill factor.

Figure 5:
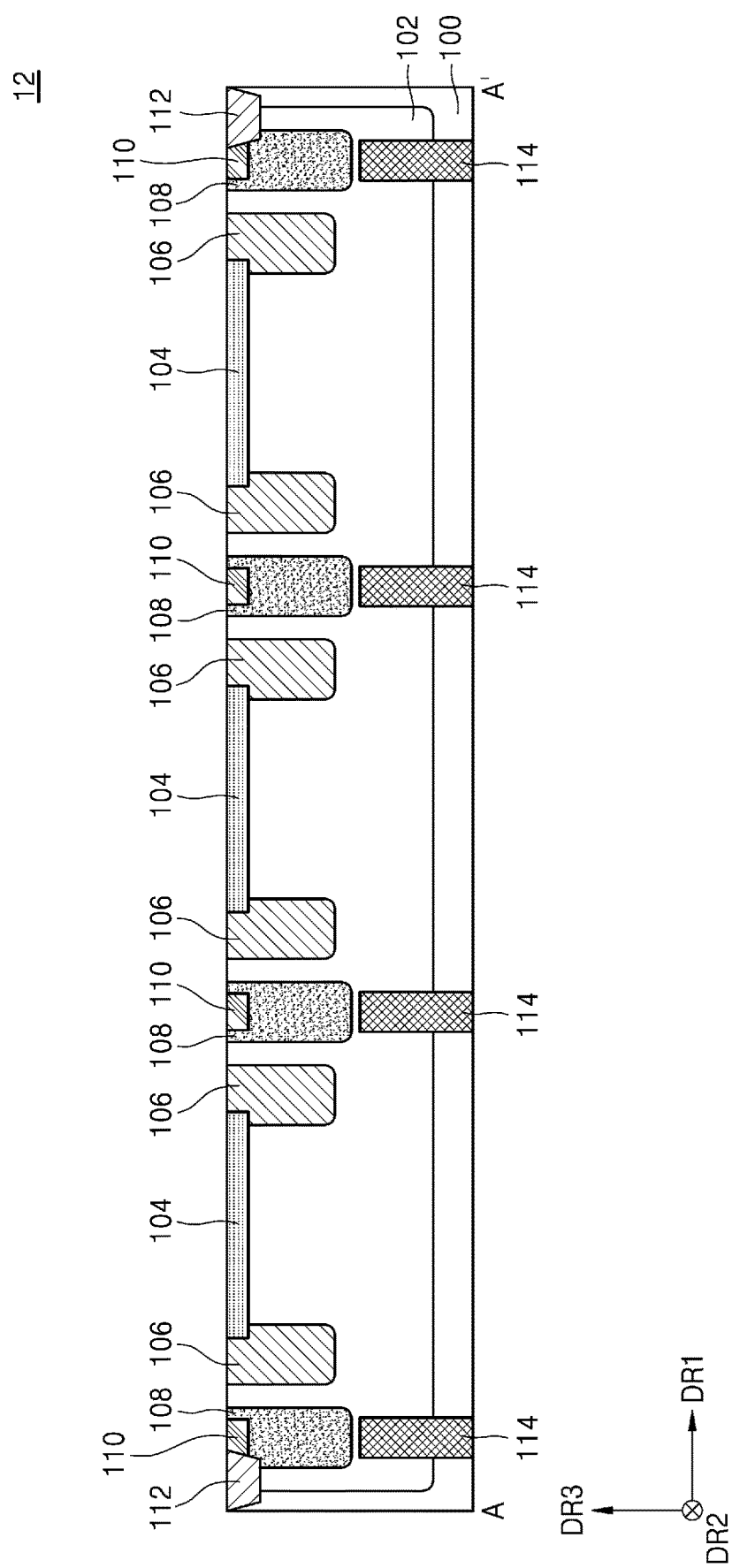
FIG. 5 is a cross-sectional view of a single-photon detection pixel according to an embodiment, the cross-sectional view corresponding to the line A-A' of FIG. 1.

FIG. 5 is a cross-sectional view of a single-photon detection pixel 12 according to an embodiment, the cross-sectional view corresponding to the line A-A' of FIG. 1. For brevity of description, descriptions substantially the same as those given with reference to FIGS. 1 and 2 may be omitted.

Referring to FIG. 5, the single-photon detection pixel 12 may be provided. The single-photon detection pixel 12 has substantially the same configuration as the single-photon detection pixel 11 described with reference to FIGS. 1 and 2, but may further include a first additional isolation region 114.

The first additional isolation region 114 may overlap a first buffer region 108 in the third direction DR3. For example, the first additional isolation region 114 may be provided below the first buffer region 108. The first additional isolation region 114 may be apart from the first buffer region 108 in the third direction DR3. However, in another embodiment, the first additional isolation region 114 may contact or penetrate first guard rings 106. A first well 102 may be provided between the first additional isolation region 114 and the first buffer region 108. The first additional isolation region 114 may extend in the third direction DR3, penetrate a substrate 100, and be inserted into the first well 102. The first additional isolation region 114 may include an insulating material. The first additional isolation region 114 may include silicon oxide (e.g., SiO$_2$), silicon nitride (e.g., SiN), silicon oxynitride (e.g., SiON), polycrystalline silicon, a low-k dielectric material, a metal, or a combination thereof. The first additional isolation region 114 may be a deep trench isolation (DTI) or a medium trench isolation (MTI) to have a required depth.

The first additional isolation region 114 may mitigate or prevent crosstalk between single-photon detection elements. An embodiment of the disclosure may provide the single-photon detection pixel 12 with improved reliability.

In another embodiment, the first well 102, the first buffer region 108, and the first contact 110 may each have a first conductivity type, and the heavily doped region 104 and the first guard ring 106 may each have a second conductivity type.

Figure 6:
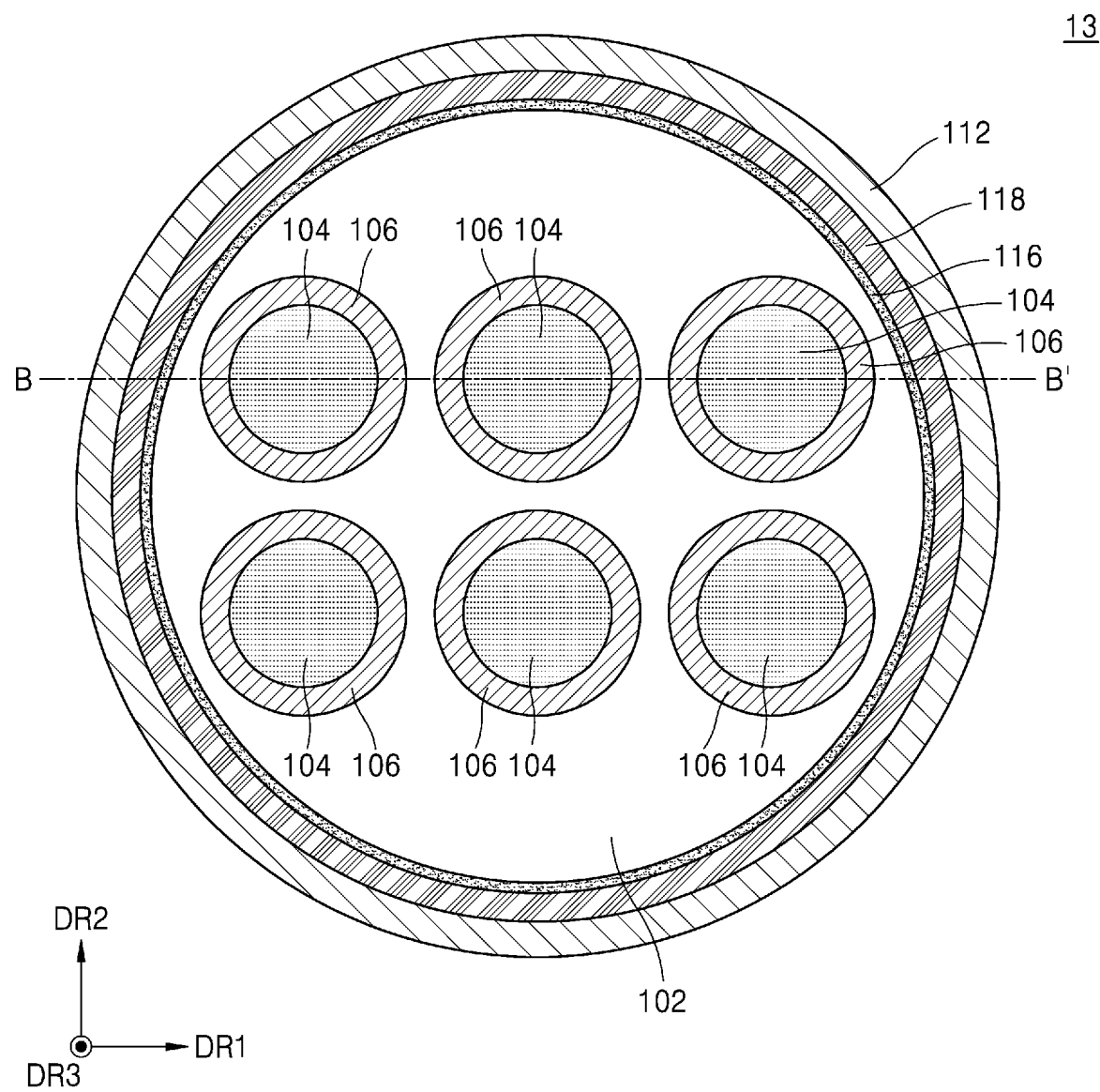
FIG. 6 is a plan view of a single-photon detection pixel according to an embodiment.
Figure 7:
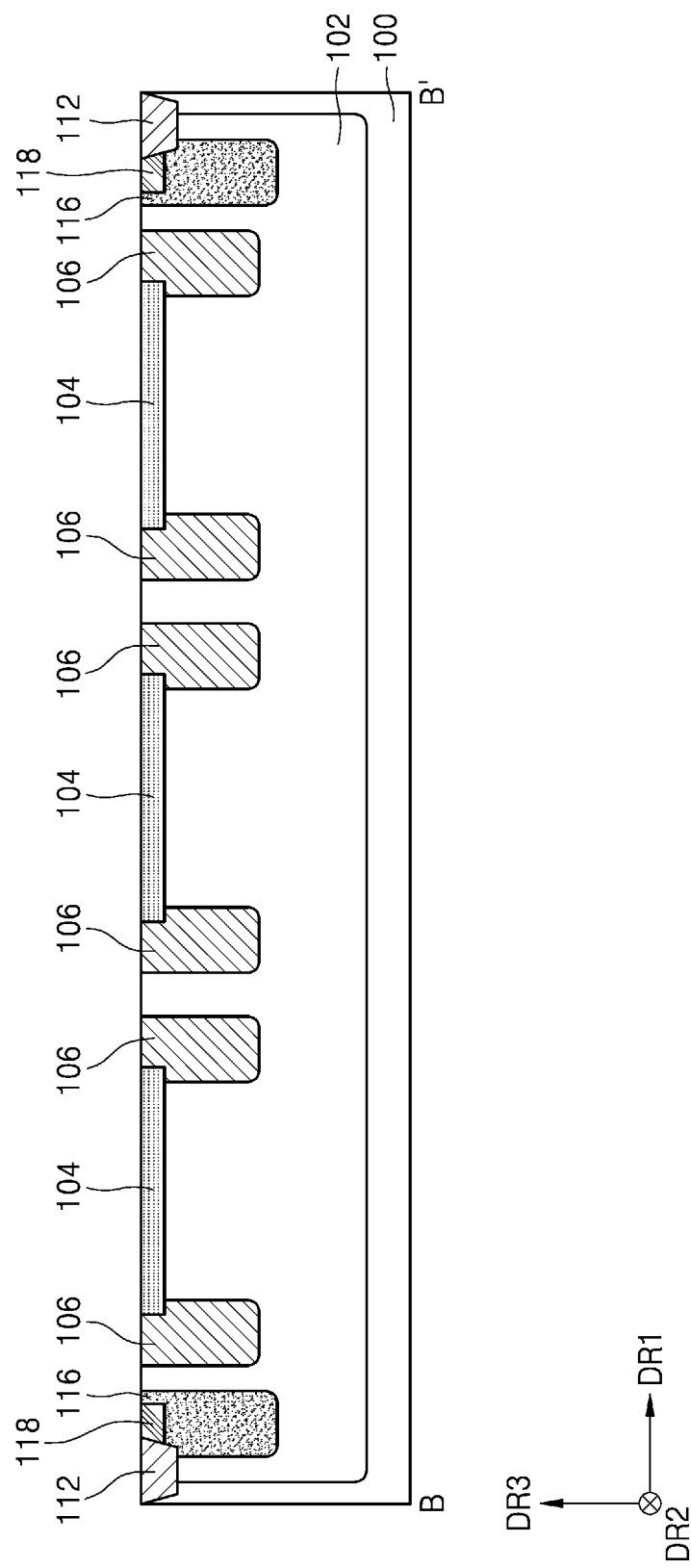
FIG. 7 is a cross-sectional view of the single-photon detection pixel taken along line B-B' of FIG. 6.

FIG. 6 is a plan view of a single-photon detection pixel 13 according to an embodiment. FIG. 7 is a cross-sectional view of the single-photon detection pixel 13 taken along line B-B' of FIG. 6. For brevity of description, descriptions substantially the same as those given with reference to FIGS. 1 and 2 may be omitted.

Referring to FIGS. 6 and 7, the single-photon detection pixel 13 may be provided. Unlike the single-photon detection pixel 11 described with reference to FIGS. 1 and 2, the single-photon detection pixel 13 may not include the first contact 110 and the first buffer region 108. The single-photon detection pixel 13 may include a second contact 118 and a second buffer region 116. The second contact 118 and the second buffer region 116 may be substantially the same as the first contact 110 and the first buffer region 108, respectively, except for their shape and location. The second contact 118 and the second buffer region 116 may each have a single ring shape. For example, the second contact 118 and the second buffer region 116 may each have a circular ring shape. Heavily doped regions 104 and first guard rings 106 may be arranged inside a ring shape formed by the second contact 118 and the second buffer region 116. The first guard rings 106 may be apart from each other. A first well 102 may be provided between the first guard rings 106. For example, a region between the first guard rings 106 may be filled with the first well 102.

Unlike the first contact 110 and the first buffer region 108, the second contact 118 and the second buffer region 116 may not be disposed between the first guard rings 106. Accordingly, an embodiment of the disclosure may provide the single-photon detection pixel 13 that is miniaturized or has a high fill factor.

In another embodiment, the first well 102, the second contact 118, and the second buffer region 116 may each have a first conductivity type, and the heavily doped region 104 and the first guard ring 106 may each have a second conductivity type.

Figure 8:
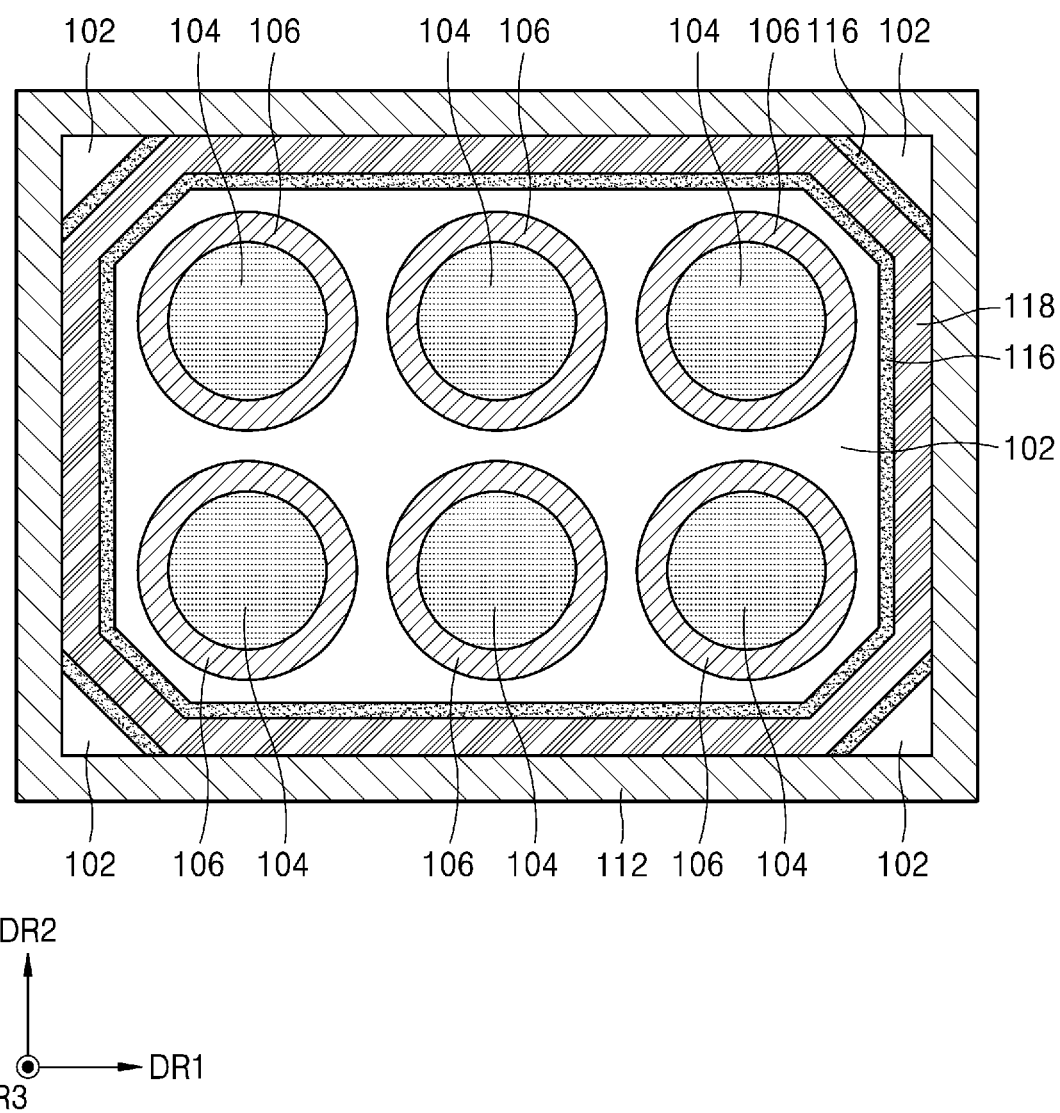
FIG. 8 is a plan view of a single-photon detection pixel having the cross-section of FIG. 7.

FIG. 8 is a plan view of a single-photon detection pixel 13a having the cross-section of FIG. 7. For brevity of description, descriptions substantially the same as those given with reference to FIGS. 6 and 7 may be omitted.

Referring to FIG. 8, the single-photon detection pixel 13a may be provided. Unlike the single-photon detection pixel 13 described with reference to FIGS. 6 and 7, the single-photon detection pixel 13a may include a second buffer region 116 and a second contact 118 each having a single octagonal ring shape.

An embodiment of the disclosure may provide the single-photon detection pixel 13a that is miniaturized or has a high fill factor.

Figure 9:
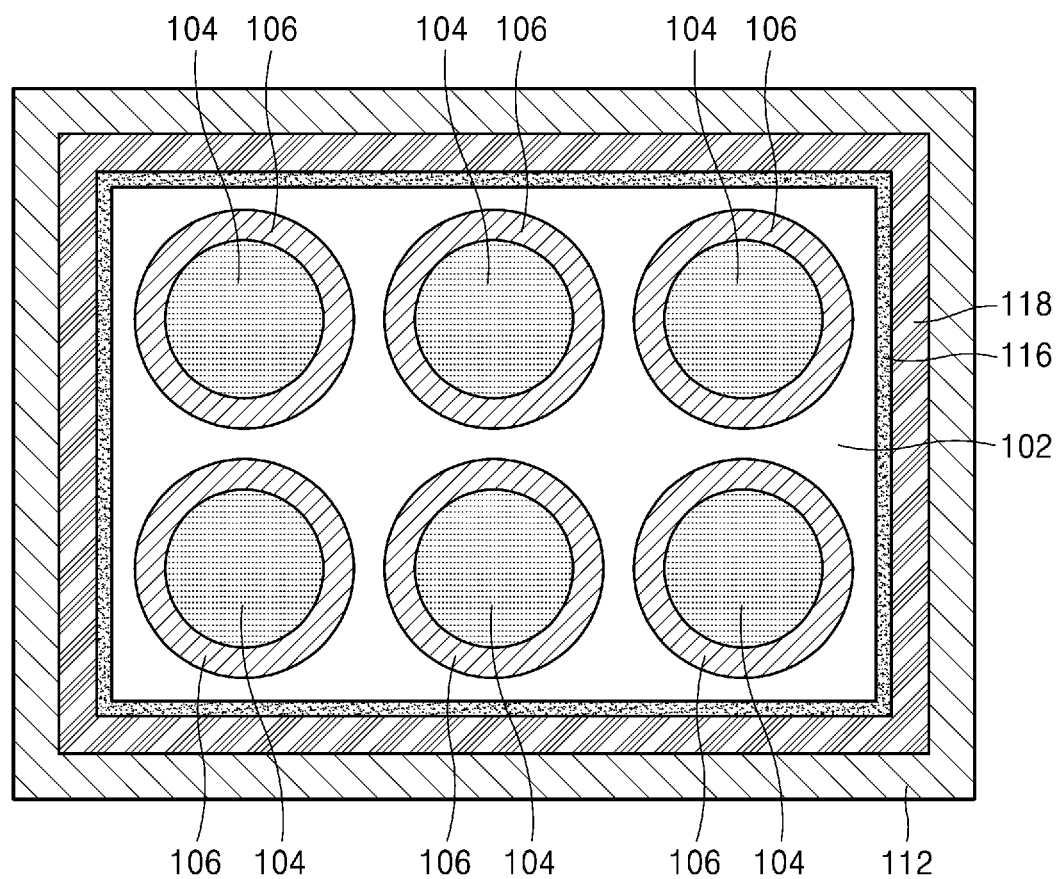
FIG. 9 is a plan view of a single-photon detection pixel having the cross-section of FIG. 7.

FIG. 9 is a plan view of a single-photon detection pixel 13b having the cross-section of FIG. 7. For brevity of description, descriptions substantially the same as those given with reference to FIGS. 6 and 7 may be omitted.

Referring to FIG. 9, the single-photon detection pixel 13b may be provided. Unlike the single-photon detection pixel 13 described with reference to FIGS. 6 and 7, the single-photon detection pixel 13b may include a second buffer region 116 and a second contact 118 each having a single quadrangular ring shape. The shapes of the second buffer region 116 and the second contact 118 are just examples and not restrictive. That is, the second buffer region 116 and the second contact 118 may each have a shape other than a circular ring shape, an octagonal ring shape, and a quadrangular ring shape.

An embodiment of the disclosure may provide the single-photon detection pixel 13b that is miniaturized or has a high fill factor.

Figure 10:
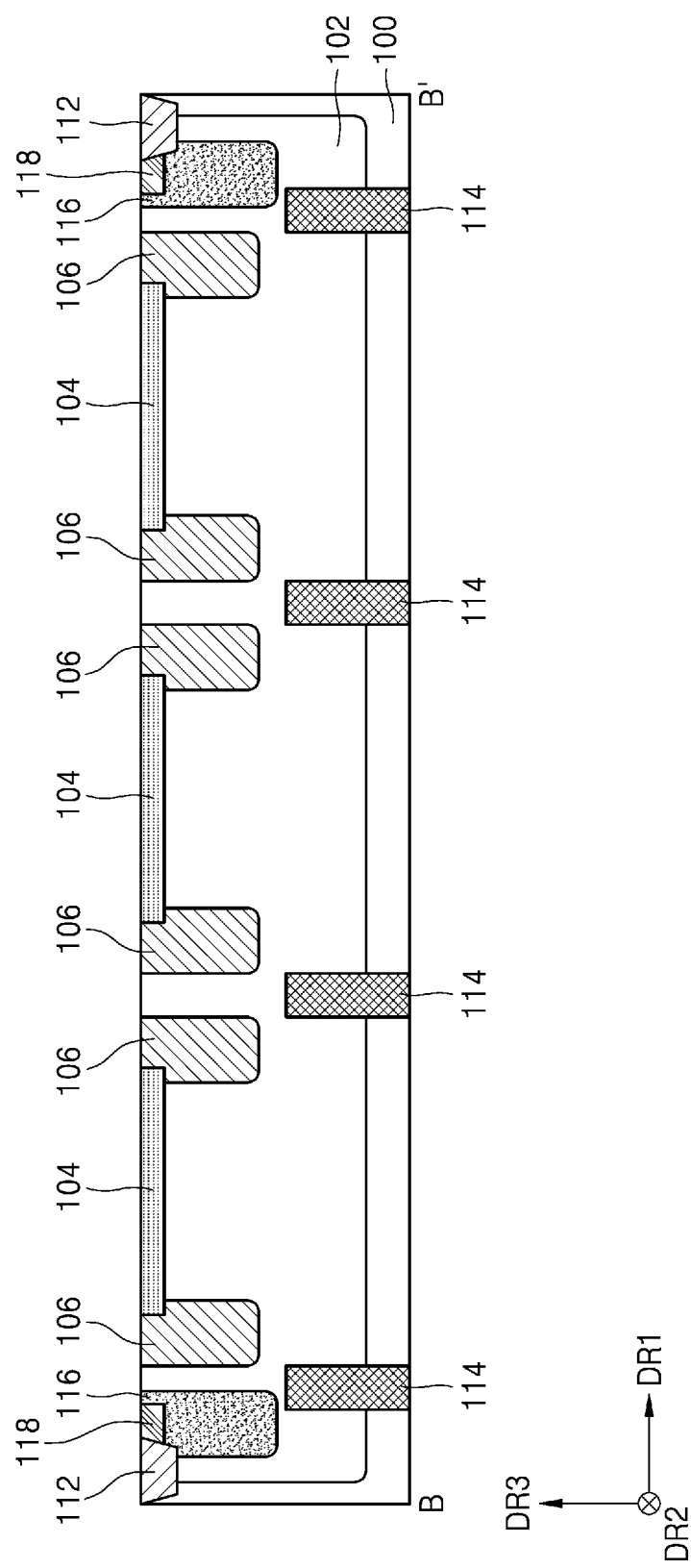
FIG. 10 is a cross-sectional view of a single-photon detection pixel according to an embodiment, the cross-sectional view corresponding to line A-A' of FIG. 6.

FIG. 10 is a cross-sectional view of a single-photon detection pixel 14 according to an embodiment, the cross-sectional view corresponding to line A-A' of FIG. 6. For brevity of description, descriptions substantially the same as those given with reference to FIGS. 6 and 7 may be omitted.

Referring to FIG. 10, the single-photon detection pixel 14 may be provided. The single-photon detection pixel 14 has substantially the same configuration as the single-photon detection pixel 13 described with reference to FIGS. 6 and 7, but may further include a first additional isolation region 114.

When viewed in the third direction DR3, the first additional isolation region 114 may be provided between first guard rings 106. The first additional isolation region 114 may be provided below a region between the first guard rings 106. The first additional isolation region 114 may extend in the third direction DR3, penetrate a substrate 100, and be inserted into a first well 102. In another example, the first additional isolation region 114 may contact or penetrate the first guard rings 106. The first additional isolation region 114 may be apart from the first guard rings 106. For example, the top surface of the first additional isolation region 114 may be disposed deeper from the top surface of the single-photon detection pixel 14 than the bottom surfaces of the first guard rings 106. The first additional isolation region 114 may include an insulating material. The first additional isolation region 114 may include silicon oxide (e.g., $SiO_2$), silicon nitride (e.g., SiN), silicon oxynitride (e.g., SiON), polycrystalline silicon, a low-k dielectric material, a metal, or a combination thereof.

The first additional isolation region 114 may be a DTI or an MTI to have a required depth.

The first additional isolation region 114 may mitigate or prevent crosstalk between single-photon detection elements. An embodiment of the disclosure may provide the single-photon detection pixel 14 with improved reliability.

In another exemplary embodiment, the first well 102, the second contact 118, and the second buffer region 116 may each have a first conductivity type, and the heavily doped region 104 and the first guard ring 106 may each have a second conductivity type.

Figure 11:
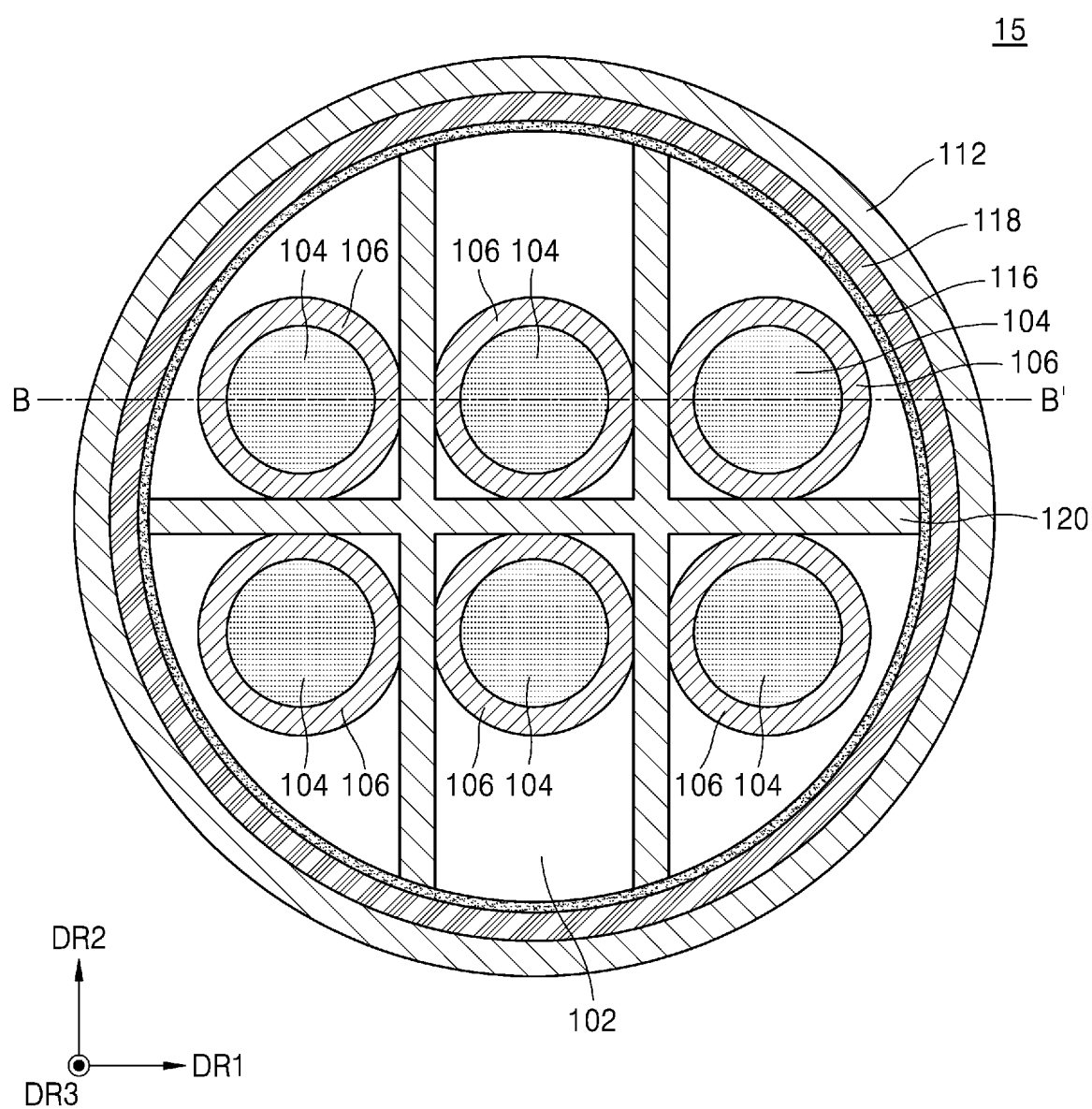
FIG. 11 is a plan view of a single-photon detection pixel according to an embodiment.
Figure 12:
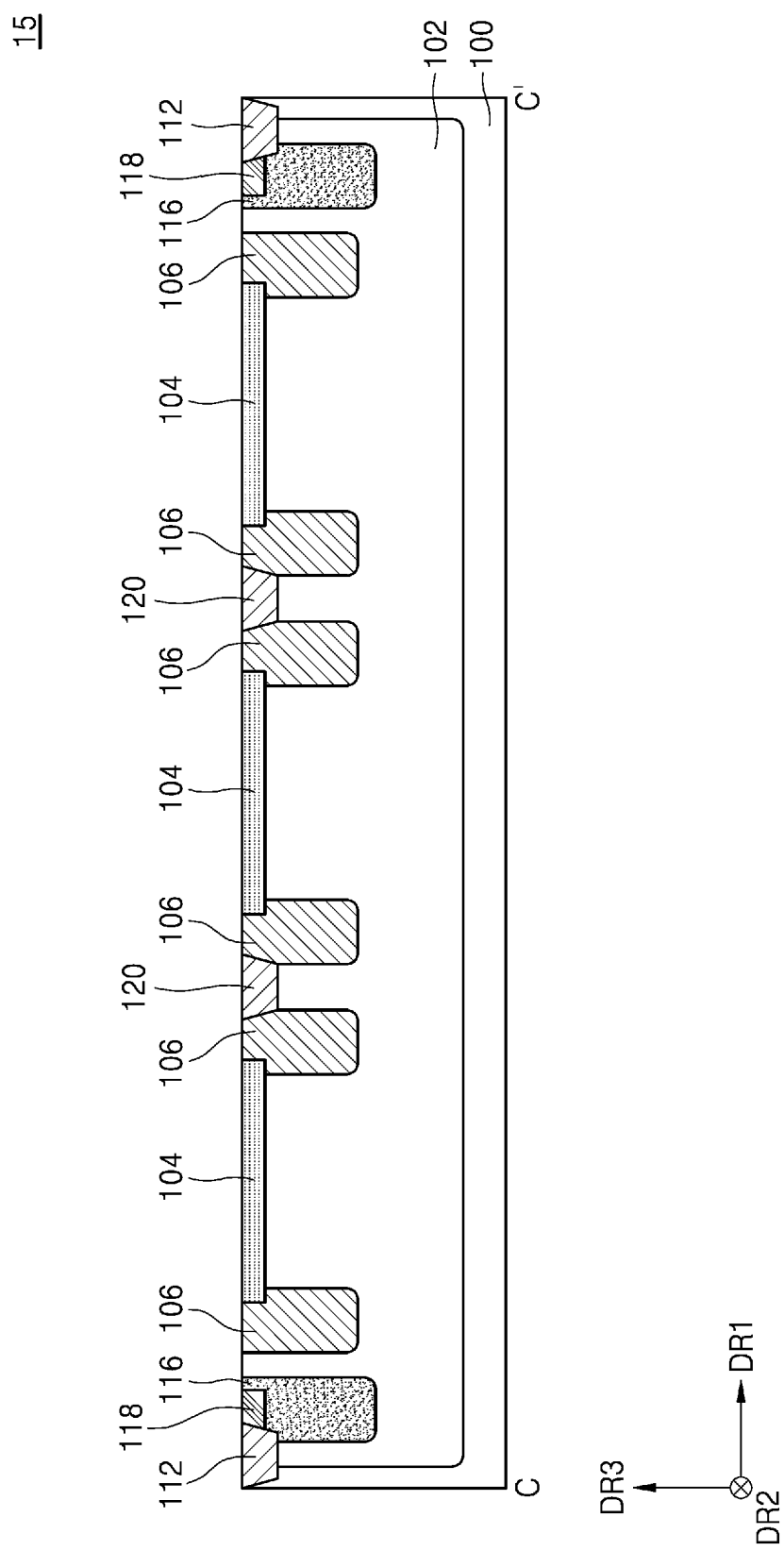
FIG. 12 is a cross-sectional view of the single-photon detection pixel taken along line C-C' of FIG. 11.

FIG. 11 is a plan view of a single-photon detection pixel 15 according to an embodiment. FIG. 12 is a cross-sectional view of the single-photon detection pixel 15 taken along line C-C' of FIG. 11. For brevity of description, descriptions substantially the same as those given with reference to FIGS. 6 and 7 may be omitted.

Referring to FIGS. 11 and 12, the single-photon detection pixel 15 may be provided. The single-photon detection pixel 15 has substantially the same configuration as the single-photon detection pixel 13 described with reference to FIGS. 6 and 7, but may further include a second additional isolation region 120. The second additional isolation region 120 may cross between first guard rings 106 immediately adjacent to each other. For example, the second additional isolation region 120 may include a portion extending in the first direction DR1 and portions extending in the second direction DR2 between the first guard rings 106. The second additional isolation region 120 may contact the first guard rings 106. The second additional isolation region 120 may be configured to partially overlap the first guard rings 106 in the third direction DR3. In another example, the second additional isolation region 120 may be apart from the first guard rings 106. In another example, the second additional isolation region 120 may be additionally provided between the first guard ring 106 and a second buffer region 116. The second additional isolation region 120 may be formed from the top surface of the single-photon detection pixel 15 to a depth less than a depth where the bottom surfaces of the first guard rings 106 are disposed. The distance between the first guard rings 106 may be independent from the second additional isolation region 120. In an example, the distance between the first guard rings 106 may be substantially equal to the distance between the first guard rings 106 of the single-photon detection pixel 13 described with reference to FIGS. 6 and 7. The second additional isolation region 120 may include an insulating material. The second additional isolation region 120 may include silicon oxide (e.g., $SiO_2$), silicon nitride (e.g., SiN), silicon oxynitride (e.g., SiON), polycrystalline silicon, a low-k dielectric material, a metal, or a combination thereof. The second additional isolation region 120 may be an STI.

In an embodiment of the disclosure, a second contact 118 and the second buffer region 116 may not be provided between the first guard rings 106. Accordingly, the single-photon detection pixel 15 that is miniaturized or has a high fill factor may be provided.

In another embodiment, the first well 102, the second contact 118, and the second buffer region 116 may each have a first conductivity type, and the heavily doped region 104 and the first guard ring 106 may each have a second conductivity type.

Figure 13:
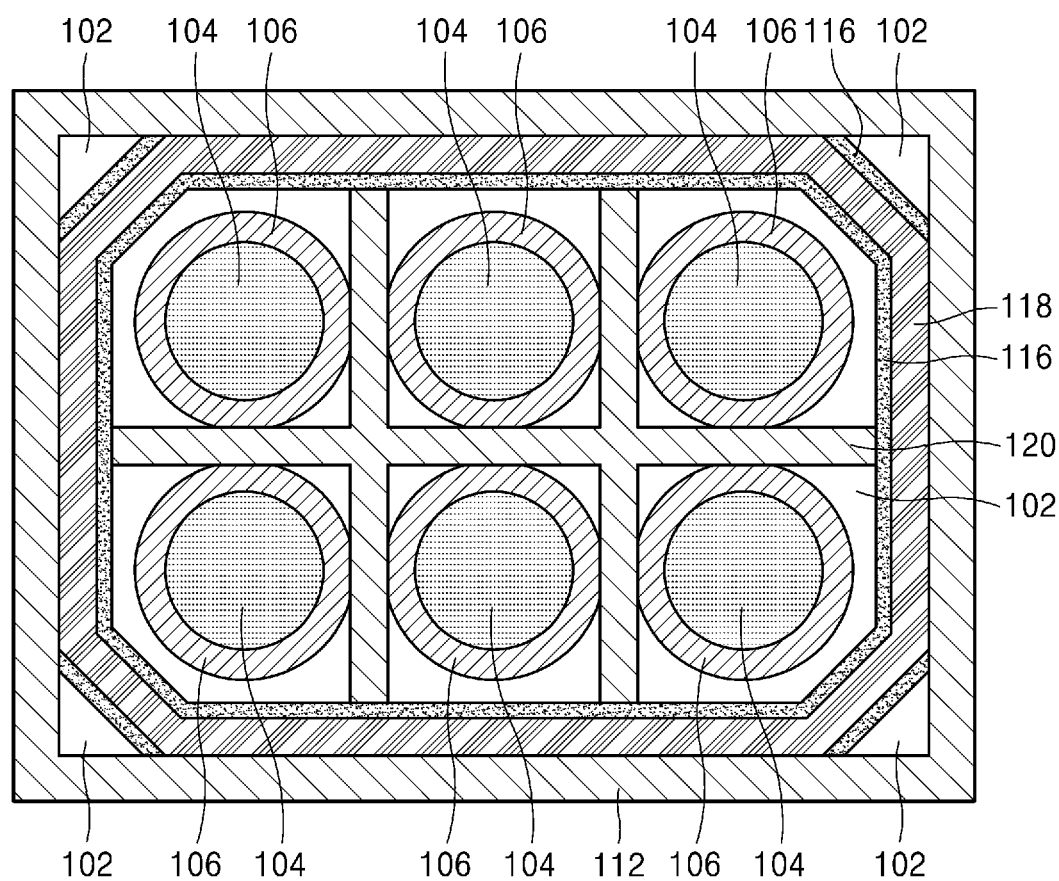
FIG. 13 is a plan view of a single-photon detection pixel having the cross-section of FIG. 12.

FIG. 13 is a plan view of a single-photon detection pixel 15a having the cross-section of FIG. 12. For brevity of description, descriptions substantially the same as those given with reference to FIGS. 11 and 12 may be omitted.

Referring to FIG. 13, the single-photon detection pixel 15a may be provided. Unlike the single-photon detection pixel 15 described with reference to FIGS. 11 and 12, the single-photon detection pixel 15a may include a second buffer region 116 and a second contact 118 each having a single octagonal ring shape.

An embodiment of the disclosure may provide the single-photon detection pixel 15a that is miniaturized or has a high fill factor.

Figure 14:
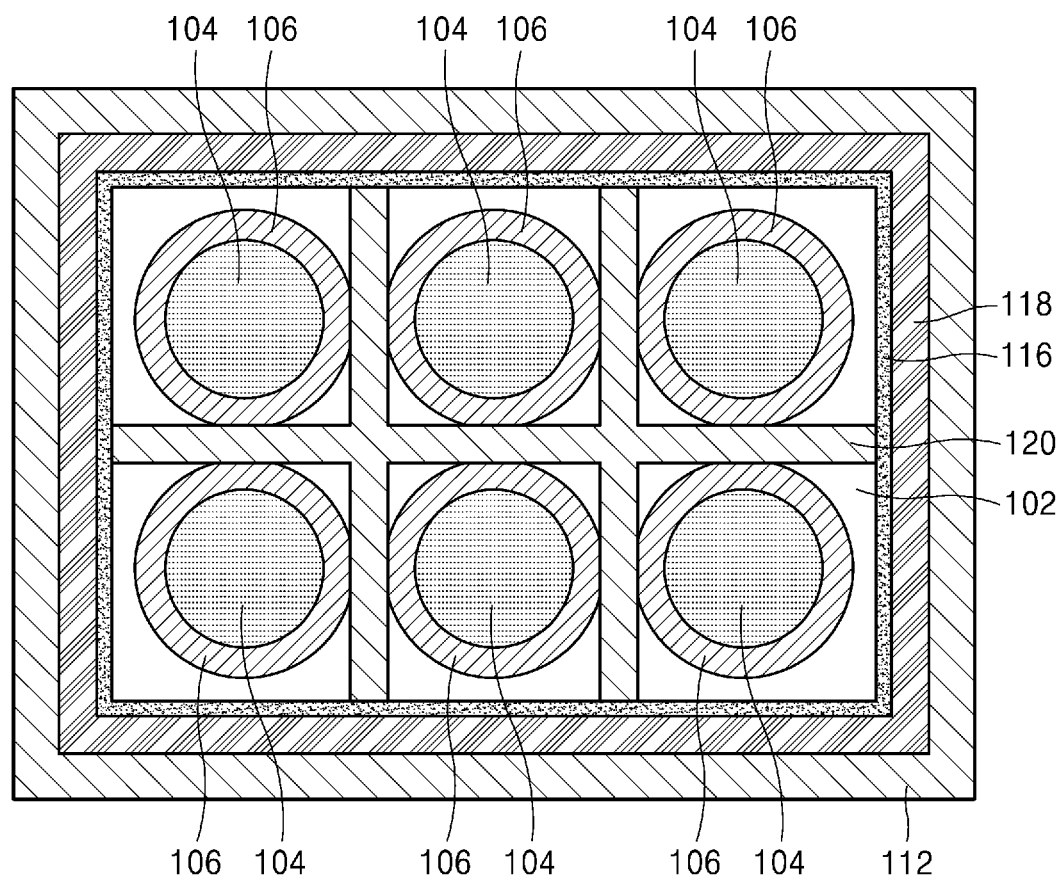
FIG. 14 is a plan view of a single-photon detection pixel having the cross-section of FIG. 12.

FIG. 14 is a plan view of a single-photon detection pixel 15b having the cross-section of FIG. 12. For brevity of description, descriptions substantially the same as those given with reference to FIGS. 11 and 12 may be omitted.

Referring to FIG. 14, the single-photon detection pixel 15b may be provided. Unlike the single-photon detection pixel 15 described with reference to FIGS. 11 and 12, the single-photon detection pixel 15b may include a second buffer region 116 and a second contact 118 each having a single quadrangular ring shape. The shapes of the second buffer region 116 and the second contact 118 are just examples and not restrictive. That is, the second buffer region 116 and the second contact 118 may each have a shape other than a circular ring shape, an octagonal ring shape, and a quadrangular ring shape.

An embodiment of the disclosure may provide the single-photon detection pixel 15b that is miniaturized or has a high fill factor.

Figure 15:
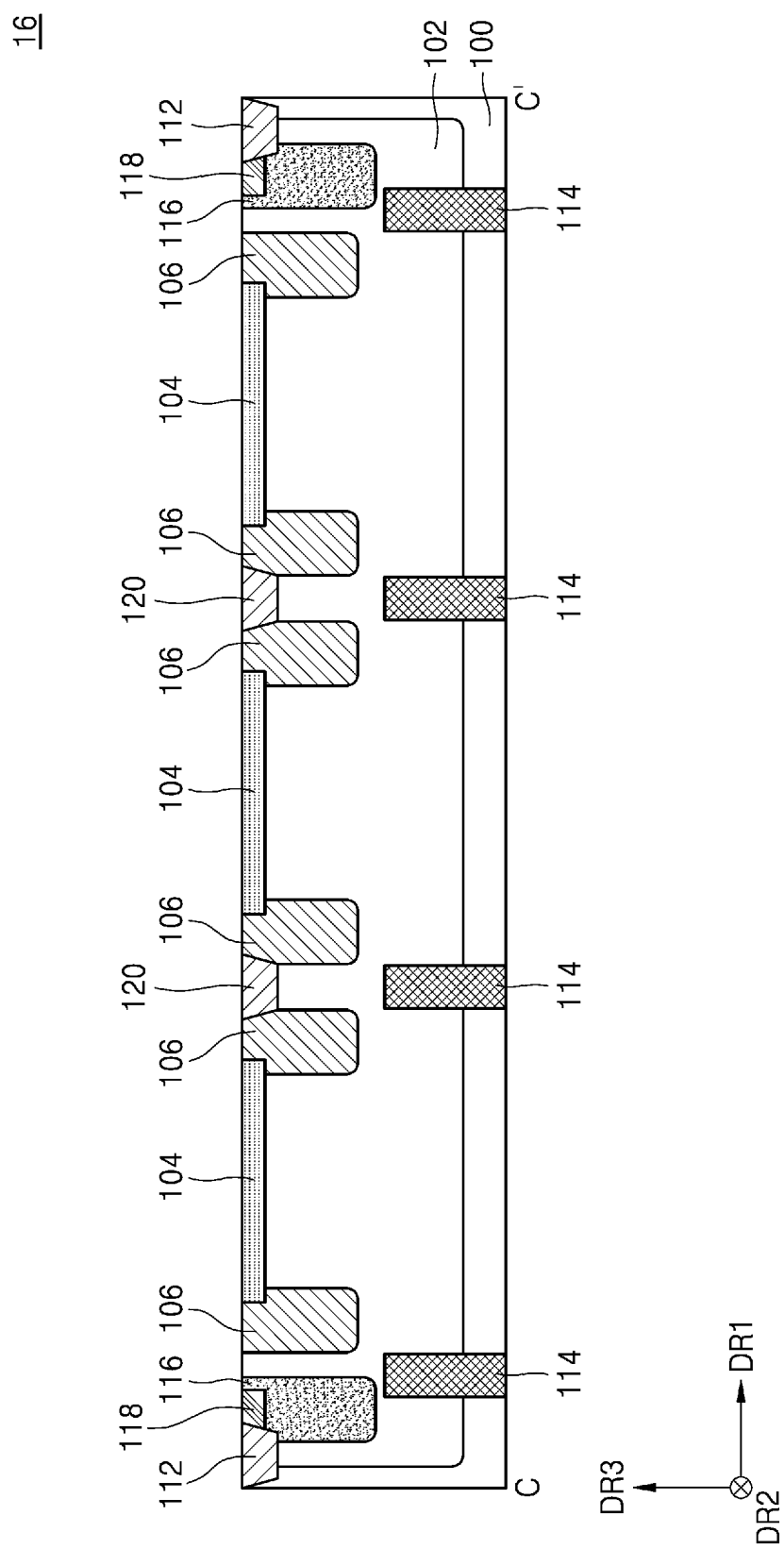
FIG. 15 is a cross-sectional view of a single-photon detection pixel according to an embodiment, the cross-sectional view corresponding to line C-C' of FIG. 11.

FIG. 15 is a cross-sectional view of a single-photon detection pixel 16 according to an embodiment, the cross-sectional view corresponding to line C-C' of FIG. 11. For brevity of description, descriptions substantially the same as those given with reference to FIGS. 11 and 12 may be omitted.

Referring to FIG. 15, the single-photon detection pixel 16 may be provided. The single-photon detection pixel 16 has substantially the same configuration as the single-photon detection pixel 15 described with reference to FIGS. 11 and 12, but may further include a first additional isolation region 114.

The first additional isolation region 114 may be provided between first guard rings 106. The first additional isolation region 114 may overlap a second additional isolation region 120 in the third direction DR3. For example, the first additional isolation region 114 may be provided below the second additional isolation region 120. The first additional isolation region 114 may extend in the third direction DR3, penetrate a substrate 100, and be inserted into a first well 102. The first additional isolation region 114 may be apart from the second additional isolation region 120 and the first guard rings 106. For example, the top surface of the first additional isolation region 114 may be disposed further away from the top surface of the single-photon detection pixel 16 than the bottom surfaces of the second additional isolation region 120 and the first guard rings 106. The first additional isolation region 114 may include an insulating material. The first additional isolation region 114 may include silicon oxide (e.g., $SiO_2$), silicon nitride (e.g., SiN), silicon oxynitride (e.g., SiON), polycrystalline silicon, a low-k dielectric material, a metal, or a combination thereof. The first additional isolation region 114 may be a DTI or an MTI.

The first additional isolation region 114 may mitigate or prevent crosstalk between single-photon detection elements. An embodiment of the disclosure may provide the single-photon detection pixel 16 with improved reliability.

In another embodiment, the first well 102, the second contact 118, and the second buffer region 116 may each have a first conductivity type, and the heavily doped region 104 and the first guard ring 106 may each have a second conductivity type.

Figure 16:
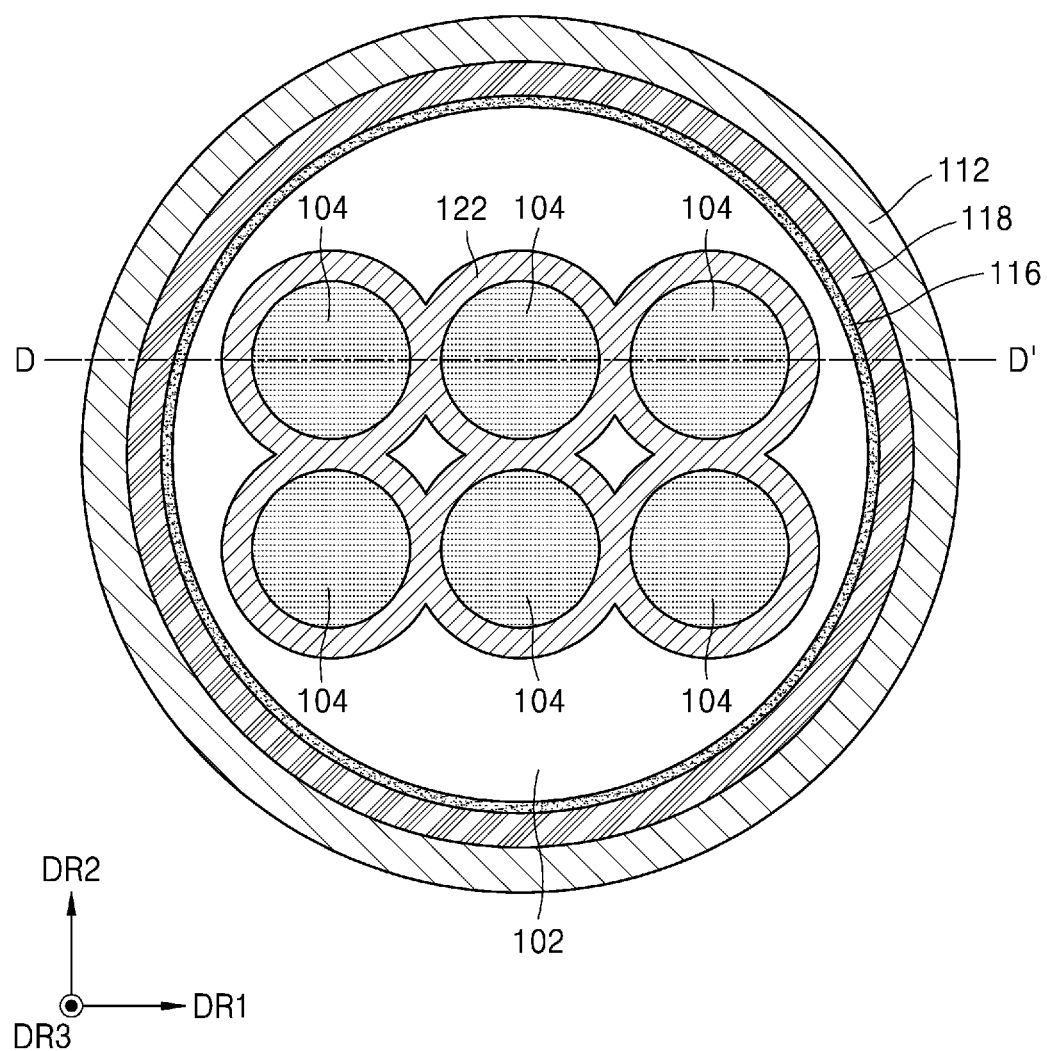
FIG. 16 is a plan view of a single-photon detection pixel according to an embodiment.
Figure 17:
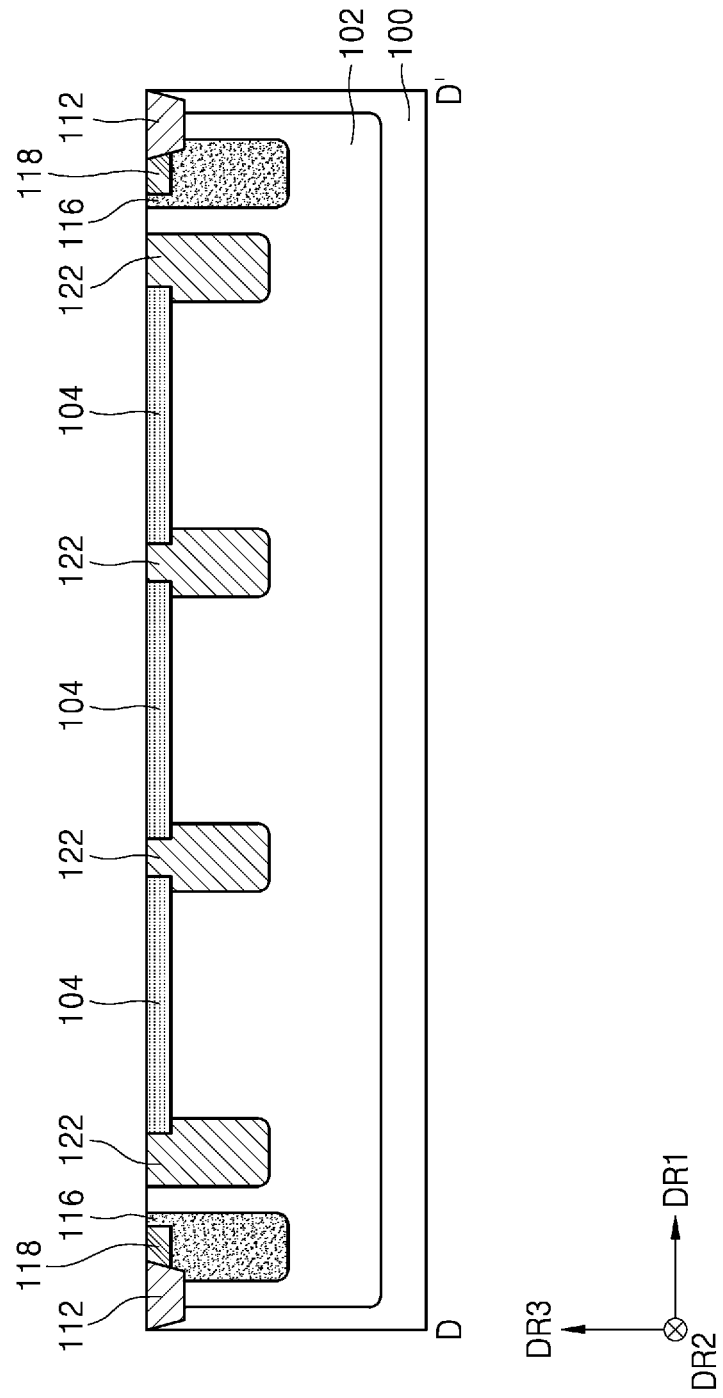
FIG. 17 is a cross-sectional view of the single-photon detection pixel taken along line D-D' of FIG. 16.

FIG. 16 is a plan view of a single-photon detection pixel 17 according to an embodiment. FIG. 17 is a cross-sectional view of the single-photon detection pixel 17 taken along line D-D' of FIG. 16. For brevity of description, descriptions substantially the same as those given with reference to FIGS. 6 and 7 may be omitted.

Referring to FIGS. 16 and 17, the single-photon detection pixel 17 may be provided. The single-photon detection pixel 17 may not include the first guard rings 106, unlike the single-photon detection pixel 13 described with reference to FIGS. 6 and 7. The single-photon detection pixel 17 may include a second guard ring 122. The second guard ring 122 may be substantially the same as the first guard rings 106 except for its shape and location.

The second guard ring 122 may surround heavily doped regions 104. The second guard ring 122 may have a plurality of ring shapes extending along the heavily doped regions 104 and connected to each other. The heavily doped regions 104 may be respectively arranged in the plurality of ring shapes. The second guard ring 122 may directly contact the heavily doped regions 104 immediately adjacent to each other. The second guard ring 122 may partially overlap the heavily doped regions 104 in the third direction DR3. In another example, the second guard ring 122 may be apart from the heavily doped regions 104.

A region required for disposing the second guard rings 122 may be smaller than a region required for disposing the first guard rings 106. Accordingly, an embodiment of the disclosure may provide the single-photon detection pixel 17 that is miniaturized or has a high fill factor.

In another embodiment, the first well 102, the second contact 118, and the second buffer region 116 may each have a first conductivity type, and the heavily doped region 104 and the second guard ring 122 may each have a second conductivity type.

FIG. 18 is a plan view of a single-photon detection pixel 17a having the cross-section of FIG. 17. For brevity of description, descriptions substantially the same as those given with reference to FIGS. 16 and 17 may be omitted.

Referring to FIG. 18, the single-photon detection pixel 17a may be provided. Unlike the single-photon detection pixel 17 described with reference to FIGS. 16 and 17, the single-photon detection pixel 17a may include a second buffer region 116 and a second contact 118 each having a single octagonal ring shape.

An embodiment of the disclosure may provide the single-photon detection pixel 17a that is miniaturized or has a high fill factor.

Figure 19:
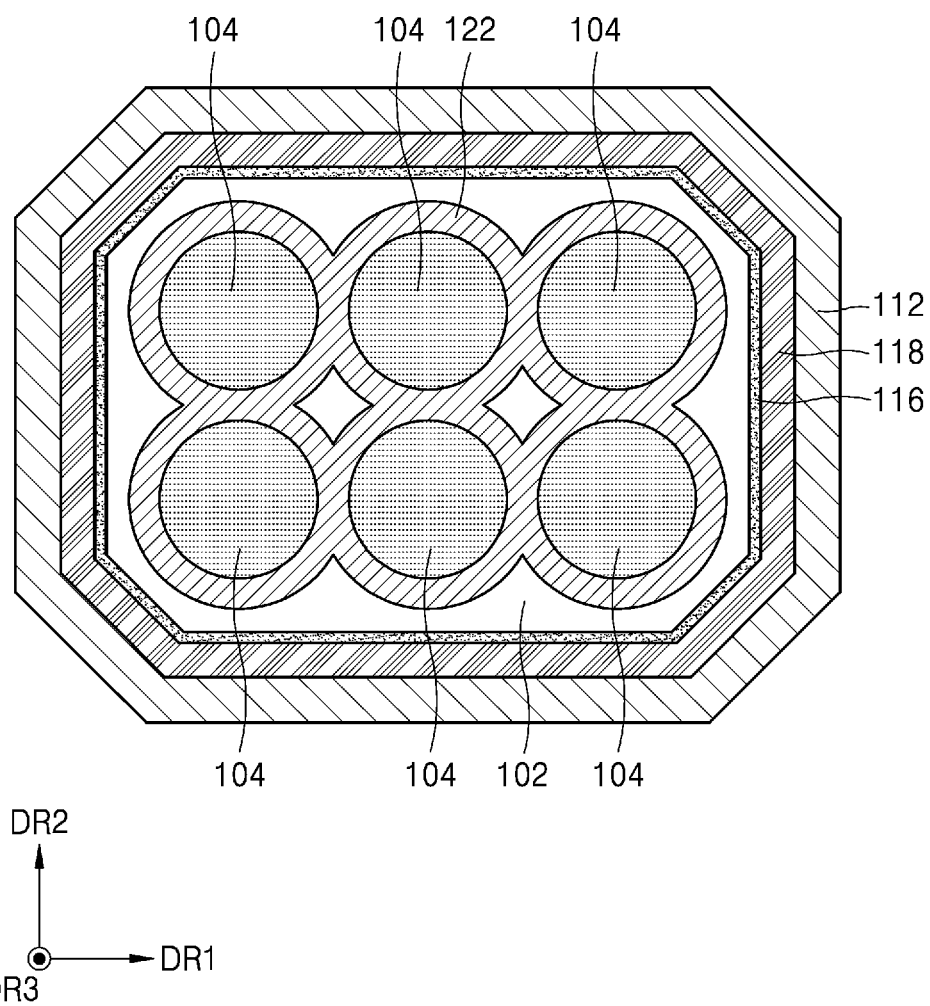
FIG. 19 is a plan view of a single-photon detection pixel having the cross-section of FIG. 18.

FIG. 19 is a plan view of a single-photon detection pixel 17b having the cross-section of FIG. 18. For brevity of description, descriptions substantially the same as those given with reference to FIGS. 16 and 17 may be omitted.

Referring to FIG. 19, the single-photon detection pixel 17b may be provided. Unlike the single-photon detection pixel 17 described with reference to FIGS. 16 and 17, the single-photon detection pixel 17b may include a second buffer region 116 and a second contact 118 each having a single quadrangular ring shape. The shapes of the second buffer region 116 and the second contact 118 are just examples and not restrictive. That is, the second buffer region 116 and the second contact 118 may each have a shape other than a circular ring shape, an octagonal ring shape, and a quadrangular ring shape.

An embodiment of the disclosure may provide the single-photon detection pixel 17b that is miniaturized or has a high fill factor.

Figure 20:
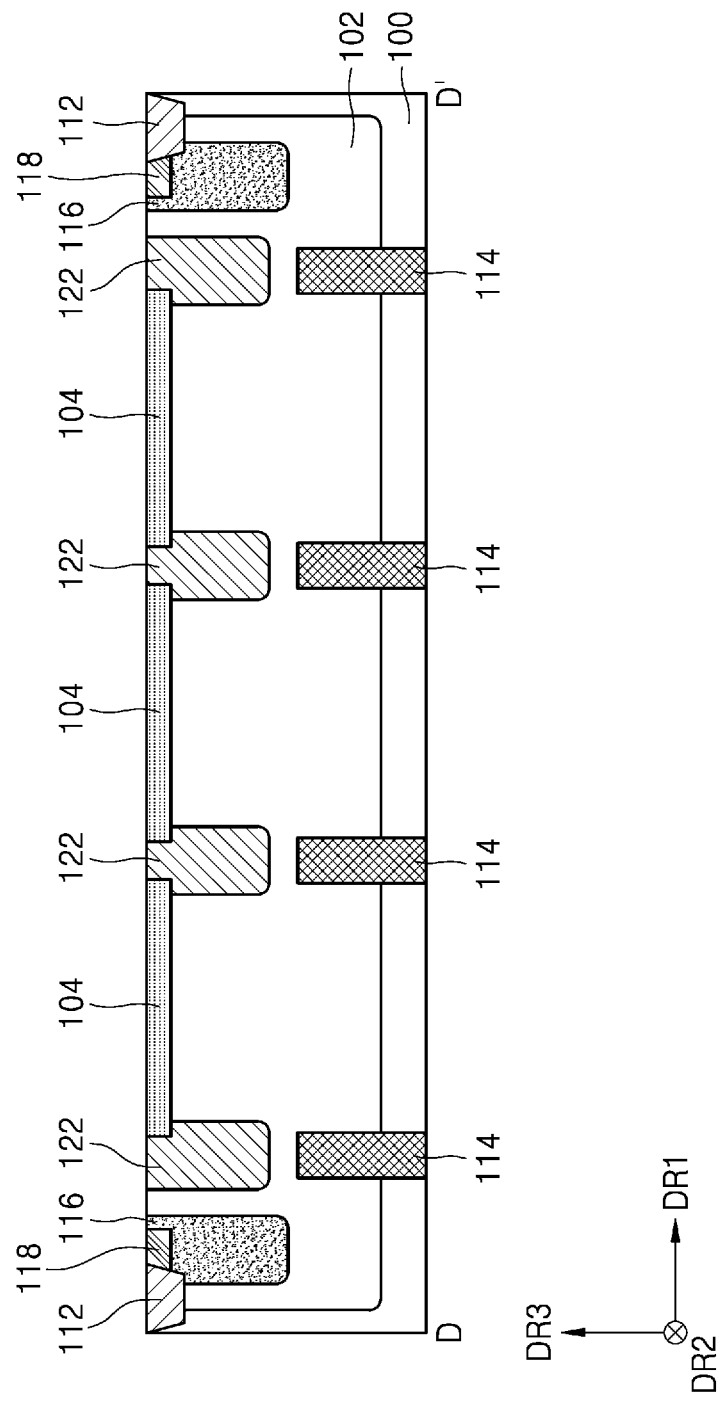
FIG. 20 is a cross-sectional view of a single-photon detection pixel according to an embodiment, the cross-sectional view corresponding to line D-D' of FIG. 16.

FIG. 20 is a cross-sectional view of a single-photon detection pixel 18 according to an embodiment, the cross-sectional view corresponding to line D-D' of FIG. 16. For brevity of description, descriptions substantially the same as those given with reference to FIGS. 16 and 17 may be omitted.

Referring to FIG. 20, the single-photon detection pixel 18 may be provided. The single-photon detection pixel 18 has substantially the same configuration as the single-photon detection pixel 17 described with reference to FIGS. 16 and 17, but may further include a first additional isolation region 114.

The first additional isolation region 114 may overlap a second guard ring 122 in the third direction DR3. For example, the first additional isolation region 114 may be provided below the second guard ring 122. The first additional isolation region 114 may be apart from the second guard ring 122 in the third direction DR3. The first additional isolation region 114 may extend in the third direction DR3, penetrate a substrate 100, and be inserted into a first well 102. The first additional isolation region 114 may include an insulating material. The first additional isolation region 114 may include silicon oxide (e.g., $SiO_2$), silicon nitride (e.g., SiN), silicon oxynitride (e.g., SiON), polycrystalline silicon, a low-k dielectric material, a metal, or a combination thereof. The first additional isolation region 114 may be a DTI or an MTI.

The first additional isolation region 114 may mitigate or prevent crosstalk between single-photon detection elements. An embodiment of the disclosure may provide the single-photon detection pixel 18 with improved reliability.

In another embodiment, the first well 102, the second contact 118, and the second buffer region 116 may each have a first conductivity type, and the heavily doped region 104 and the second guard ring 122 may each have a second conductivity type.

Figure 21:
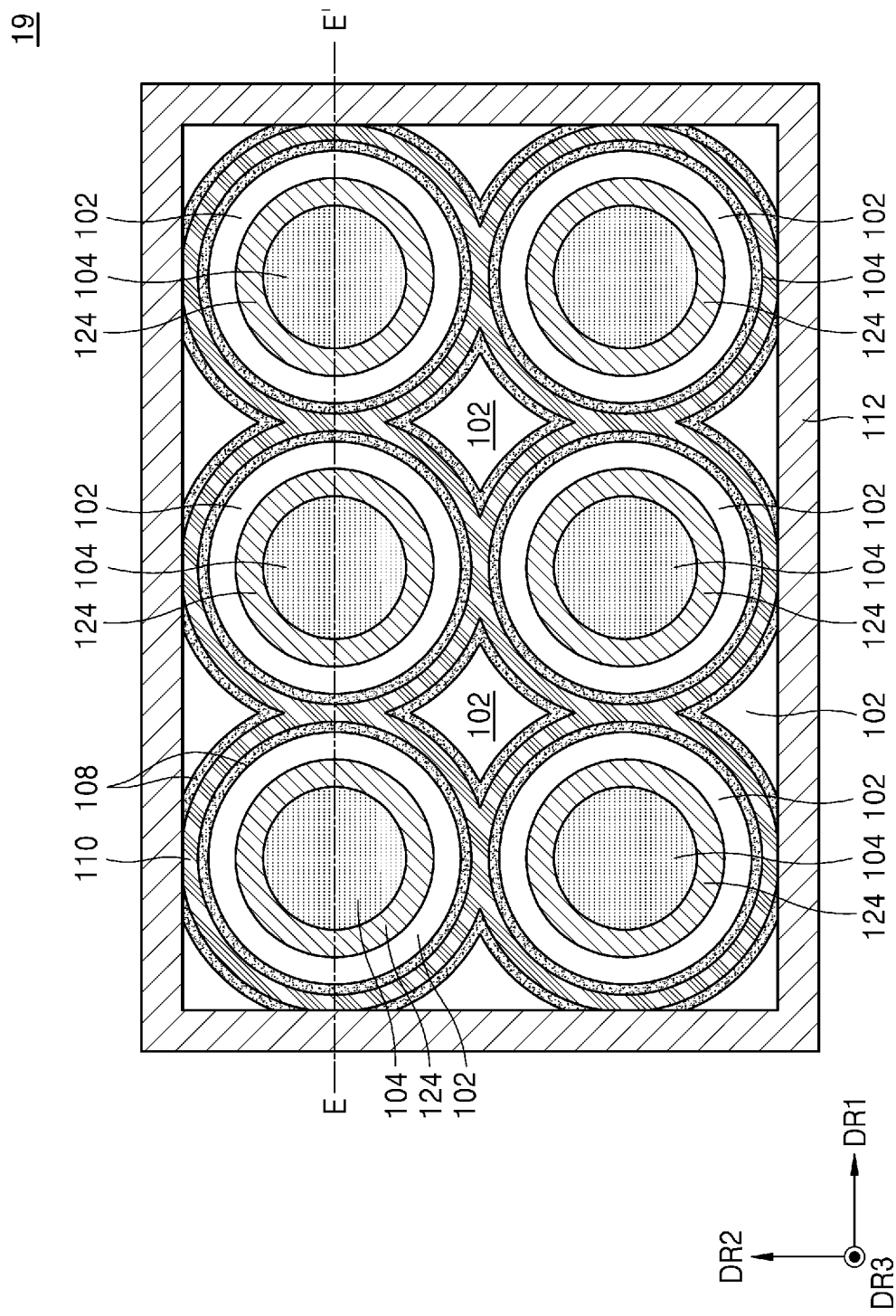
FIG. 21 is a plan view of a single-photon detection pixel according to an embodiment.
Figure 22:
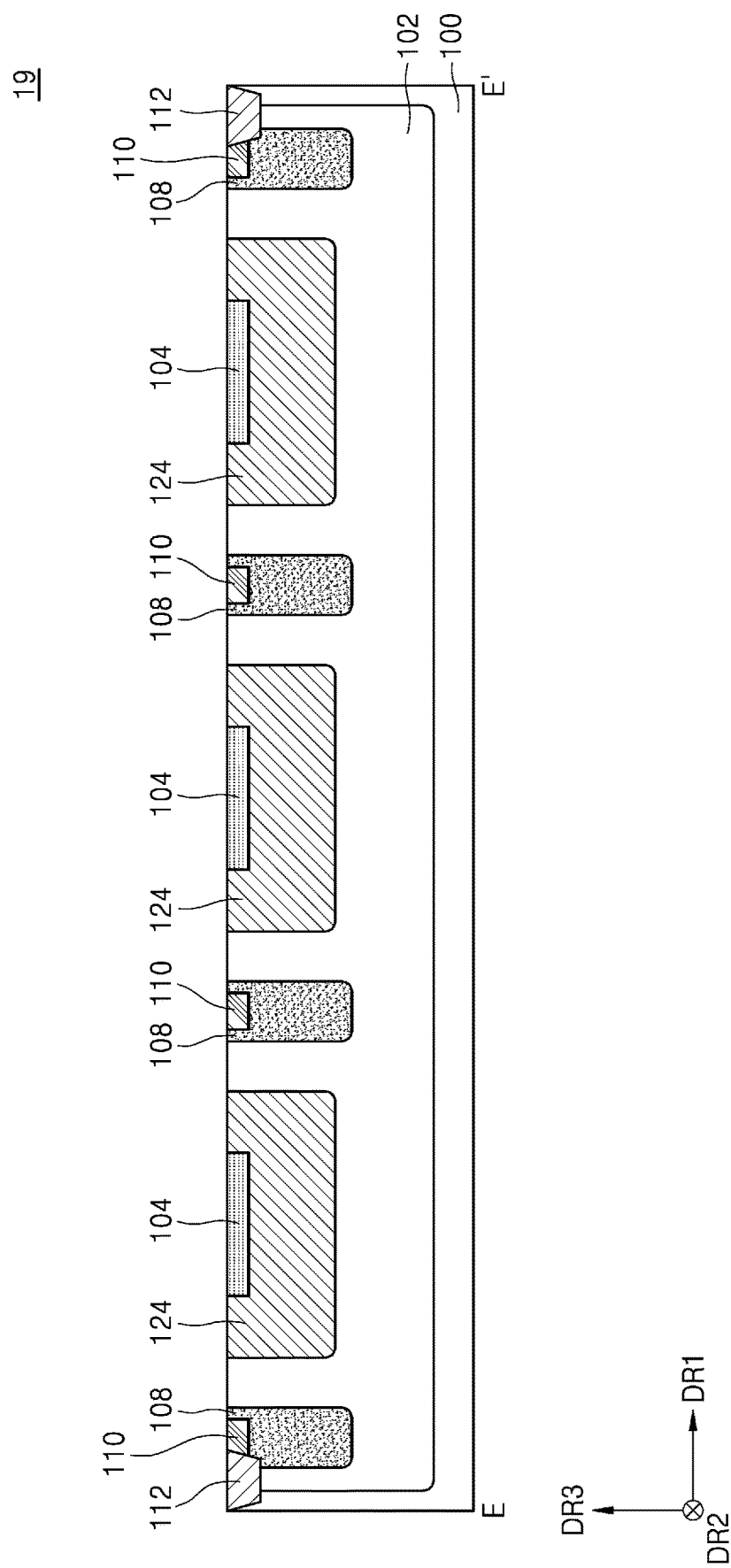
FIG. 22 is a cross-sectional view of the single-photon detection pixel taken along line E-E' of FIG. 21.

FIG. 21 is a plan view of a single-photon detection pixel 19 according to an embodiment. FIG. 22 is a cross-sectional view of the single-photon detection pixel 19 taken along line E-E' of FIG. 21 For brevity of description, descriptions substantially the same as those given with reference to FIGS. 1 and 2 may be omitted.

Referring to FIGS. 21 and 22, the single-photon detection pixel 19 may be provided. The single-photon detection pixel 19 may not include the first guard rings 106, unlike the single-photon detection pixel 11 described with reference to FIGS. 1 and 2. The single-photon detection pixel 19 may include second wells 124. For brevity of description, one second well 124 is described. The second well 124 may be provided between a heavily doped region 104 and a first well 102. The heavily doped region 104 and the first well 102 may be apart from each other by the second well 124. The second well 124 may directly contact the heavily doped region 104 and the first well 102. The heavily doped region 104 and the second well 124 may each have a first conductivity type. For example, the doping concentration of the second well 124 may be lower than the doping concentration of the heavily doped region 104. For example, the doping concentration of the second well 124 may be about $1\times10^{15}$ $cm^{-3}$ to about $1\times10^{18}$ $cm^{-3}$.

A depletion region (i.e., a multiplication region) may be formed in a region adjacent to the interface between the first well 102 and the second well 124. When a reverse bias is applied to a single-photon detection element, a strong electric field may be formed in the depletion region. For example, when the single-photon detection element operates as a SPAD, the maximum intensity of the electric field may be about $1\times10^5$ V/cm to about $1\times10^6$ V/cm. Electrons may be multiplied by the electric field in the depletion region.

The second well 124 may be apart from a first buffer region 108. A first well 102 may be provided between the second well 124 and the first buffer region 108. The first well 102 between the second well 124 and the first buffer region 108 may have a guard ring function. For example, the first well 102 between the second well 124 and the first buffer region 108 may be referred to as a virtual guard ring. When the first well 102 has a doping concentration that decreases closer to the top surface of the single-photon detection pixel 19, the guard ring function of the first well 102 between the second well 124 and the first buffer region 108 may be strengthened.

In an embodiment of the disclosure, because the single-photon detection elements share the first buffer region 108 and a first contact 110, a single-photon detection pixel 19 having a small size or a high fill factor compared to the case where each of the single-photon detection elements has the first buffer region 108 and the first contact 110 separately (i.e., the case where the first buffer region 108 and the first contact 110 are not shared) may be provided.

In another exemplary embodiment, the first well 102, the first buffer region 108, and the first contact 110 may each have a first conductivity type, and the heavily doped region 104 and the second well 124 may each have a second conductivity type.

Figure 23:
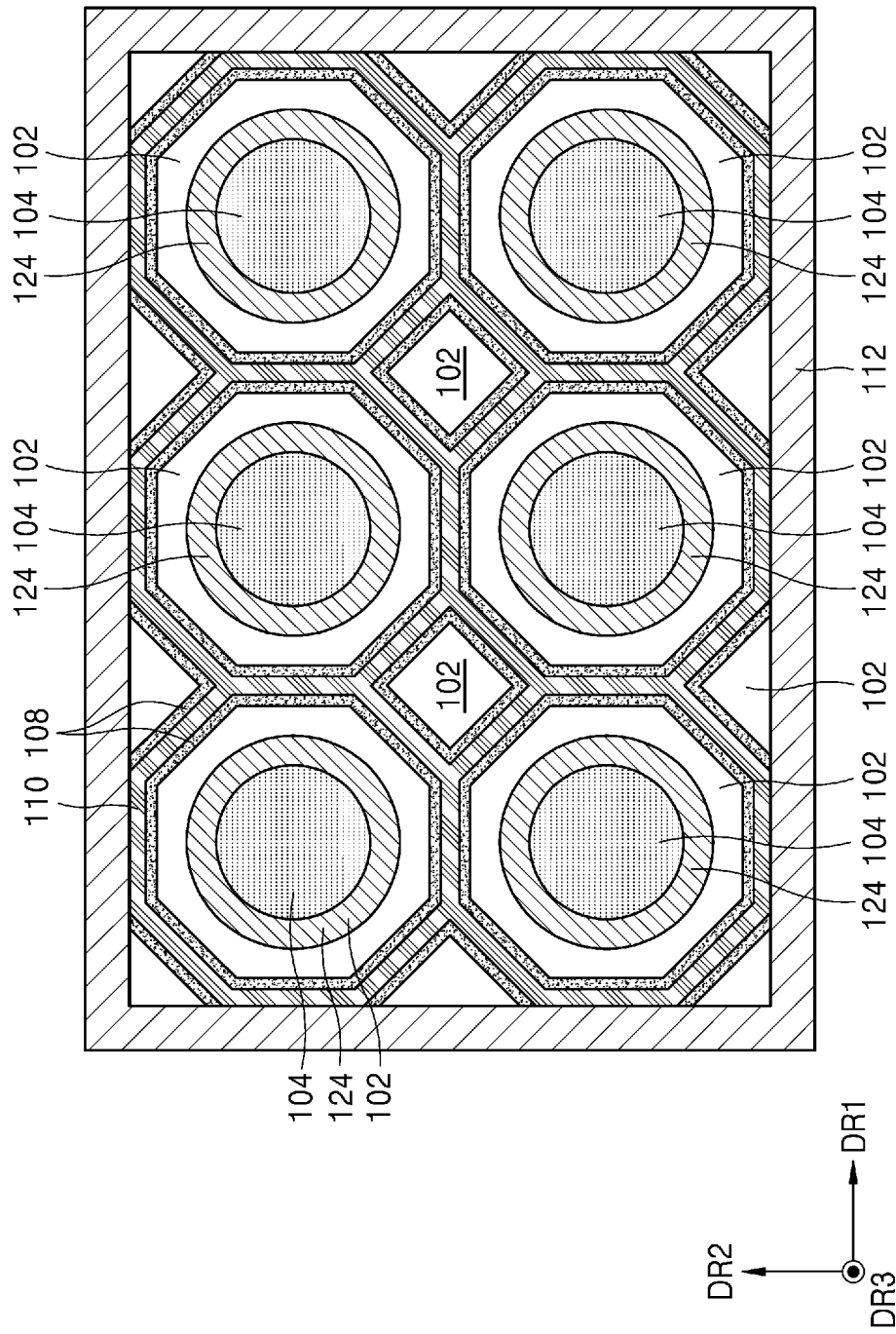
FIG. 23 is a plan view of a single-photon detection pixel having the cross-section of FIG. 22.

FIG. 23 is a plan view of a single-photon detection pixel 19a having the cross-section of FIG. 22. For brevity of description, descriptions substantially the same as those given with reference to FIGS. 21 and 22 may be omitted.

Referring to FIG. 23, the single-photon detection pixel 19a may be provided. Unlike the single-photon detection pixel 19 described with reference to FIGS. 21 and 22, the single-photon detection pixel 19a may include a first buffer region 108 and a first contact 108, respectively configured to have a plurality of octagonal ring shapes connected to each other.

An embodiment of the disclosure may provide the single-photon detection pixel 19a that is miniaturized or has a high fill factor.

Figure 24:
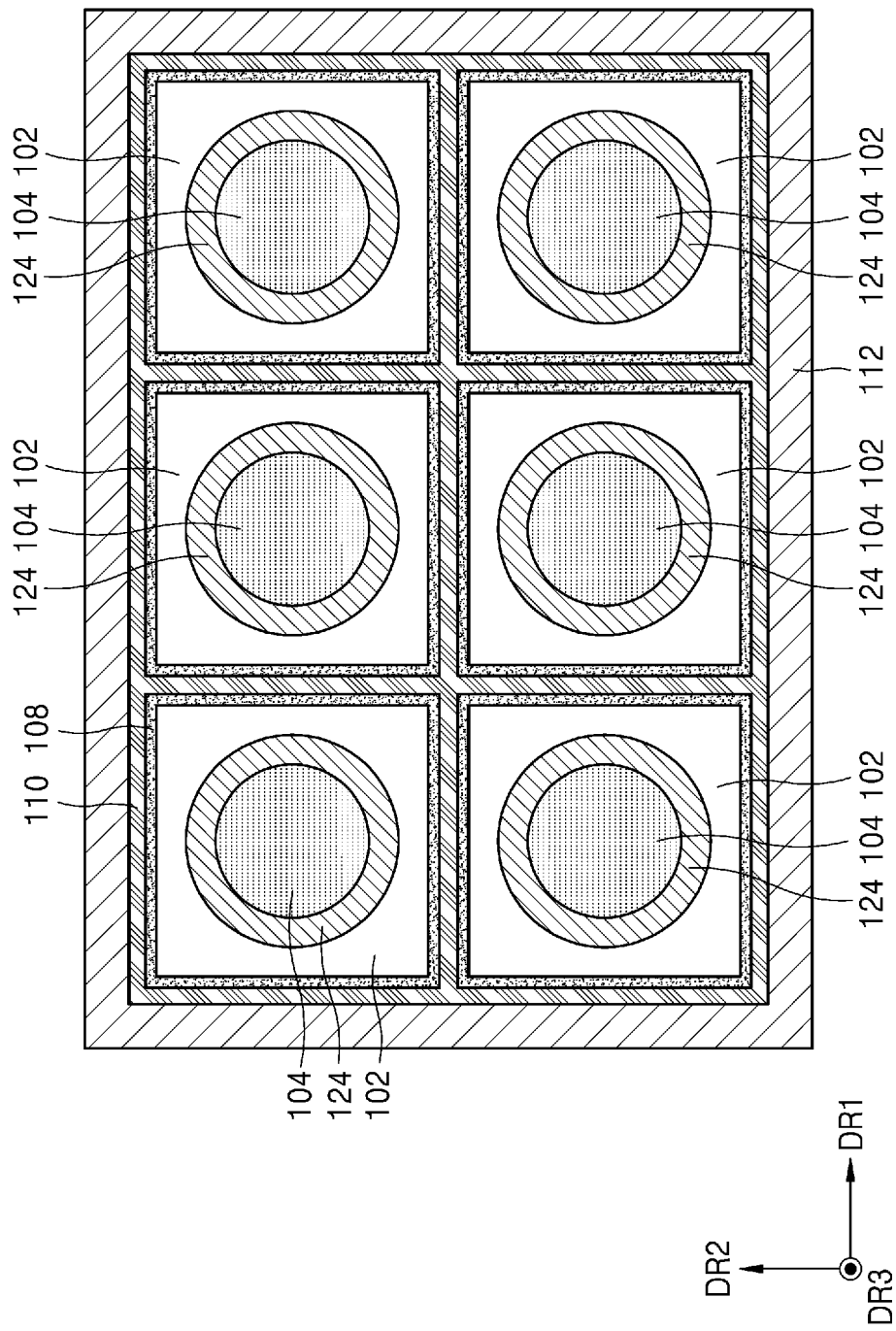
FIG. 24 is a plan view of a single-photon detection pixel having the cross-section of FIG. 22.

FIG. 24 is a plan view of a single-photon detection pixel 19b having the cross-section of FIG. 22. For brevity of description, descriptions substantially the same as those given with reference to FIGS. 21 and 22 may be omitted.

Referring to FIG. 24, the single-photon detection pixel 19b may be provided. Unlike the single-photon detection pixel 19 described with reference to FIGS. 21 and 22, the single-photon detection pixel 19b may include a first buffer region 108 and a first contact 110, respectively configured to have a plurality of quadrangular ring shapes connected to each other. The shapes of the first buffer region 108 and the first contact 110 are just non-restrictive examples. That is, the first buffer region 108 and the first contact 110 may have shapes other than a circular ring shape, an octagonal ring shape, and a quadrangular ring shape.

An embodiment of the disclosure may provide the single-photon detection pixel 19b that is miniaturized or has a high fill factor.

Figure 25:
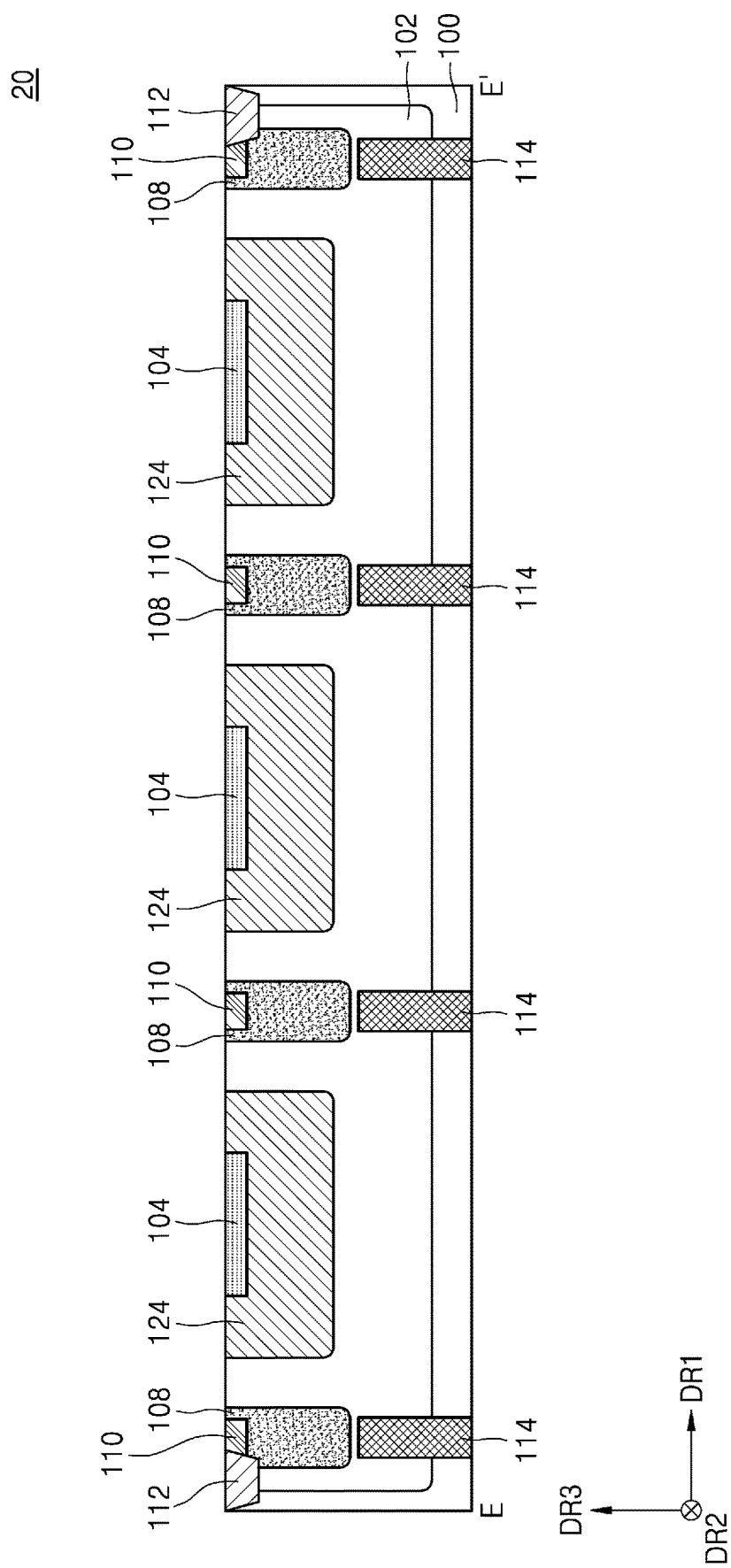
FIG. 25 is a cross-sectional view of a single-photon detection pixel according to an embodiment, the cross-sectional view corresponding to line E-E' of FIG. 21.

FIG. 25 is a cross-sectional view of a single-photon detection pixel 20 according to an embodiment, the cross-sectional view corresponding to line E-E' of FIG. 21. For brevity of description, descriptions substantially the same as those given with reference to FIGS. 21 and 22 may be omitted.

Referring to FIG. 25, the single-photon detection pixel 20 may be provided. The single-photon detection pixel 20 has substantially the same configuration as the single-photon detection pixel 19 described with reference to FIGS. 21 and 22, but may further include a first additional isolation region 114.

The first additional isolation region 114 may overlap a first buffer region 108 in the third direction DR3. For example, the first additional isolation region 114 may be provided below the first buffer region 108. The first additional isolation region 114 may be apart from the first buffer region 108 in the third direction DR3. A first well 102 may be provided between the first additional isolation region 114 and the first buffer region 108. The first additional isolation region 114 may extend in the third direction DR3, penetrate a substrate 100, and be inserted into the first well 102. The first additional isolation region 114 may include an insulating material. The first additional isolation region 114 may include silicon oxide (e.g., SiO$_2$), silicon nitride (e.g., SiN), silicon oxynitride (e.g., SiON), polycrystalline silicon, a low-k dielectric material, a metal, or a combination thereof. The first additional isolation region 114 may be a DTI or an MTI.

The first additional isolation region 114 may mitigate or prevent crosstalk between single-photon detection elements. An embodiment of the disclosure may provide the single-photon detection pixel 20 with improved reliability.

In another exemplary embodiment, the first well 102, the first buffer region 108, and the first contact 110 may each have a first conductivity type, and the heavily doped region 104 and the second well 124 may each have a second conductivity type.

Figure 26:
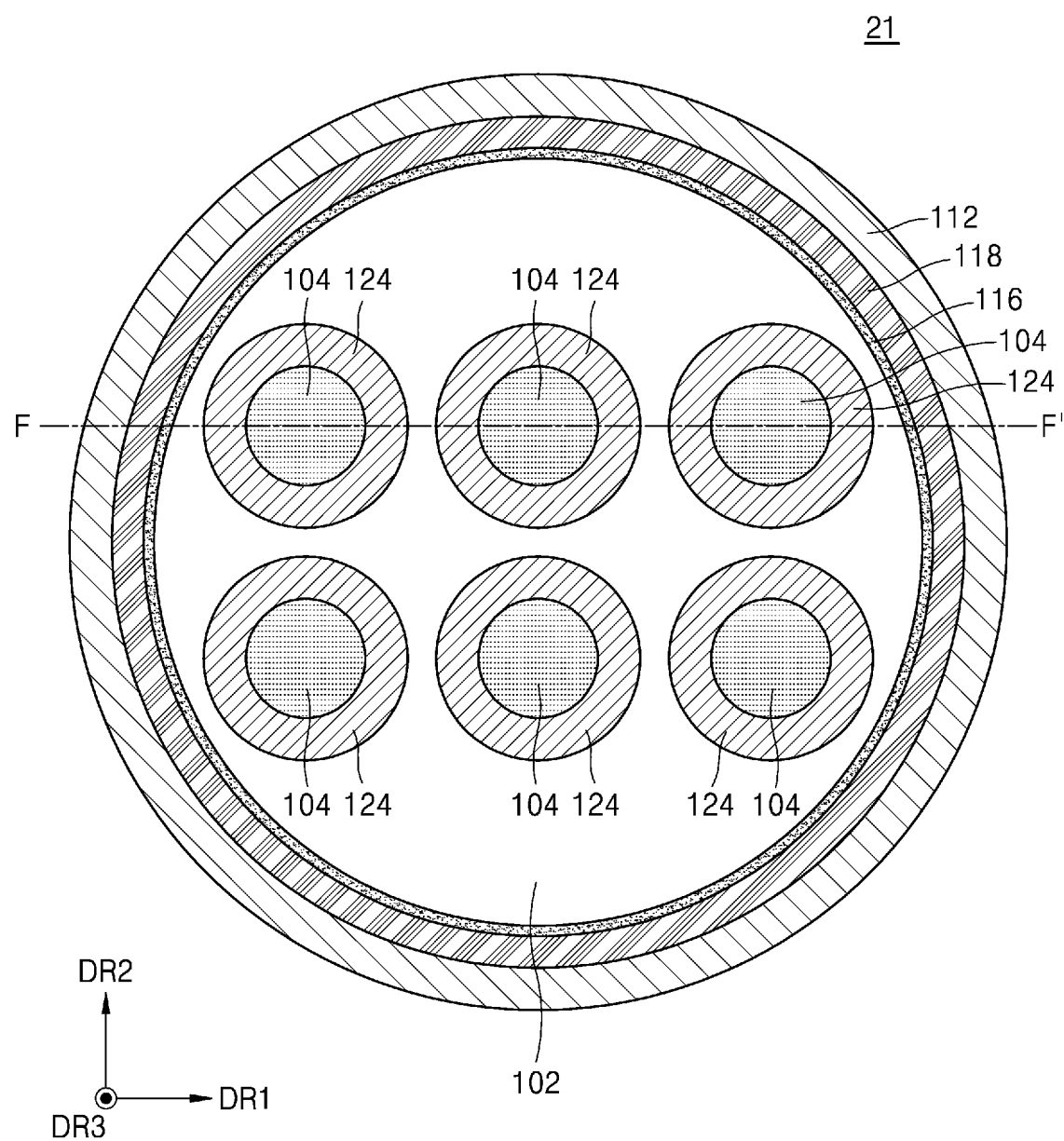
FIG. 26 is a plan view of a single-photon detection pixel according to an embodiment.
Figure 27:
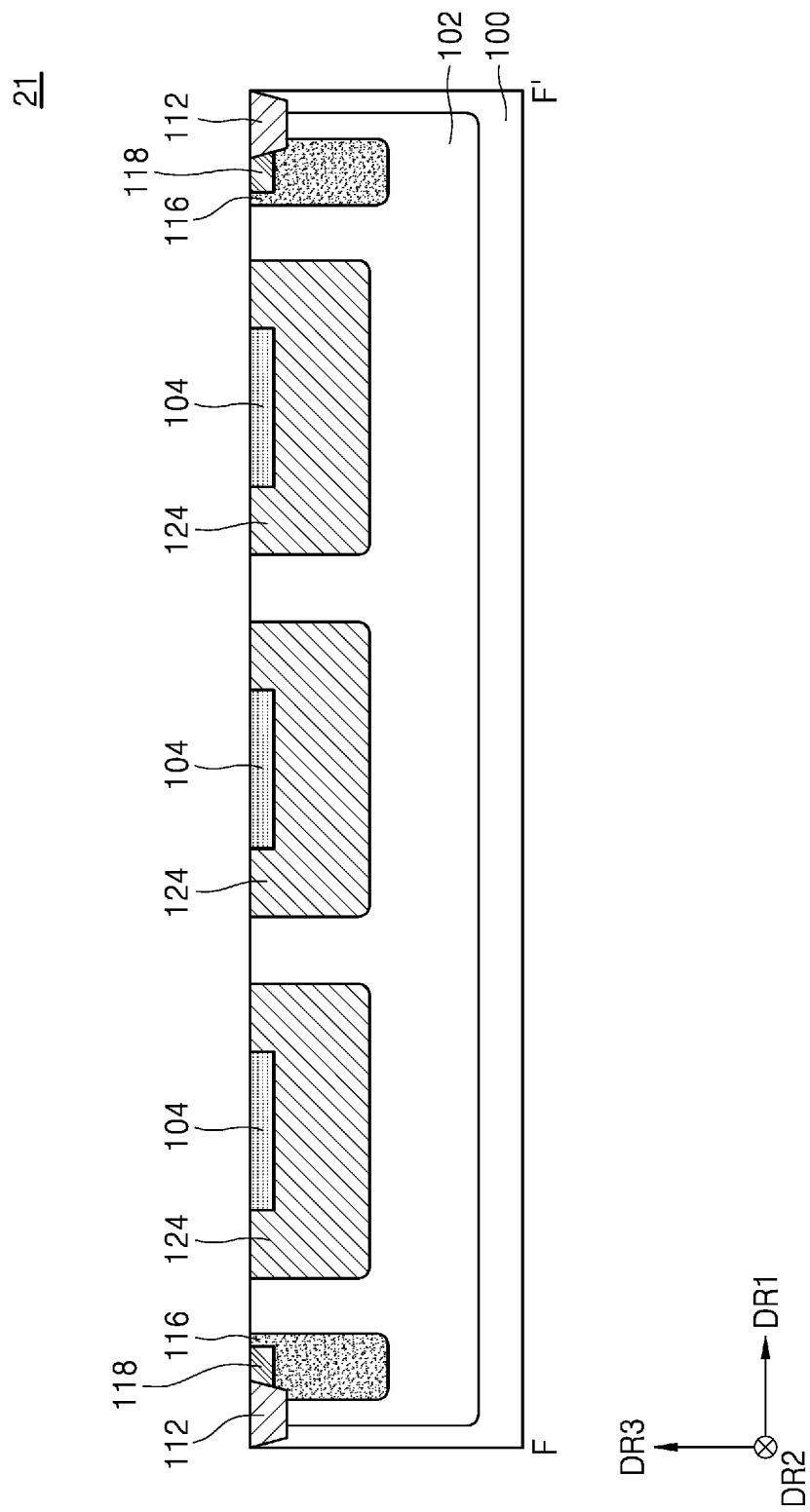
FIG. 27 is a cross-sectional view of the single-photon detection pixel taken along line F-F' of FIG. 26.

FIG. 26 is a plan view of a single-photon detection pixel 21 according to an embodiment. FIG. 27 is a cross-sectional view of the single-photon detection pixel 21 taken along line F-F' of FIG. 26. For brevity of description, descriptions substantially the same as those given with reference to FIGS. 21 and 22 may be omitted.

Referring to FIGS. 26 and 27, the single-photon detection pixel 21 may be provided. Unlike the single-photon detection pixel 19 described with reference to FIGS. 21 and 22, the single-photon detection pixel 21 may not include the first contact 110 and the first buffer region 108. The single-photon detection pixel 21 may include a second contact 118 and a second buffer region 116. The second contact 118 and the second buffer region 116 may be substantially the same as the first contact 110 and the first buffer region 108, respectively, except for their shape and location. The second contact 118 and the second buffer region 116 may each have a single ring shape. For example, the second contact 118 and the second buffer region 116 may each have a circular ring shape. Heavily doped regions 104 and second wells 124 may be arranged inside a ring shape formed by the second contact 118 and the second buffer region 116. The second wells 124 may be apart from each other. A first well 102 may be provided between the second wells 124. For example, a region between the second wells 124 may be filled with the first well 102.

Unlike the first contact 110 and the first buffer region 108, the second contact 118 and the second buffer region 116 may not be disposed between the second wells 124. Accordingly, an embodiment of the disclosure may provide the single-photon detection pixel 21 that is miniaturized or has a high fill factor.

In another exemplary embodiment, the first well 102, the second contact 118, and the second buffer region 116 may each have a first conductivity type, and the heavily doped region 104 and the second well 124 may each have a second conductivity type.

Figure 28:
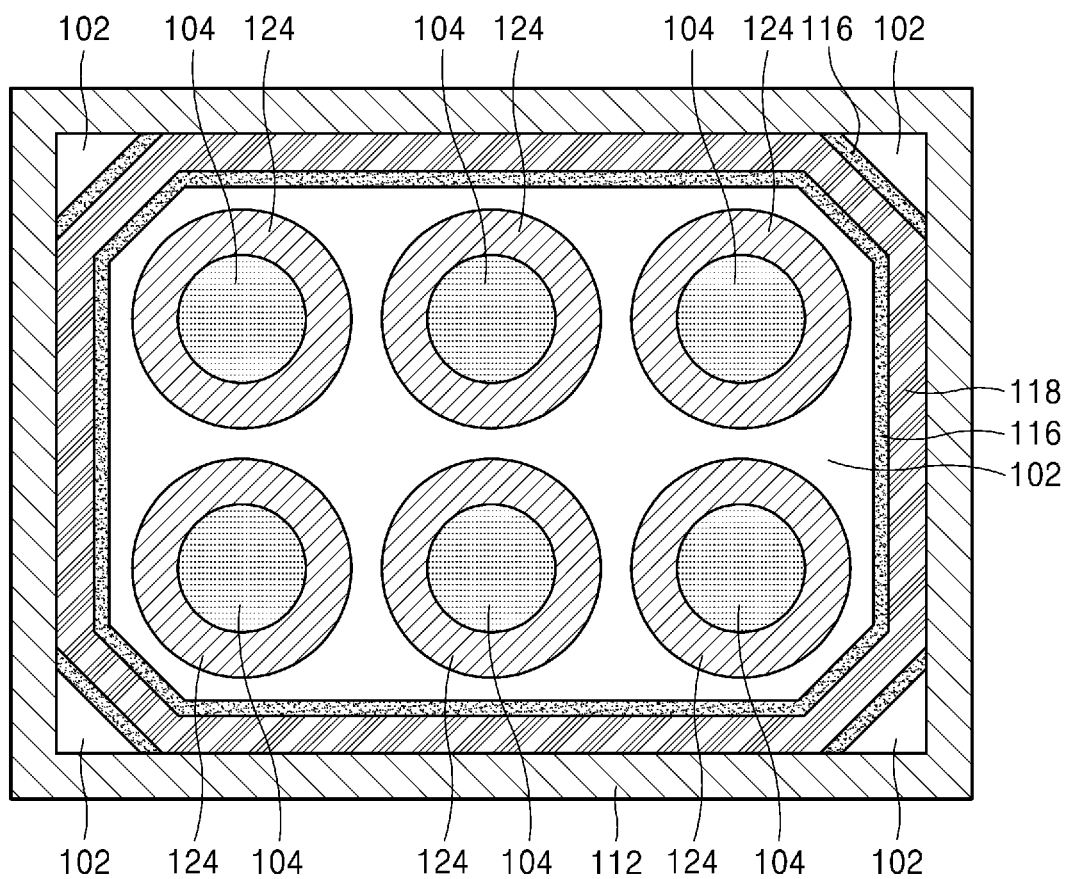
FIG. 28 is a plan view of a single-photon detection pixel having the cross-section of FIG. 27.

FIG. 28 is a plan view of a single-photon detection pixel 21a having the cross-section of FIG. 27. For brevity of description, descriptions substantially the same as those given with reference to FIGS. 26 and 27 may be omitted.

Referring to FIG. 28, the single-photon detection pixel 21a may be provided. Unlike the single-photon detection pixel 21 described with reference to FIGS. 26 and 27, the single-photon detection pixel 21a may include a second buffer region 116 and a second contact 118 having a single octagonal ring shape.

An embodiment of the disclosure may provide the single-photon detection pixel 21a that is miniaturized or has a high fill factor.

Figure 29:
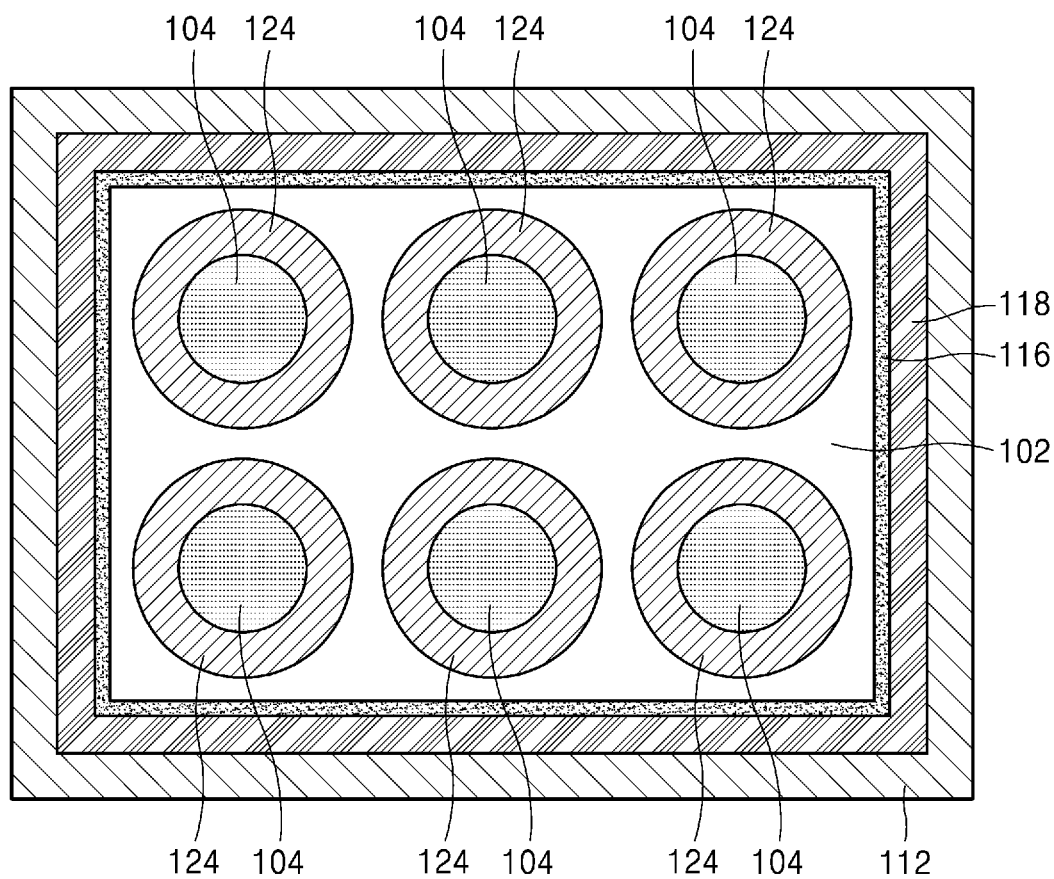
FIG. 29 is a plan view of a single-photon detection pixel having the cross-section of FIG. 27.

FIG. 29 is a plan view of a single-photon detection pixel 21b having the cross-section of FIG. 27. For brevity of description, descriptions substantially the same as those given with reference to FIGS. 26 and 27 may be omitted.

Referring to FIG. 29, the single-photon detection pixel 21b may be provided. Unlike the single-photon detection pixel 21 described with reference to FIGS. 26 and 27, the single-photon detection pixel 21b may include a second buffer region 116 and a second contact 118 each having a single quadrangular annular shape. The shapes of the second buffer region 116 and the second contact 118 are non-restrictive examples. That is, the second buffer region 116 and the second contact 118 may each have a shape other than a circular ring shape, an octagonal ring shape, and a quadrangular ring shape.

An embodiment of the present disclosure may provide the single-photon detection pixel 21b that is miniaturized or has a high fill factor.

Figure 30:
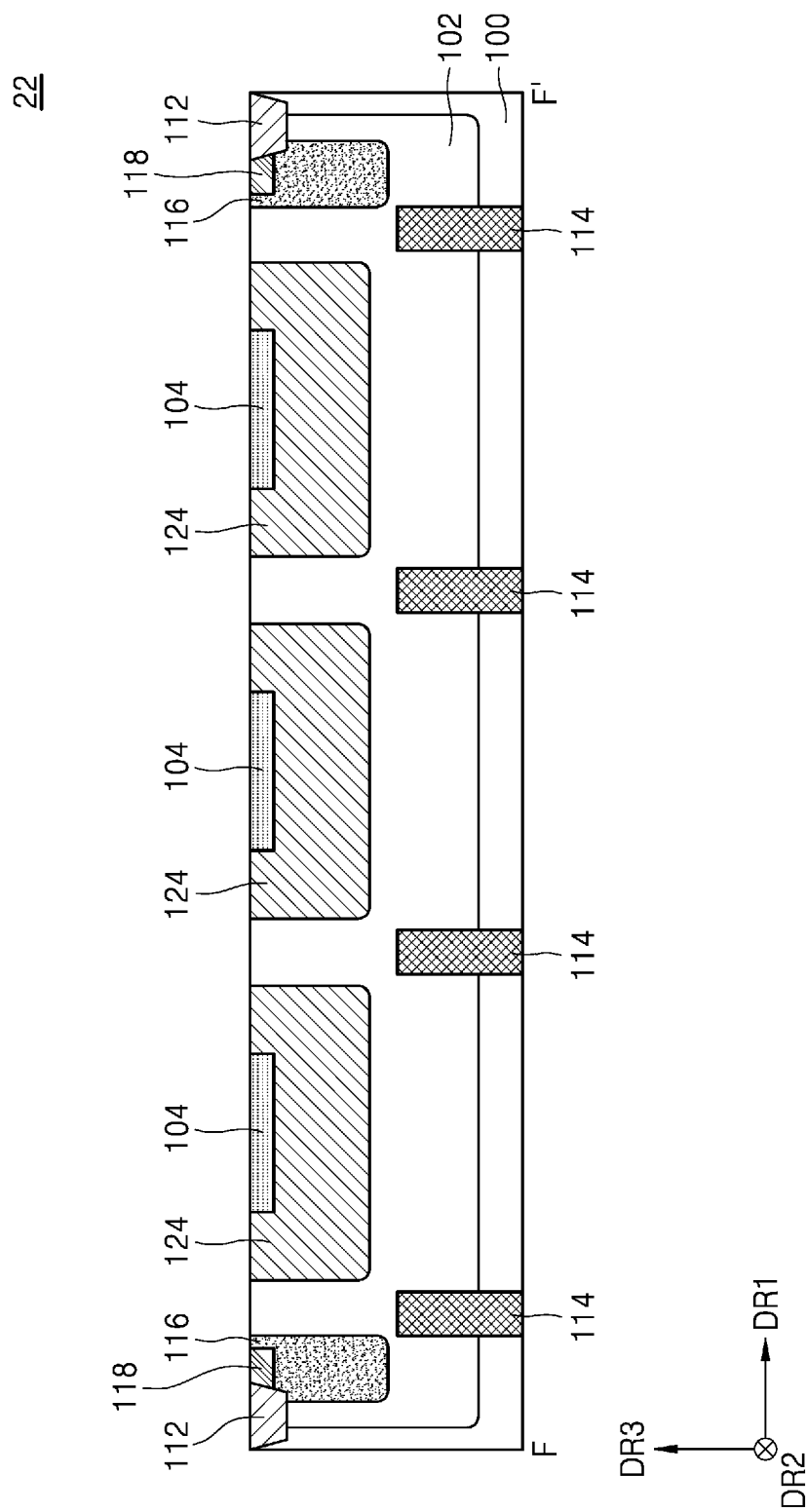
FIG. 30 is a cross-sectional view of a single-photon detection pixel according to an embodiment.

FIG. 30 is a cross-sectional view of a single-photon detection pixel 22 according to an embodiment. For brevity of description, descriptions substantially the same as those given with reference to FIGS. 26 and 27 may be omitted.

Referring to FIG. 30, the single-photon detection pixel 22 may be provided. The single-photon detection pixel 22 has substantially the same configuration as the single-photon detection pixel 21 described with reference to FIGS. 26 and 27, but may further include a first additional isolation region 114.

When viewed in the third direction DR3, the first additional isolation region 114 may be provided between second wells 124. The first additional isolation region 114 may be provided below a region between the second wells 124. The first additional isolation region 114 may extend in the third direction DR3, penetrate a substrate 100, and be inserted into a first well 102. The first additional isolation region 114 may be apart from the second wells 124. For example, the top surface of the first additional isolation region 114 may be disposed further away from the top surface of the single-photon detection pixel 22 than the bottom surfaces of the second wells 124. In an example, the first additional isolation region 114 may not be formed between the second well 124 and the second buffer region 116. The first additional isolation region 114 may include an insulating material. The first additional isolation region 114 may include silicon oxide (e.g., SiO$_2$), silicon nitride (e.g., SiN), silicon oxynitride (e.g., SiON), polycrystalline silicon, a low-k dielectric material, a metal, or a combination thereof. The first additional isolation region 114 may be a DTI or an MTI.

The first additional isolation region 114 may mitigate or prevent crosstalk between single-photon detection elements. An embodiment of the disclosure may provide the single-photon detection pixel 22 with improved reliability.

In another embodiment, the first well 102, the second contact 118, and the second buffer region 116 may each have a first conductivity type, and the heavily doped region 104 and the second well 124 may each have a second conductivity type.

Figure 31:
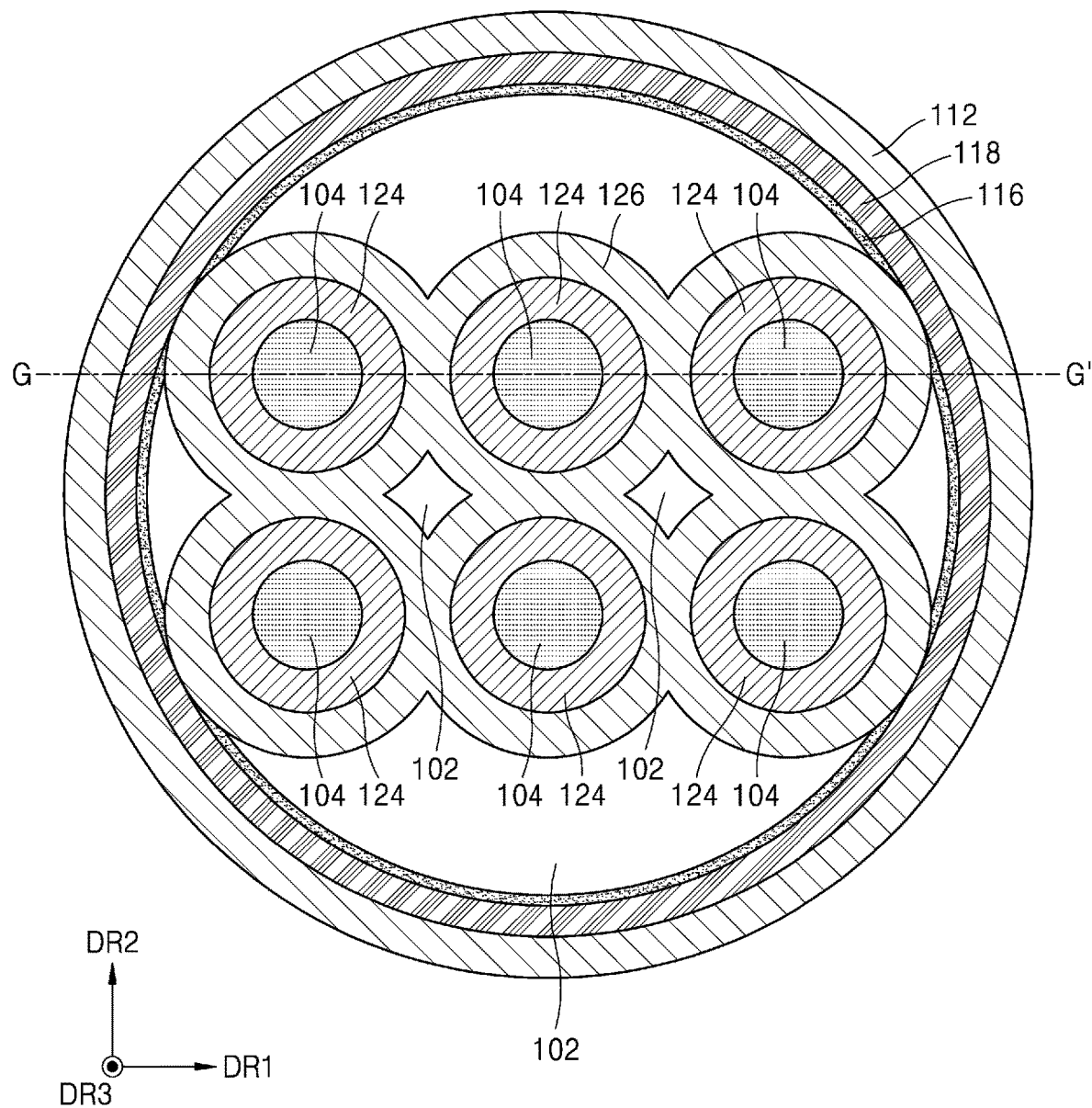
FIG. 31 is a plan view of a single-photon detection pixel according to an embodiment.
Figure 32:
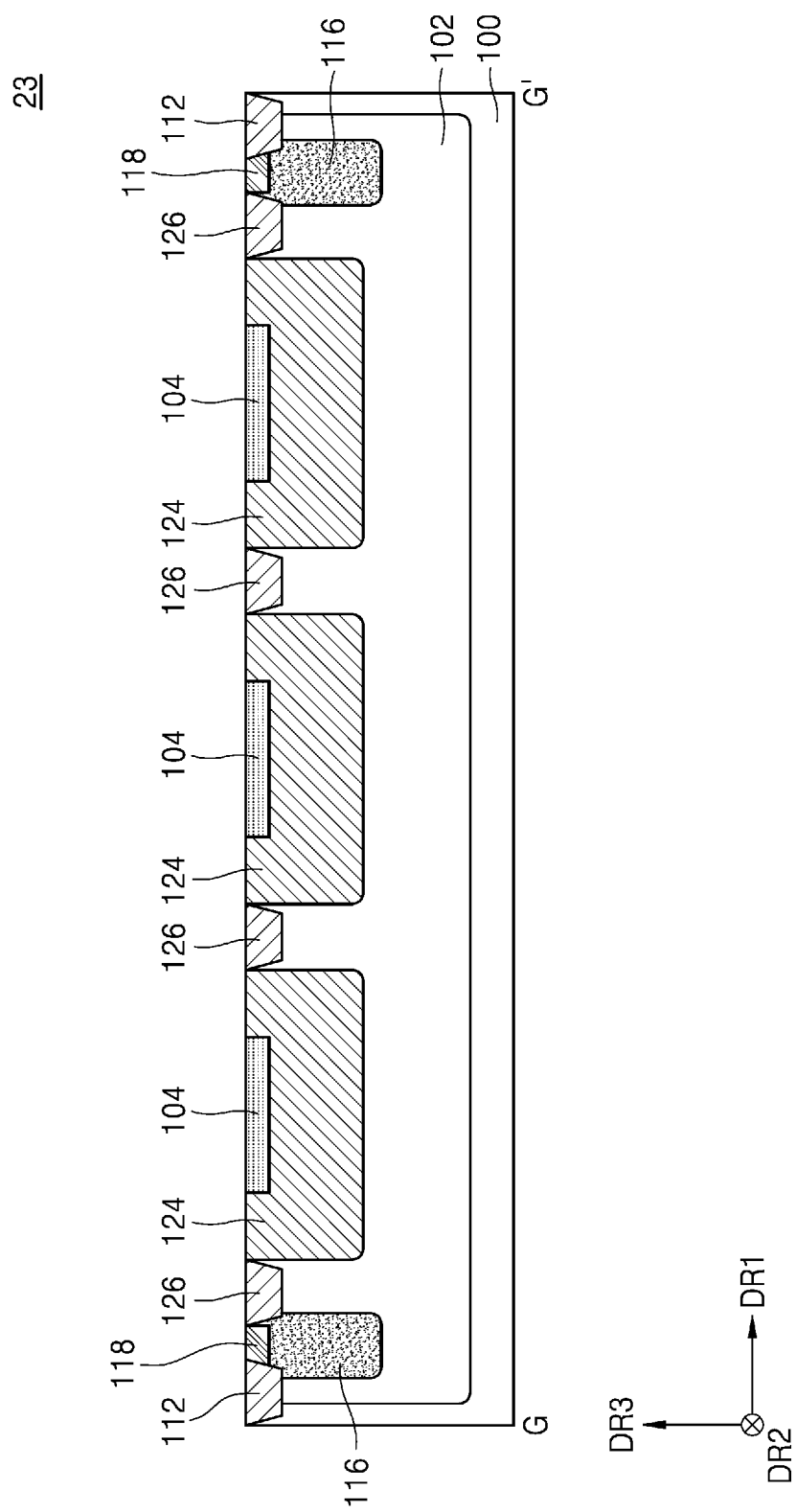
FIG. 32 is a cross-sectional view of the single-photon detection pixel taken along line G-G' of FIG. 31.

FIG. 31 is a plan view of a single-photon detection pixel 23 according to an embodiment. FIG. 32 is a cross-sectional view of the single-photon detection pixel 23 taken along line G-G' of FIG. 31. For brevity of description, descriptions substantially the same as those given with reference to FIGS. 26 and 27 may be omitted.

Referring to FIGS. 31 and 32, the single-photon detection pixel 23 may be provided. The single-photon detection pixel 23 has substantially the same configuration as the single-photon detection pixel 21 described with reference to FIGS. 26 and 27, but may further include a third additional isolation region 126. The third additional isolation region 126 may be provided on the side surfaces of second wells 124. When viewed in the third direction DR3, the third additional isolation region 126 may surround the second wells 124. Portions of the third additional isolation region 126 surrounding second wells 124 immediately adjacent to each other may be connected to each other. The third additional isolation region 126 may directly contact the second wells 124. In another example, the third additional isolation region 126 may be apart from the second wells 124. In another example, the third additional isolation region 126 may extend onto the second wells 124 to directly contact heavily doped regions 104. In another example, the third additional isolation region 126 may be further formed in a region between the second wells 124 and a second buffer region 116. The third additional isolation region 126 may be formed in a horizontal and vertical or octagonal shape between the second wells 124, as described with reference to FIG. 11. The third additional isolation region 126 may be thinner than the second wells 124. For example, the third additional isolation region 126 may be formed from the top surface of the single-photon detection pixel 23 to a depth less than a depth where the bottom surfaces of the second wells 124 are disposed. The third additional isolation region 126 may partially overlap the second buffer region 116 in the third direction DR3. The distance between the second wells 124 may be independent from a second additional isolation region 120. In an example, the distance between the second wells 124 may be substantially equal to the distance between the second wells 124 of the single-photon detection pixel 23 described with reference to FIGS. 26 and 27. The third additional isolation region 126 may include an insulating material. The third additional isolation region 126 may include silicon oxide (e.g., $SiO_2$), silicon nitride (e.g., SiN), silicon oxynitride (e.g., SiON), polycrystalline silicon, a low-k dielectric material, a metal, or a combination thereof. The third additional isolation region 126 may be an STI.

In an embodiment of the disclosure, the second contact 118 and the second buffer region 116 may not be provided between the second wells 124, and thus, the single-photon detection pixel 23 that is miniaturized or has a high fill factor may be provided.

In another embodiment, the first well 102, the second contact 118, and the second buffer region 116 may each have a first conductivity type, and the heavily doped region 104 and the second well 124 may each have a second conductivity type.

Figure 33:
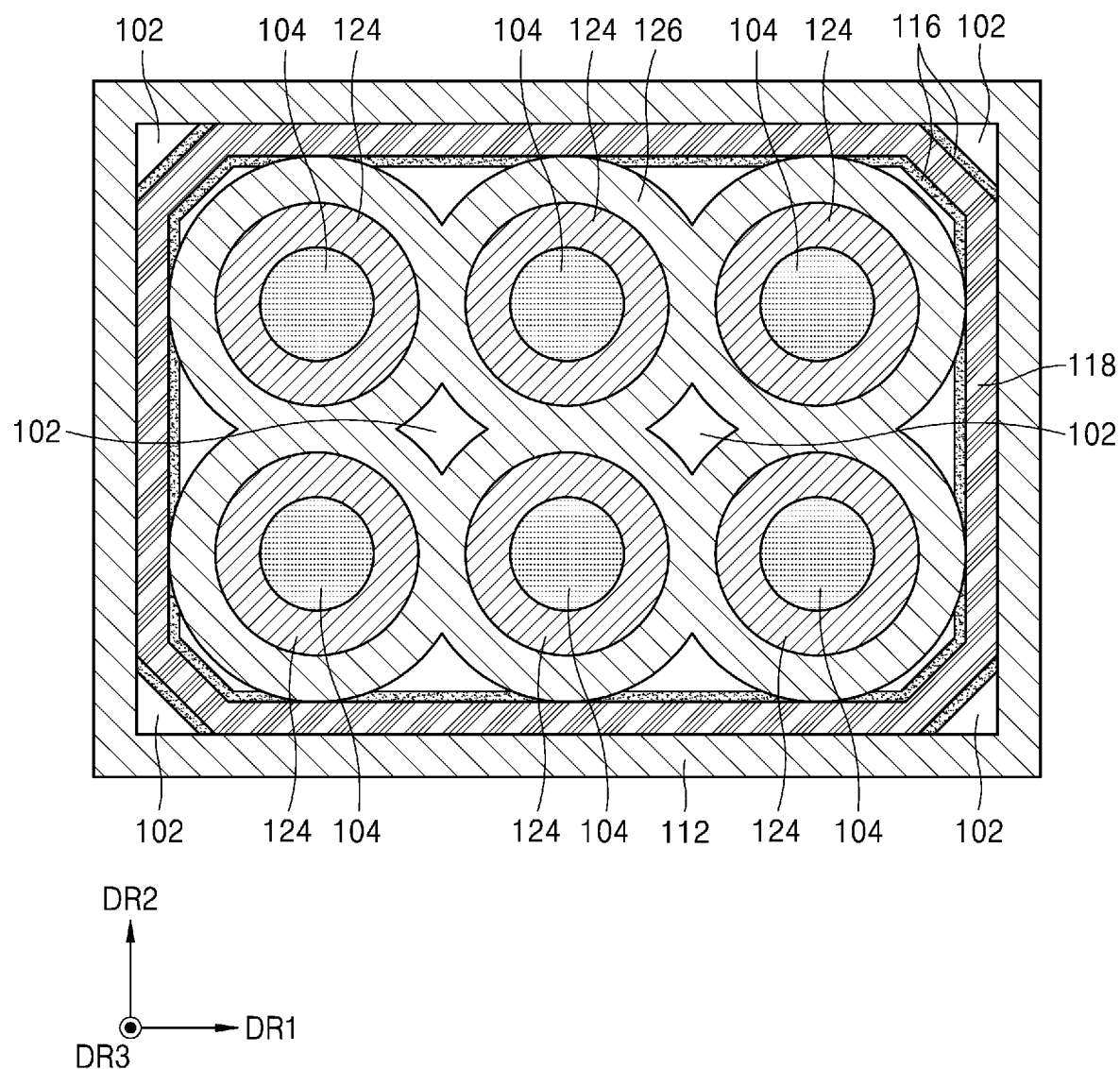
FIG. 33 is a plan view of a single-photon detection pixel having the cross-section of FIG. 32.

FIG. 33 is a plan view of a single-photon detection pixel 23a having the cross-section of FIG. 32. For brevity of description, descriptions substantially the same as those given with reference to FIGS. 31 and 32 may be omitted.

Referring to FIG. 33, the single-photon detection pixel 23a may be provided. The single-photon detection pixel 23a may include a second buffer region 116 and a second contact 118 configured to each have a single octagonal ring shape, unlike the single-photon detection pixel 23 described with reference to FIGS. 31 and 32.

An embodiment of the disclosure may provide the single-photon detection pixel 23a that is miniaturized or has a high fill factor.

Figure 34:
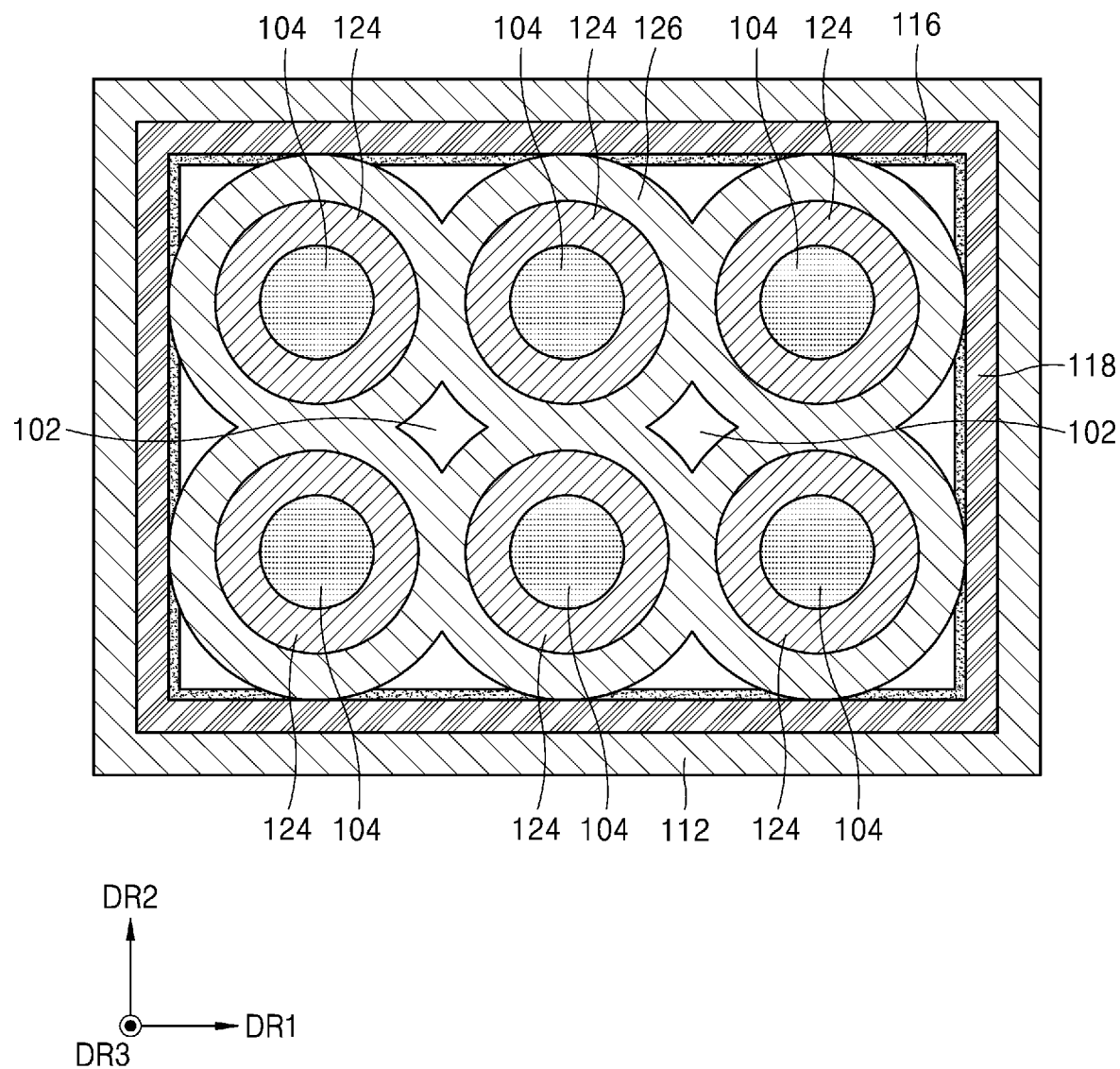
FIG. 34 is a plan view of a single-photon detection pixel having the cross-section of FIG. 32.

FIG. 34 is a plan view of a single-photon detection pixel 23b having the cross-section of FIG. 32. For brevity of description, descriptions substantially the same as those given with reference to FIGS. 31 and 32 may be omitted.

Referring to FIG. 34, the single-photon detection pixel 23b may be provided. The single-photon detection pixel 23b may include a second buffer region 116 and a second contact 118 configured to each have a single quadrangular ring shape, unlike the single-photon detection pixel 23 described with reference to FIGS. 31 and 32. The shapes of the second buffer region 116 and the second contact 118 are non-restrictive examples. That is, the second buffer region 116 and the second contact 118 may each have a shape other than a circular ring shape, an octagonal ring shape, and a quadrangular ring shape.

An embodiment of the disclosure may provide the single-photon detection pixel 23b that is miniaturized or has a high fill factor.

Figure 35:
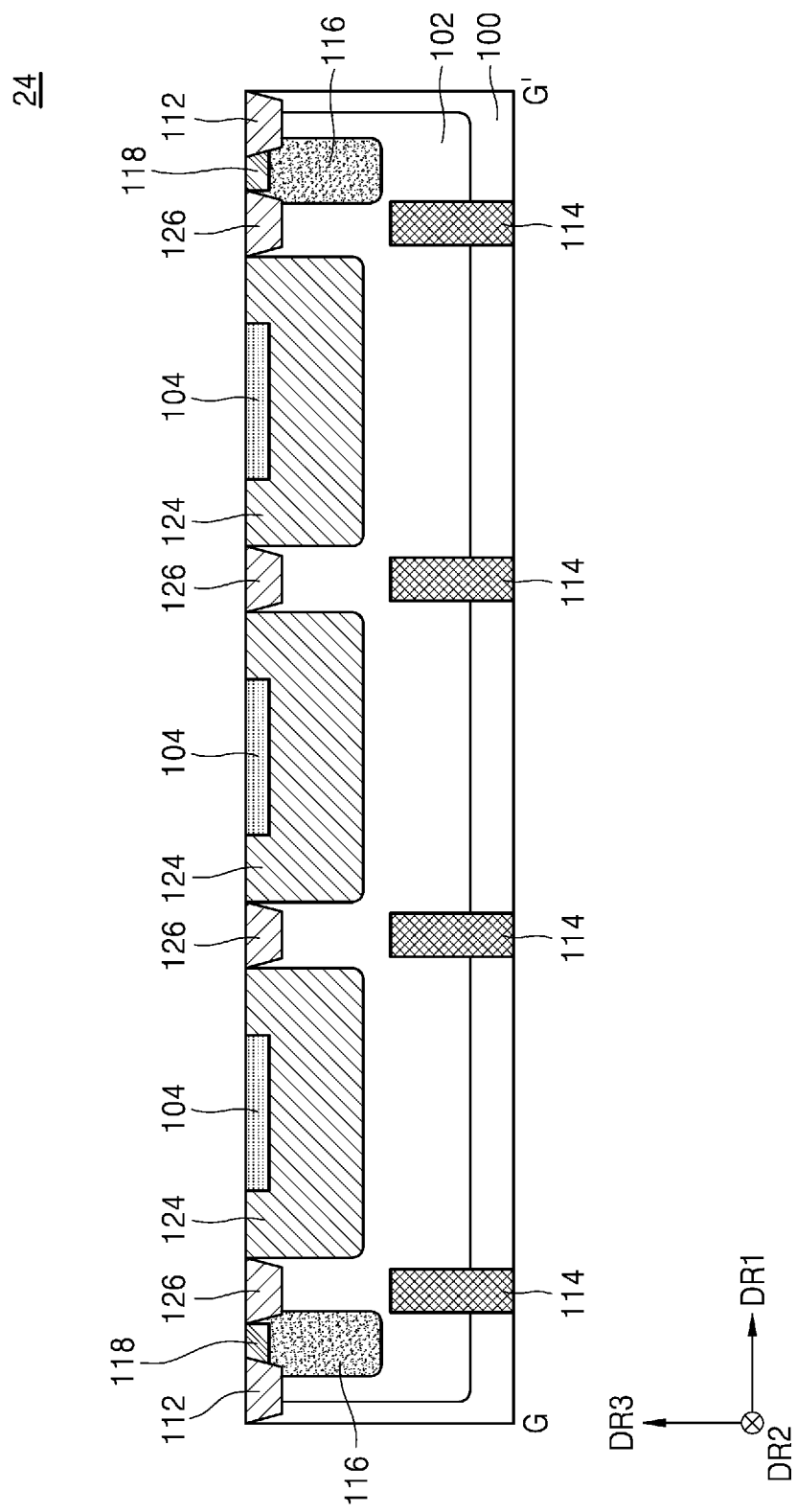
FIG. 35 is a cross-sectional view of a single-photon detection pixel according to an embodiment, the cross-sectional view corresponding to line G-G' of FIG. 31.

FIG. 35 is a cross-sectional view of a single-photon detection pixel 24 according to an embodiment, the cross-sectional view corresponding to line G-G' of FIG. 31. For brevity of description, descriptions substantially the same as those given with reference to FIGS. 31 and 32 may be omitted.

Referring to FIG. 35, the single-photon detection pixel 24 may be provided. The single-photon detection pixel 24 has substantially the same configuration as the single-photon detection pixel 23 described with reference to FIGS. 31 and 32, but may further include a first additional isolation region 114.

The first additional isolation region 114 may be provided between second wells 124. The first additional isolation region 114 may overlap a second additional isolation region 120 in the third direction DR3. For example, the first additional isolation region 114 may be provided below the second additional isolation region 120. The first additional isolation region 114 may extend in the third direction DR3, penetrate a substrate 100, and be inserted into a first well 102. The first additional isolation region 114 may be apart from the second additional isolation region 120 and the second wells 124. For example, the top surface of the first additional isolation region 114 may be disposed further away from the top surface of the single-photon detection pixel 24 than the bottom surfaces of the second additional isolation region 120 and the second wells 124. In an example, the first additional isolation region 114 may not be formed between the second wells 124 and a second buffer region 116. The first additional isolation region 114 may include an insulating material. The first additional isolation region 114 may include silicon oxide (e.g., $SiO_2$), silicon nitride (e.g., SiN), silicon oxynitride (e.g., SiON), polycrystalline silicon, a low-k dielectric material, a metal, or a combination thereof. The first additional isolation region 114 may be a DTI or an MTI.

The first additional isolation region 114 may mitigate or prevent crosstalk between single-photon detection elements. An embodiment of the disclosure may provide the single-photon detection pixel 24 with improved reliability.

In another embodiment, the first well 102, the second contact 118, and the second buffer region 116 may each have a first conductivity type, and the heavily doped region 104 and the second well 124 may each have a second conductivity type.

Figure 36:
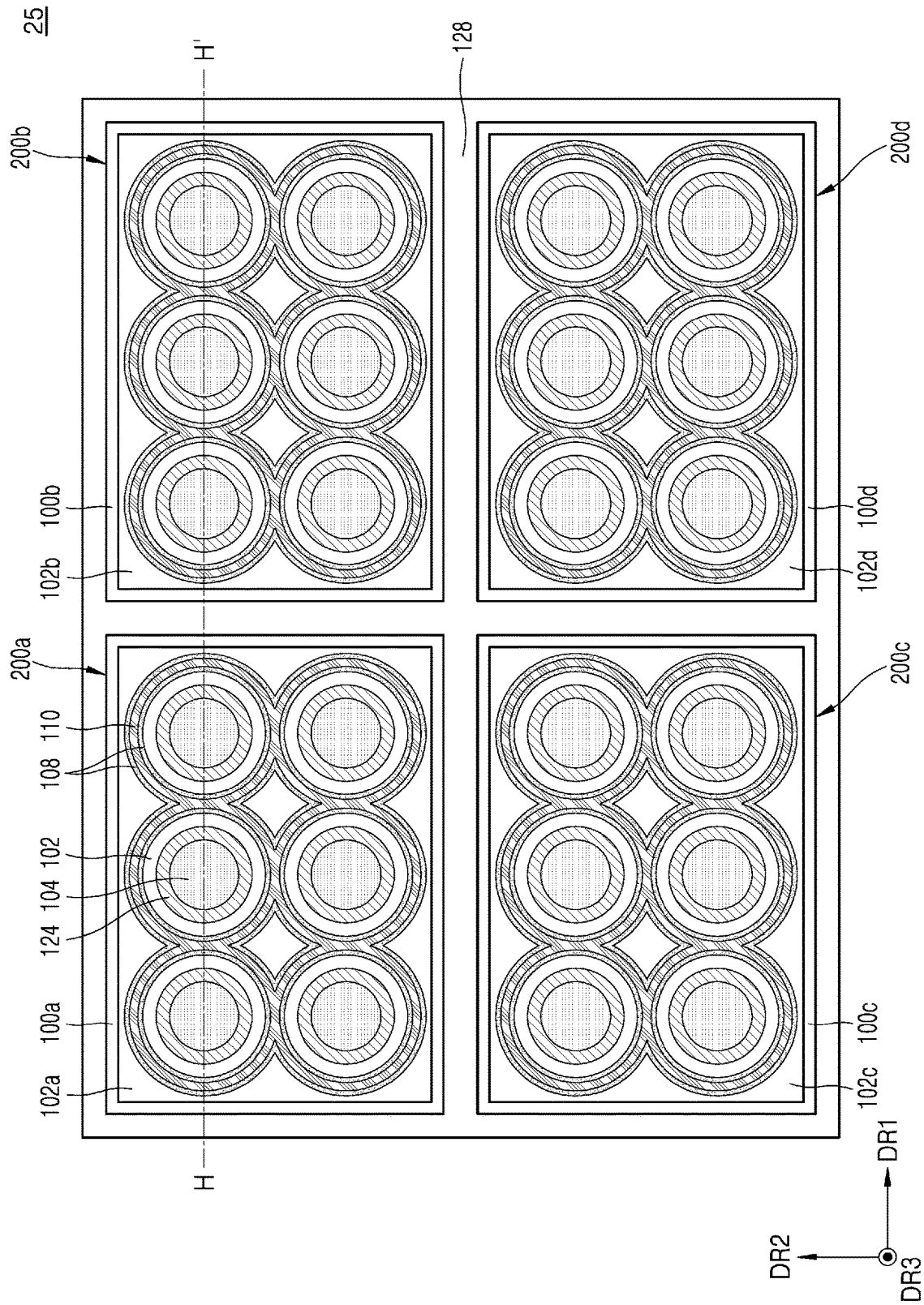
FIG. 36 is a plan view of a single-photon detection pixel array according to an embodiment.
Figure 37:
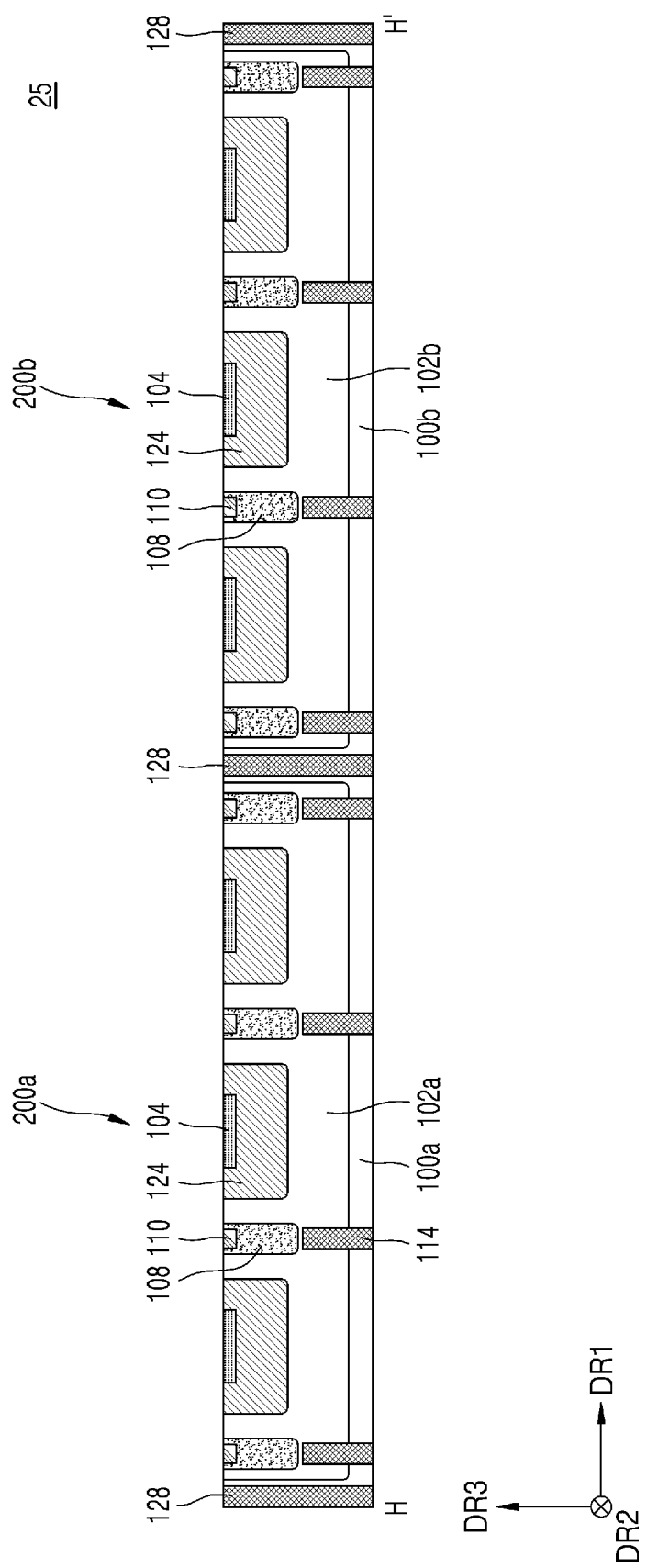
FIG. 37 is a cross-sectional view of the single-photon detection pixel array taken along line H-H' of FIG. 36.

FIG. 36 is a plan view of a single-photon detection pixel array 25 according to an embodiment. FIG. 37 is a cross-sectional view of the single-photon detection pixel array 25 taken along line H-H' of FIG. 36. For brevity of description, descriptions substantially the same as those given with reference to FIGS. 21 and 22 may be omitted.

Referring to FIGS. 36 and 37, the single-photon detection pixel array 25 may be provided. The single-photon detection pixel array 25 may include a plurality of pixels 200a, 200b, 200c, and 200d. Although four pixels 200a, 200b, 200c, and 200d in the form of 2×2 including two rows in the first direction DR1 and two columns in the second direction DR2 are illustrated in FIG. 36, this is merely an example. In another example, the single-photon detection pixel array 25 may include fewer or more than four pixels 200a, 200b, 200c, and 200d, which may be arranged in various shapes. Each of the plurality of pixels 200a, 200b, 200c, and 200d is substantially the same as the single-photon detection pixel 19 described with reference to FIGS. 21 and 22 except that each of the plurality of pixels 200a, 200b, 200c, and 200d does not include the first isolation region 112. However, each of the plurality of pixels 200a, 200b, 200c, and 200d is not limited to the single-photon detection pixel 19 described with reference to FIGS. 21 and 22. Each of the plurality of pixels 200a, 200b, 200c, and 200d may be substantially the same as any one selected from among the single-photon detection pixels 11, 11a, 11b, 12, 13, 13a, 13b, 14, 15, 15a, 15b, 16, 17, 17a, 17b, 18, 19a, 19b, 20, 21, 21a, 21b, 22, 23, 23a, 23b, and 24 and single-photon detection pixels 27 and 28 described below. In FIGS. 36 and 37, to distinguish the plurality of pixels 200a, 200b, 200c, and 200d from one another, reference numerals of the substrates of the plurality of pixels 200a, 200b, 200c, and 200d are denoted as 100a, 100b, 100c, and 100d, respectively, and reference numerals of the first wells of the plurality of pixels 200a, 200b, 200c, and 200d are denoted as 102a, 102b, 102c, and 102d, respectively.

The single-photon detection pixel array 25 may include a second isolation region 128 provided between the plurality of pixels 200a, 200b, 200c, and 200d. The second isolation region 128 may cross a region between the plurality of pixels 200a, 200b, 200c, and 200d. The second isolation region 128 may be provided on side surfaces of the plurality of pixels 200a, 200b, 200c, and 200d. When viewed in the third direction DR3, the second isolation region 128 may surround the plurality of pixels 200a, 200b, 200c, and 200d. The second isolation region 128 may be apart from the first wells 102a, 102b, 102c, and 102d. However, this is merely an example. In another example, the second isolation region 128 may contact the first wells 102a, 102b, 102c, and 102d. For example, the second isolation region 128 may fill a region between the first wells 102a, 102b, 102c, and 102d. The second isolation region 128 may extend from the top surface of the single-photon detection pixel array 25 to the bottom surface thereof. The thickness of the second isolation region 128 may be substantially equal to the thickness of the single-photon detection pixel array 25. However, the thickness of the second isolation region 128 is not limited thereto. In another example, the second isolation region 128 may have a smaller thickness than the single-photon detection pixel array 25. In an example, the second isolation region 128 may be the same as or similar to a first additional isolation region 114. For example, the second isolation region 128 may extend from the bottom surface of the single-photon detection pixel array 25 to a depth substantially equal to the depth of the first additional isolation region 114. The second isolation region 128 may include an insulating material. The second isolation region 128 may include silicon oxide (e.g., $SiO_2$), silicon nitride (e.g., SiN), silicon oxynitride (e.g., SiON), polycrystalline silicon, a low-k dielectric material, a metal, or a combination thereof.

An embodiment of the disclosure may provide the single-photon detection pixel array 25 including the single-photon detection pixels 200a, 200b, 200c, and 200d that are miniaturized or have high fill factors.

Figure 38:
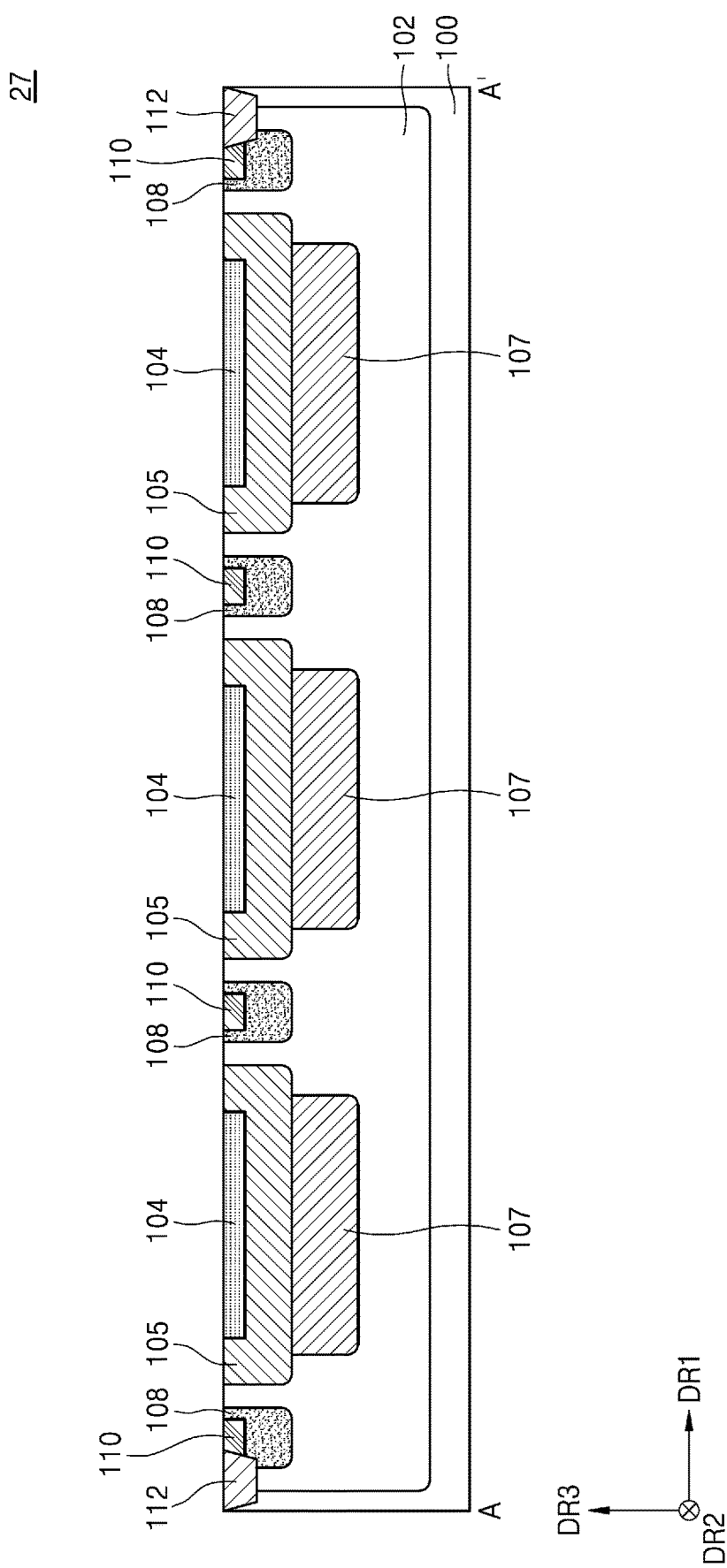
FIG. 38 is a cross-sectional view of a single-photon detection pixel array according to an embodiment, the cross-sectional view taken along line H-H' of FIG. 36.

FIG. 38 is a cross-sectional view of a single-photon detection pixel array 26 according to an embodiment, the cross-sectional view taken along line H-H' of FIG. 36. For brevity of description, descriptions substantially the same as those given with reference to FIGS. 36 and 37 may be omitted.

Referring to FIG. 38, the single-photon detection pixel array 26 may be provided. The single-photon detection pixel array 26 may not include the first additional isolation regions 114, unlike the single-photon detection pixel array 25 described with reference to FIGS. 36 and 37.

Figure 39:
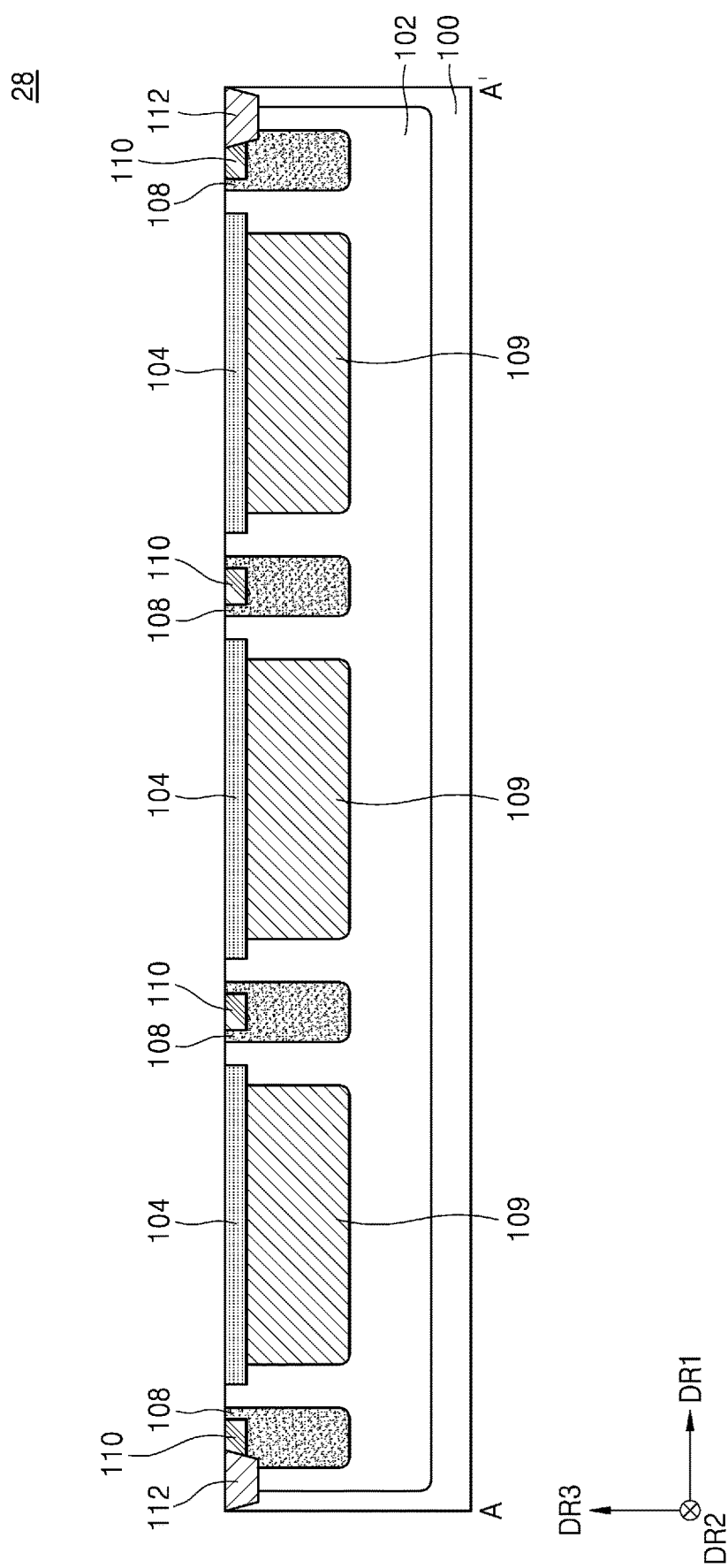
FIG. 39 is a cross-sectional view of a single-photon detection pixel according to an embodiment.

FIG. 39 is a cross-sectional view of a single-photon detection pixel according to an embodiment. For brevity of description, differences from those given with reference to FIGS. 1 and 2 may be described.

Referring to FIG. 39, the single-photon detection pixel 27 may not include the first guard rings 106 and may include third wells 105 and fourth wells 107, unlike the single-photon detection pixel 11 described with reference to FIGS. 1 and 2. Also, the heavily doped region 104 may have a second conductivity type, and the first well 102, the first buffer region 108, and the first contact 110 may each have a first conductivity type. In an embodiment, the first well 102 may be omitted. The third wells 105 may surround heavily doped regions 104, respectively. The third wells 105 may each have a second conductivity type. The doping concentration of each of the third wells 105 may be lower than that of each of the heavily doped regions 104. For example, the doping concentration of each of the third wells 105 may be about $1\times10^{15}$ $cm^{-3}$ to about $1\times10^{18}$ $cm^{-3}$.

The fourth wells 107 may be respectively provided below the third wells 105. The fourth wells 107 may each have a first conductivity type. For example, the doping concentration of each of the fourth wells 107 may be about $1\times10^{14}$ $cm^{-3}$ to about $1\times10^{18}$ $cm^{-3}$. The fourth wells 107 may each have a smaller width than the third wells 105. A multiplication region may be formed near the interface between the fourth wells 107 and the third wells 105. That is, the formation position of the multiplication region may be limited according to the widths of the fourth wells 107. Accordingly, the concentration of the electric field at the edges of the third wells 105 may be relieved and premature breakdown or edge breakdown may be prevented. As a result, the breakdown characteristic of the single-photon detection pixel 27 may be improved.

According to an embodiment of the disclosure, the single-photon detection pixel 27 having improved breakdown characteristics may be provided by forming the widths of the fourth wells 107 provided under the third wells 105 to be less than the widths of the third wells 105.

In another embodiment, the first well 102, the fourth well 107, the first buffer region 108, and the first contact 110 may each have a second conductivity type, and the heavily doped region 104 and the third well 105 may each have a first conductivity type.

In other embodiments, like the single-photon detection pixel 12 described with reference to FIG. 5, the single-photon detection pixel 27 may further include a first additional isolation region 114.

In other embodiments, like the single-photon detection pixel 13 described with reference to FIG. 7, the single-photon detection pixel 27 may include a second contact 118 and a second buffer region 116 instead of the first contact 110 and the first buffer region 108.

In other embodiments, like the single-photon detection pixel 14 described with reference to FIG. 10, the single-photon detection pixel 27 may include a second contact 118 and a second buffer region 116 instead of the first contact 110 and the first buffer region 108 and further include a first additional isolation region 114.

In other embodiments, like the single-photon detection pixel 15 described with reference to FIG. 12, the single-photon detection pixel 27 may include a second contact 118 and a second buffer region 116 instead of the first contact 110 and the first buffer region 108 and further include a second additional isolation region 120.

In other embodiments, like the single-photon detection pixel 16 described with reference to FIG. 15, the single-photon detection pixel 27 may include a second contact 118 and a second buffer region 116 instead of the first contact 110 and the first buffer region 108 and further include a first additional isolation region 114 and a second additional isolation region 120.

Figure 40:
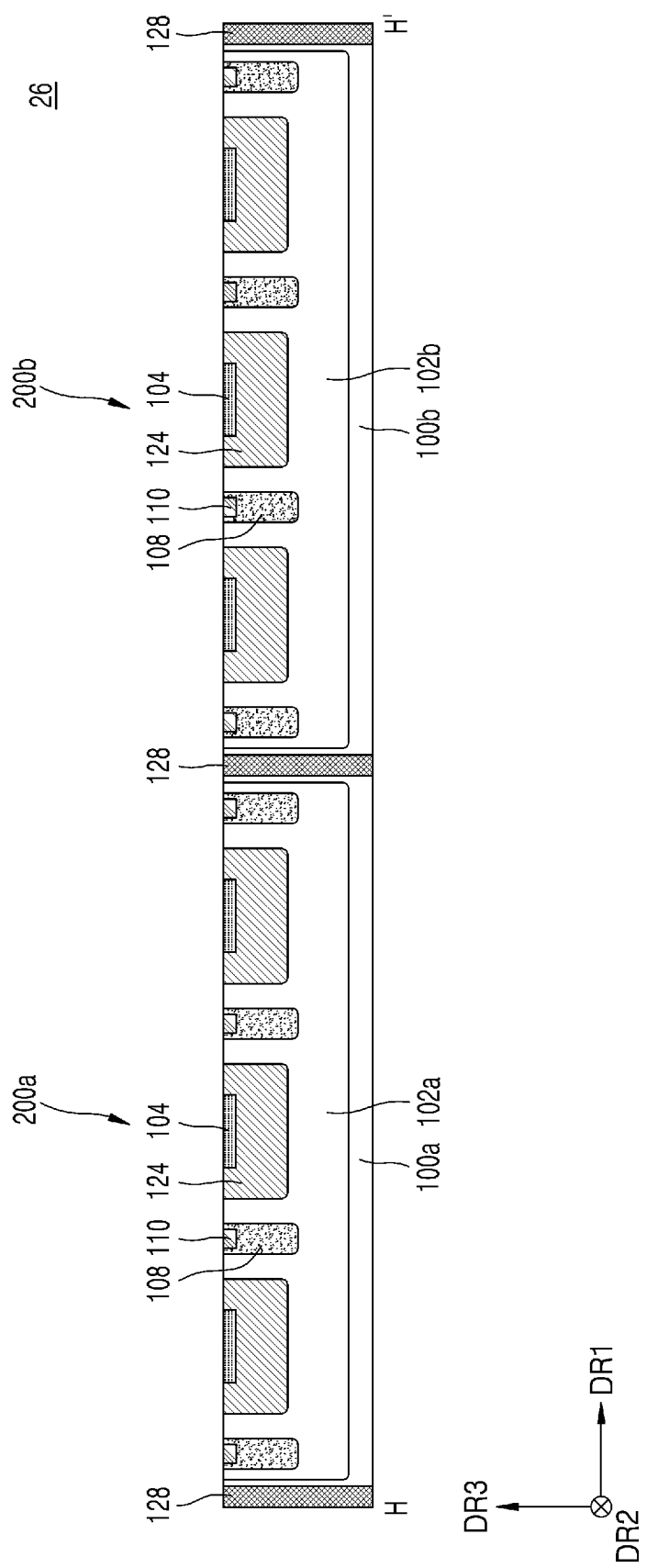
FIG. 40 is a cross-sectional view of a single-photon detection pixel according to an embodiment.

FIG. 40 is a cross-sectional view of a single-photon detection pixel 28 according to an embodiment. For brevity of descriptions, differences from those given with reference to FIGS. 1 and 2 may be described.

Referring to FIG. 40, the single-photon detection pixel 28 may not include the first guard rings 106 and may include fifth wells 109, unlike the single-photon detection pixel 11 described with reference to FIGS. 1 and 2. Also, the heavily doped region 104 may have a second conductivity type, and the first well 102, the first buffer region 108, and the first contact 110 may each have a first conductivity type. In an embodiment, the first well 102 may be omitted. The fifth wells 109 may each have a first conductivity type. For example, the doping concentration of each of the fifth wells 109 may be about $1\times10^{14}$ cm$^{-3}$ to about $1\times10^{18}$ cm$^{-3}$. The fifth wells 109 may each have a smaller width than the heavily doped regions 104. A multiplication region may be formed near the interface between the fifth wells 109 and the heavily doped regions 104. That is, the formation position of the multiplication region may be limited according to the widths of the fifth wells 109. Accordingly, the concentration of the electric field at the edges of the heavily doped regions 104 may be relieved, and premature breakdown or edge breakdown may be prevented. As a result, the breakdown characteristic of the single-photon detection pixel 28 may be improved.

According to an embodiment of the disclosure, the single-photon detection pixel 28 having improved breakdown characteristics may be provided by forming the widths of the fifth wells 109 provided under the heavily doped regions 104 to be less than the widths of the heavily doped regions 104.

In another embodiment, the first well 102, the fifth wells 109, the first buffer region 108, and the first contact 110 may each have a second conductivity type, and the heavily doped regions 104 may each have a first conductivity type.

In other embodiments, the single-photon detection pixel 28 may further include a first additional isolation region 114, like the single-photon detection pixel 12 described with reference to FIG. 5.

In other embodiments, the single-photon detection pixel 28 may include a second contact 118 and a second buffer region 116 instead of the first contact 110 and the first buffer region 108, like the single-photon detection pixel 13 described with reference to FIG. 7.

In other embodiments, like the single-photon detection pixel 14 described with reference to FIG. 10, the single-photon detection pixel 28 may include a second contact 118 and a second buffer region 116 instead of the first contact 110 and the first buffer region 108 and further include a first additional isolation region 114.

In other embodiments, like the single-photon detection pixel 15 described with reference to FIG. 12, the single-photon detection pixel 28 may include a second contact 118 and a second buffer region 116 instead of the first contact 110 and the first buffer region 108 and further include a second additional isolation region 120.

In other embodiments, like the single-photon detection pixel 16 described with reference to FIG. 15, the single-photon detection pixel 28 may include a second contact 118 and a second buffer region 116 instead of the first contact 110 and the first buffer region 108 and further include a first additional isolation region 114 and a second additional isolation region 120.

Figure 41:
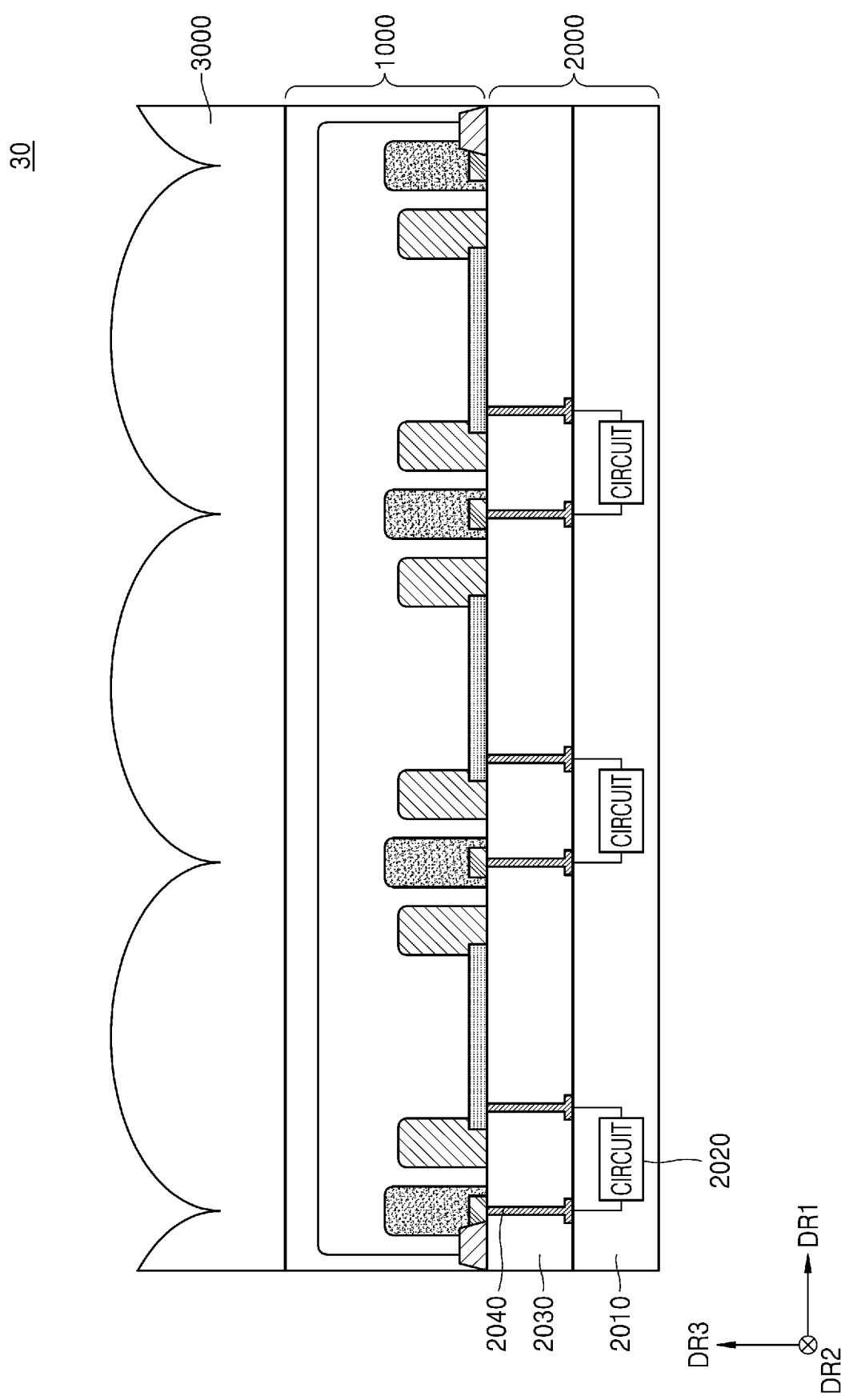
FIG. 41 is a cross-sectional view of a single-photon detector according to an embodiment.

FIG. 41 is a cross-sectional view of a single-photon detector 30 according to an embodiment. For brevity of description, descriptions substantially the same as those given with reference to FIGS. 1 and 2 may be omitted.

Referring to FIG. 41, the single-photon detector 30 may be provided. The single-photon detector 30 may be a back-side illumination (BSI) type image sensor. The single-photon detector 30 may include a single-photon detection pixel 1000, a control layer 2000, and a lens portion 3000. The single-photon detection pixel 1000 may be substantially the same as the single-photon detection pixel 11 described with reference to FIGS. 1 and 2. However, this is merely an example. In another example, the single-photon detection pixel 1000 may be one of the single-photon detection pixels 11 to 24, 27, and 28 described above. The single-photon detection pixel 1000 may include a SPAD.

The control layer 2000 may include a first insulating layer 2010, circuits 2020, a second insulating layer 2030, and wiring lines 2040. For example, the control layer 2000 may be a chip in which the circuits 2020 and the wiring lines 2040 are formed. The first insulating layer 2010 and the second insulating layer 2030 may each include silicon oxide (e.g., $SiO_2$), silicon nitride (e.g., SiN), silicon oxynitride (e.g., SiON), or a combination thereof.

Although each of the circuits 2020 is illustrated as one block, this does not mean that each of the circuits 2020 has only one electronic element. Each of the circuits 2020 may include various electronic elements as needed. Although a plurality of circuits 2020 are provided in one single-photon detection pixel 1000, but this is merely an example. In another example, one circuit 2020 may be provided per one single-photon detection pixel 1000. When the single-photon detection pixel 1000 includes a SPAD, the circuit 2020 may include a quenching resistor or circuit and a readout circuit. The quenching circuit may stop an avalanche effect and allow the SPAD to detect another photon. Other pixel circuits may include a reset or recharge circuit, a memory, an amplifier circuit, a counter, a gate circuit, and the like, and may transmit a signal current to the single-photon detection pixel 1000 or receive a signal current from the single-photon detection pixel 1000.

The wiring lines 2040 may be electrically connected to the first contact 110 and the heavily doped region 104. In an example, the wiring lines 2040 may be widely formed to face the heavily doped region 104 to reflect light and increase light absorption efficiency. The wiring lines 2040 may connect the first contact 110 and the heavily doped region 104 to the circuits 2020.

The lens portion 3000 may be provided opposite to the control layer 2000 with respect to the single-photon detection pixel 1000. That is, the control layer 2000 may be located on the front surface of the single-photon detection pixel 1000, and the lens portion 3000 may be located on the rear surface of the single-photon detection pixel 1000. The lens portion 3000 may focus incident light and transmit the incident light to the single-photon detection pixel 1000. For example, the lens portion 3000 may include a microlens and a Fresnel lens. In an example, the central axis of the lens portion 3000 may be aligned with the central axis of the heavily doped region 104. The central axis of the lens portion 3000 and the central axis of the heavily doped region 104 may pass through the center of the lens portion 3000 and the center of the heavily doped region 104, respectively, and may be virtual axes parallel to a direction in which the heavily doped region 104 and the lens portion 3000 are stacked. In an example, the central axis of the lens portion 3000 may be misaligned with the central axis of the heavily doped region 104. When a pixel isolation structure or an isolation layer (not shown) is used, the lens portion 3000 may be implemented to be larger than the single-photon detection pixel 1000. In an embodiment, a color filter, a bandpass filter, an anti-reflection coating, a 2-dimensional (2D) nanomaterial, an organic material, or the like may be formed between the lens portion 3000 and the single-photon detection pixel 1000.

An embodiment of the disclosure may provide the single-photon detector 30 that is miniaturized or has a high fill factor.

Figure 42:
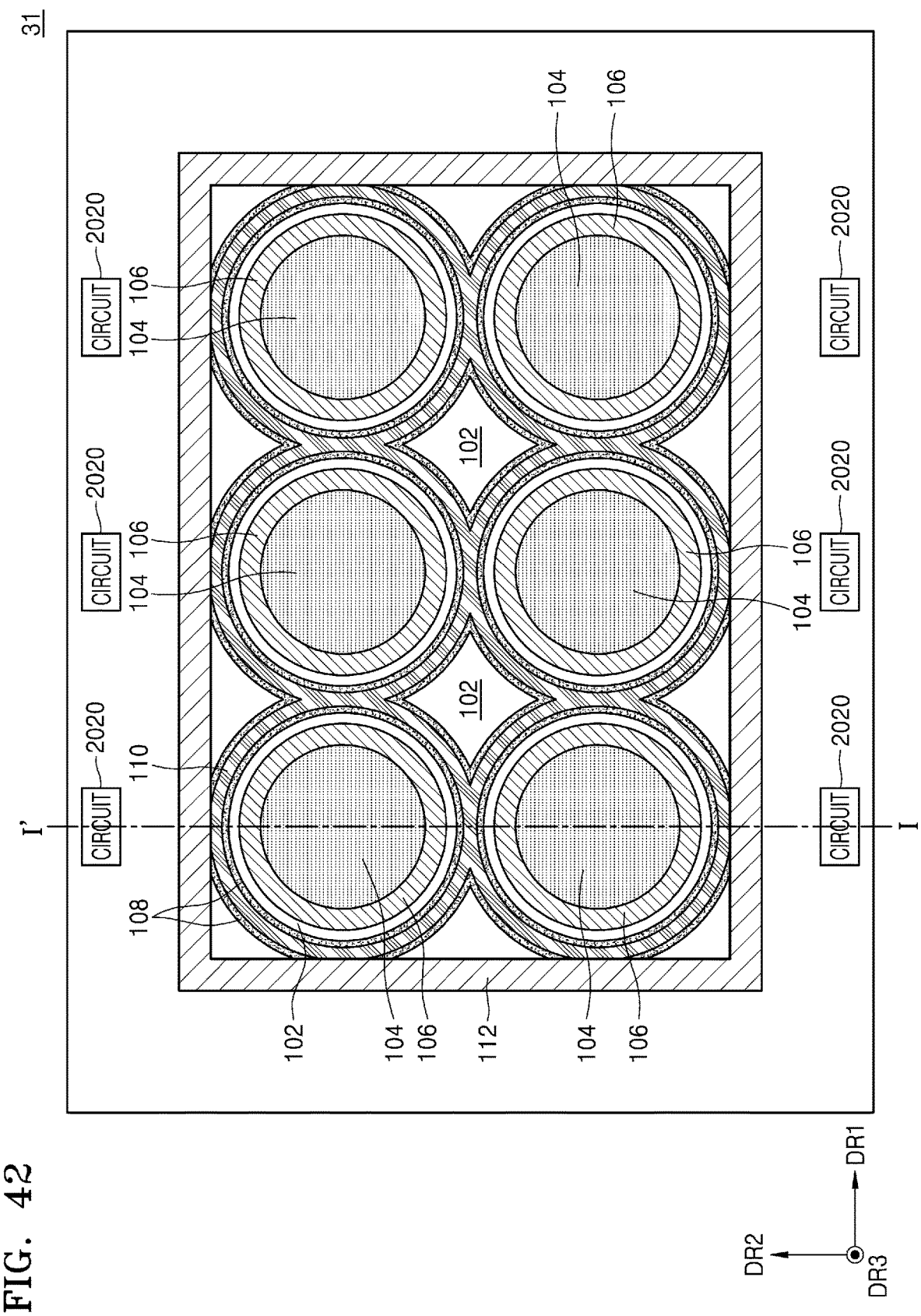
FIG. 42 is a plan view of a single-photon detector according to an embodiment.
Figure 43:
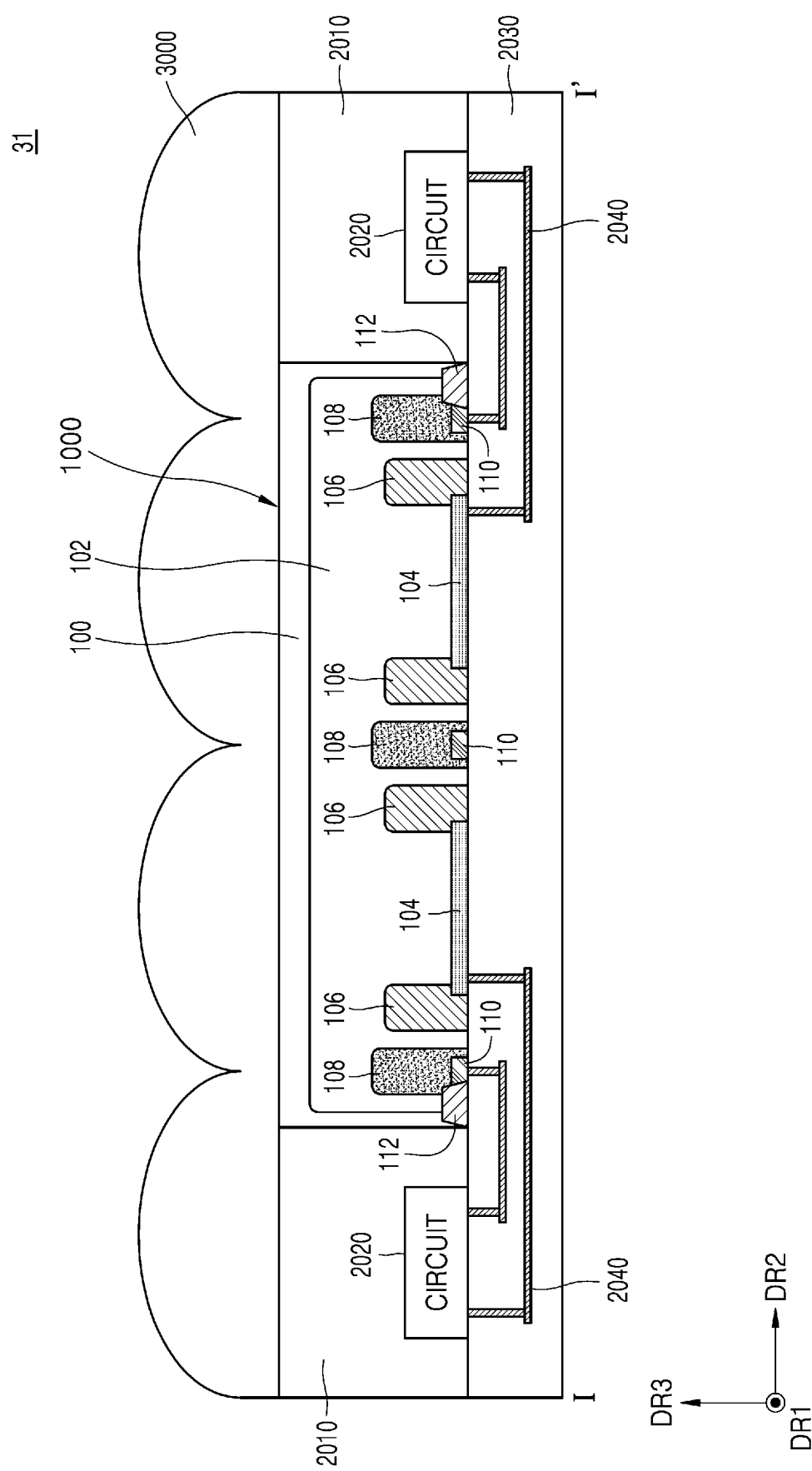
FIG. 43 is a cross-sectional view of the single-photon detector taken along line I-I' of FIG. 42.

FIG. 42 is a plan view of a single-photon detector 31 according to an embodiment. FIG. 43 is a cross-sectional view of the single-photon detector 31 taken along line I-I' of FIG. 42. For brevity of description, descriptions substantially the same as those given with reference to FIG. 41 may be omitted.

Referring to FIGS. 42 and 43, the single-photon detector 31 may be provided. The single-photon detector 30 may be a BSI type image sensor. The single-photon detector 31 may include a single-photon detection pixel 1000, a first insulating layer 2010, circuits 2020, a second insulating layer 2030, wiring lines 2040, and a lens portion 3000. The single-photon detection pixel 1000 may be substantially the same as the single-photon detection pixel 1000 described with reference to FIG. 41.

Unlike those described with reference to FIG. 41, the first insulating layer 2010 and the circuits 2020 may be provided on a side surface of the single-photon detection pixel 1000. For example, the first insulating layer 2010, the circuits 2020, and the single-photon detection pixel 1000 may be disposed at different positions on the same semiconductor substrate. The first insulating layer 2010 and the circuits 2020 may be substantially the same as the first insulating layer 2010 and the circuits 2020 described with reference to FIG. 41, except for positions.

The second insulating layer 2030 and the wiring lines 2040 may be provided on the single-photon detection pixel 1000 and the first insulating layer 2010. The second insulating layer 2030 may be substantially the same as the second insulating layer 2030 described with reference to FIG. 41. The wiring lines 2040 may be electrically connected to the first contact 110 and the heavily doped region 104. In an example, the wiring lines 2040 may be widely formed to face the heavily doped region 104 to reflect light and increase light absorption efficiency. The wiring lines 2040 may connect the first contact 110 and the heavily doped region 104 to the circuits 2020.

The lens portion 3000 may be provided opposite to the second insulating layer 2030 and the wiring lines 2040 with respect to the single-photon detection pixel 1000. That is, the second insulating layer 2030 and the wiring lines 2040 may be located on the front surface of the single-photon detection pixel 1000, and the lens portion 3000 may be located on the rear surface of the single-photon detection pixel 1000. Except for the position of the lens portion 3000, the lens portion 3000 may be substantially the same as the lens portion 3000 described with reference to FIG. 41.

In an embodiment, a color filter, a bandpass filter, an anti-reflection coating, a 2D nanomaterial, an organic material, or the like may be formed between the lens portion 3000 and the single-photon detection pixel 1000.

An embodiment of the disclosure may provide the single-photon detector 31 that is miniaturized or has a high fill factor.

Figure 44:
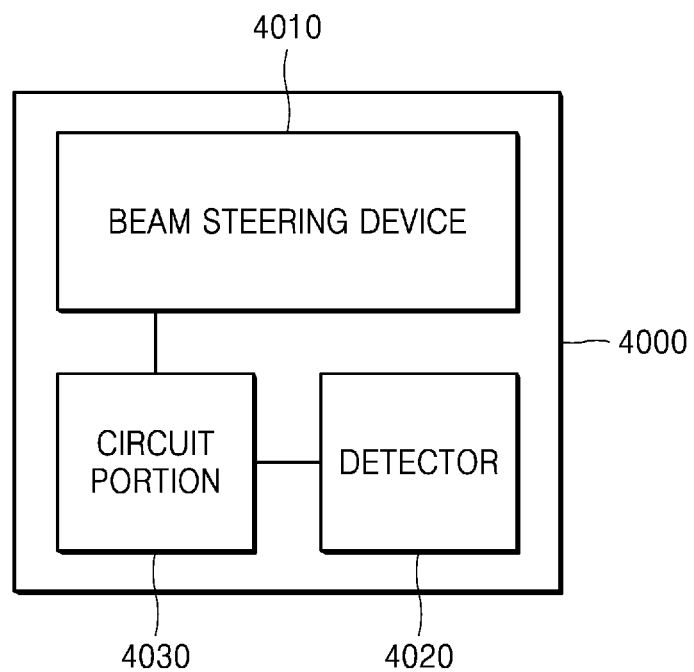
FIG. 44 is a block diagram of an electronic device according to an embodiment.

FIG. 44 is a block diagram of an electronic device 4000 according to an embodiment.

Referring to FIG. 44, the electronic device 4000 may be provided. The electronic device 4000 may emit light to an object (not shown), and may detect light reflected from the object to the electronic device 4000. The electronic device 4000 may include a beam steering device 4010. The beam steering device 4010 may adjust a direction of light emitted to the outside of the electronic device 4000. The beam steering device 4010 may be a mechanical or non-mechanical (semiconductor type) beam steering device. The electronic device 4000 may include a light source portion in the beam steering device 4010, or may include a light source portion located outside the beam steering device 4010. The beam steering device 4010 may be a light-emitting device using a scanning method. However, the light-emitting device of the electronic device 4000 is not limited to the beam steering device 4010. In another example, the electronic device 4000 may include a light-emitting device using a flash method, instead of or along with the beam steering device 4010. The light-emitting device using the flash method may emit light to an area including all fields of view at once without a scanning process.

Light steered by the beam steering device 4010 may be reflected by the object to the electronic device 4000. The electronic device 4000 may include a detector 4020 for detecting light reflected by the object. The detector 4020 may include a single-photon detector including a plurality of pixels. The plurality of pixels may include any one of the single-photon detection pixels 11 to 24, 27, and 28 described above. Also, the electronic device 4000 may further include a circuit portion 4030 connected to at least one of the beam steering device 4010 and the detector 4020. The circuit portion 4030 may include a calculation portion that obtains and calculates data, and may further include a driver and a controller. Also, the circuit portion 4030 may further include a power supply portion and a memory.

Although the electronic device 4000 includes the beam steering device 4010 and the detector 4020 in one device, the beam steering device 4010 and the detector 4020 may not be provided in one device but may be provided in separate devices. Also, the circuit portion 4030 may be connected to the beam steering device 4010 or the detector 4020 through wireless communication rather than wired communication.

The electronic device 4000 according to the above embodiment may be applied to various electronic devices. For example, the electronic device 4000 may be applied to a light detection and ranging (LiDAR) device. The LiDAR device may be a phase-shift type or time-of-flight (TOF) type device. Also, a single-photon detection pixel according to an embodiment and the electronic device 4000 including the same may be mounted on an electric device such as a smartphone, a wearable device (e.g., augmented reality (AR) and virtual reality (VR) glasses), an Internet of things (IoT) device, a home appliance, a tablet personal computer (PC), a personal digital assistant (PDA), a portable multimedia player (PMP), a navigation device, a drone, a robot, a self-driving vehicle, an autonomous vehicle, or an advanced driver-assistance system (ADAS).

Figure 45:
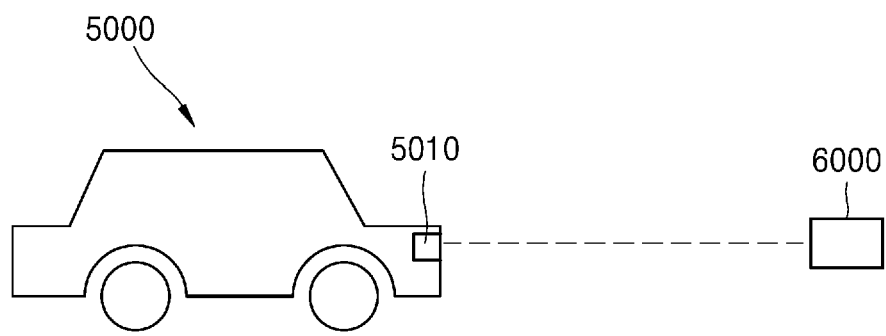
FIGS. 45 and 46 are conceptual views illustrating a case where a LiDAR device is applied to a vehicle, according to an embodiment.
Figure 46:
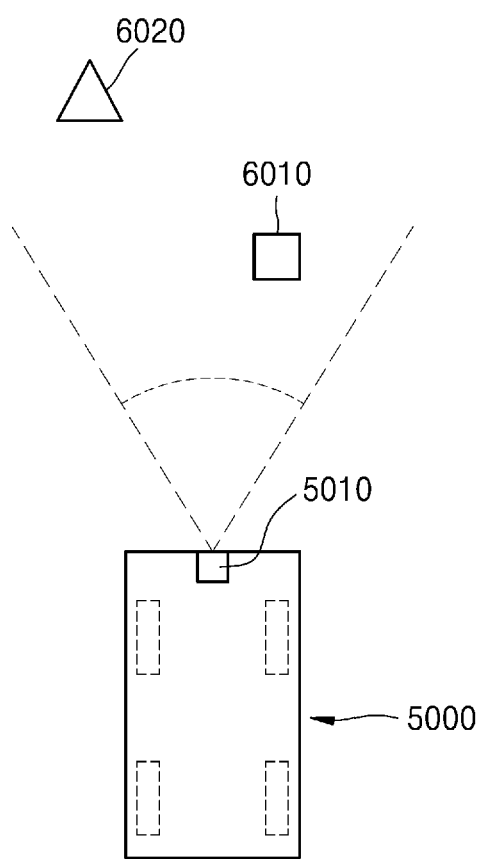

FIGS. 45 and 46 are conceptual views illustrating a case where a LiDAR device is applied to a vehicle, according to an embodiment.

Referring to FIGS. 45 and 46, a LiDAR device 5010 may be applied to a vehicle 5000, and information about an object 6000 may be obtained by using the LiDAR device 5010. The vehicle 5000 may be an autonomous vehicle. The LiDAR device 5010 may detect a solid body or a person, that is, the object 6000, in a direction in which the vehicle 5000 travels. The LiDAR device 5010 may measure a distance to the object 6000, by using information such as a time difference between a transmitted signal and a detected signal. The LiDAR device 5010 may obtain information about a near object 6010 and a far object 6020 within a scan range. The LiDAR device 5010 may include the electronic device 4000 of FIG. 32.

Although the LiDAR device 5010 is disposed on a front portion of the vehicle 5000 and detects the object 6000 in a direction in which the vehicle 5000 travels, the disclosure is not limited thereto. In another example, the LiDAR device 5010 may be disposed at a plurality of locations on the vehicle 5000 to detect all objects 6000 around the vehicle 5000. For example, four LiDAR devices 5010 may be disposed on a front portion, a rear portion, and left and right portions of the vehicle 5000. In another example, the LiDAR device 5010 may be disposed on a roof of the vehicle 5000, and may rotate and detect all objects 6000 around the vehicle 5000.

According to the disclosure, a miniaturized single-photon detection pixel may be provided.

According to the disclosure, a miniaturized single-photon detection pixel array may be provided.

According to the disclosure, a single-photon detection pixel having a higher fill factor may be provided.

According to the disclosure, a single-photon detection pixel array having a higher fill factor may be provided.

However, effects of the disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A single-photon detection pixel comprising:
a substrate;
a first well provided in the substrate and having a first conductivity type;
a plurality of heavily doped regions provided in an upper portion of the first well, having a second conductivity type different from the first conductivity type, and located separately;
a plurality of contacts having the first conductivity type, surrounding the plurality of heavily doped regions, respectively, and interconnected with each other; and,
an isolation region including an insulating material, extending along an edge of the first well to form a pixel area therein, and surrounding the plurality of heavily doped regions and the plurality of contacts, the isolation region being located only along the boundary of the pixel area.

2. The single-photon detection pixel of claim 1, wherein a voltage is applied to the plurality of contacts and the plurality of heavily doped regions to form a plurality of depletion regions in each of regions adjacent to boundaries between the plurality of heavily doped regions and the first well.

3. The single-photon detection pixel of claim 1, further comprising a plurality of buffer regions having the first conductivity type, extending along the plurality of contacts between the first well and the plurality of contacts.

4. The single-photon detection pixel of claim 1, wherein the plurality of contacts is shaped in circular rings, octagonal rings or quadrangular rings.

5. The single-photon detection pixel of claim 1, further comprising a plurality of guard rings having the second conductivity type, surrounding the plurality of heavily doped regions, respectively.

6. The single-photon detection pixel of claim 5, further comprising a first additional isolation region including an insulating material, provided between the plurality of guard rings.

7. The single-photon detection pixel of claim 5, further comprising a second additional isolation region including an insulating material, passing through a region where the plurality of guard rings face each other between the plurality of guard rings.

8. The single-photon detection pixel of claim 1, further comprising a plurality of second wells having the second conductivity type, provided between the first well and the plurality of heavily doped regions, respectively.

9. A single-photon detection pixel comprising:
a substrate;
a first well provided in the substrate and having a first conductivity type;
a plurality of heavily doped regions provided in an upper portion of the first well, having a second conductivity type different from the first conductivity type, and located separately;
a contact having the first conductivity type and having a single ring shape surrounding the plurality of heavily doped regions; and
an isolation region including an insulating material, extending along the contact to form a pixel area therein, and surrounding the plurality of heavily doped regions and the contact, the isolation region being located only along the boundary of the pixel area.

10. The single-photon detection pixel of claim 9, wherein the single ring shape is an octagonal ring shape or a quadrangular ring shape.

11. The single-photon detection pixel of claim 9, wherein a voltage is applied to the contact and the plurality of heavily doped regions to form a plurality of depletion regions in regions adjacent to boundaries between the plurality of heavily doped regions and the first well.

12. The single-photon detection pixel of claim 9, further comprising a plurality of guard rings having the second conductivity type, surrounding the plurality of heavily doped regions, respectively.

13. The single-photon detection pixel of claim 12, further comprising a first additional isolation region including an insulating material, provided between the plurality of guard rings.

14. The single-photon detection pixel of claim 12, further comprising a second additional isolation region including an insulating material, passing through a region between the plurality of guard rings where the plurality of guard rings face each other.

15. The single-photon detection pixel of claim 12, wherein the plurality of guard rings are interconnected between the plurality of heavily doped regions.

16. The single-photon detection pixel of claim 15, further comprising a first additional isolation region including an insulating material, provided between the plurality of heavily doped regions.

17. The single-photon detection pixel of claim 9, further comprising a plurality of second wells having the second conductivity type, provided between the first well and the plurality of heavily doped regions, respectively.

18. The single-photon detection pixel of claim 17, further comprising a first additional isolation region including an insulating material, provided between the plurality of second wells.

19. The single-photon detection pixel of claim 17, further comprising a second additional isolation region including an insulating material, surrounding the plurality of second wells, respectively, and interconnected between the plurality of second wells.

20. A single-photon detection pixel array comprising:

a plurality of single-photon detection pixels; and an isolation region provided between the plurality of single-photon detection pixels, wherein each of the plurality of single-photon detection pixels includes a substrate, a first well provided in the substrate and having a first conductivity type, a plurality of heavily doped regions provided in an upper portion of the first well having a second conductivity type different from the first conductivity type, and located separately, and a plurality of contacts having the first conductivity type, surrounding the plurality of heavily doped regions, respectively, and interconnected with each other, wherein the isolation region including an insulating material, extending along an edge of the first well to form a pixel area therein, and surrounding the plurality of heavily doped regions and the plurality of contacts, the isolation region being located only along the boundary of the pixel area.

* * * * *